United States Patent
Shi et al.

(10) Patent No.: US 11,094,995 B2
(45) Date of Patent: Aug. 17, 2021

(54) MEMBRANES, SEPARATORS, BATTERIES, AND METHODS

(71) Applicant: Celgard, LLC, Charlotte, NC (US)

(72) Inventors: Lie Shi, Matthews, NC (US); C. Glen Wensley, Rock Hill, SC (US); Zhengming Zhang, Rock Hill, SC (US); Katharine Chemelewski, Davidson, NC (US); Junqing Ma, Charlotte, NC (US); Ronnie E. Smith, Huntersville, NC (US); Kwantai Cho, Charlotte, NC (US); Weifeng Fang, Charlotte, NC (US); Changqing Wang Adams, Fort Mill, SC (US); Ian McCallum, Rock Hill, SC (US); Jun Nada, Charlotte, NC (US); Shante P. Williams, Charlotte, NC (US); Jacob S. Mangum, Charlotte, NC (US)

(73) Assignee: Celgard, LLC, Charlotte, NC (US)

( * ) Notice: Subject to any disclaimer, the term of this patent is extended or adjusted under 35 U.S.C. 154(b) by 6 days.

(21) Appl. No.: 15/216,861

(22) Filed: Jul. 22, 2016

(65) Prior Publication Data

US 2017/0025658 A1    Jan. 26, 2017

Related U.S. Application Data

(60) Provisional application No. 62/195,452, filed on Jul. 22, 2015, provisional application No. 62/195,457, (Continued)

(51) Int. Cl.
*H01M 50/431* (2021.01)
*H01M 50/403* (2021.01)
(Continued)

(52) U.S. Cl.
CPC ........... *H01M 50/403* (2021.01); *B05D 1/60* (2013.01); *B05D 1/62* (2013.01); *C23C 14/081* (2013.01);
(Continued)

(58) Field of Classification Search
None
See application file for complete search history.

(56) References Cited

U.S. PATENT DOCUMENTS

| 3,539,374 A | 11/1970 | Isaacson |
| 3,666,517 A | 5/1972 | Isaacson |

(Continued)

FOREIGN PATENT DOCUMENTS

| DE | 4214905 A1 * | 11/1993 | ......... C23C 18/1644 |
| JP | 002005302634 A1 | 10/2005 | |
| WO | WO00200907815 A1 | 6/2009 | |

OTHER PUBLICATIONS

"Metallizing of Celgard® Microporous Film," Jun. 1983, Celgard Business Unit, a Division of Celanese Corporation.

*Primary Examiner* — Tracy M Dove
(74) *Attorney, Agent, or Firm* — Hammer & Associates, P.C.

(57) ABSTRACT

In accordance with at least selected embodiments, novel or improved porous membranes or substrates, separator membranes, separators, composites, electrochemical devices, batteries, methods of making such membranes or substrates, separators, and/or batteries, and/or methods of using such membranes or substrates, separators and/or batteries are disclosed. In accordance with at least certain embodiments, novel or improved microporous membranes, battery separator membranes, separators, energy storage devices, batteries including such separators, methods of making such membranes, separators, and/or batteries, and/or methods of using such membranes, separators and/or batteries are dis-
(Continued)

closed. In accordance with at least certain selected embodiments, a separator for a battery which has an oxidation protective and binder-free deposition layer which is stable up to 5.2 volts or more, for example, up to 7 volts, in a battery is disclosed. The deposition layer is preferably a thin, very thin or ultra-thin deposition on a polymeric microporous membrane applied via a binder-free and solvent-free deposition method. By employing such an ultra-thin deposition layer, the energy density of a battery may be increased. In accordance with at least particular embodiments, the battery separator membrane described herein is directed to a multi-layer or composite microporous membrane battery separator which may have excellent oxidation resistance and may be stable in a high voltage battery system up to 5.2 volts or more. In accordance with at least other certain selected embodiments, the present invention is directed to a separator for a battery which has a conductive deposition layer which is stable up to at least 5.2 volts or higher in a battery.

7 Claims, 21 Drawing Sheets

Related U.S. Application Data filed on Jul. 22, 2015, provisional application No. 62/195,464, filed on Jul. 22, 2015, provisional application No. 62/308,492, filed on Mar. 15, 2016.

(51) Int. Cl.
| | |
|---|---|
| *H01M 50/449* | (2021.01) |
| *H01M 10/052* | (2010.01) |
| *H01M 50/44* | (2021.01) |
| *H01M 50/411* | (2021.01) |
| *B05D 1/00* | (2006.01) |
| *C23C 14/08* | (2006.01) |
| *C23C 14/20* | (2006.01) |
| *C23C 14/24* | (2006.01) |
| *H01G 11/52* | (2013.01) |
| *H01M 6/14* | (2006.01) |
| *H01M 10/0525* | (2010.01) |
| *H01G 11/84* | (2013.01) |

(52) U.S. Cl.
CPC .............. *C23C 14/20* (2013.01); *C23C 14/24* (2013.01); *H01G 11/52* (2013.01); *H01M 6/14* (2013.01); *H01M 10/052* (2013.01); *H01M 10/0525* (2013.01); *H01M 50/411* (2021.01); *H01M 50/431* (2021.01); *H01M 50/44* (2021.01); *H01M 50/449* (2021.01); *H01G 11/84* (2013.01); *Y02T 10/70* (2013.01)

(56) References Cited

U.S. PATENT DOCUMENTS

| | | | | |
|---|---|---|---|---|
| 4,298,666 | A * | 11/1981 | Taskier | ............... H01M 2/1653 429/144 |
| 4,438,185 | A * | 3/1984 | Taskier | .................. B01D 69/12 427/245 |
| 5,269,935 | A | 12/1993 | Clough et al. | |
| 6,432,586 | B1 | 8/2002 | Zhang | |
| 8,216,712 | B1 | 7/2012 | Ramasubramanian et al. | |
| 8,455,132 | B2 | 6/2013 | Fujikawa et al. | |
| 9,508,976 | B2 * | 11/2016 | Herle | .................... H01M 4/661 |
| 2004/0126663 | A1 * | 7/2004 | Sudano | ................ H01M 4/668 429/234 |
| 2007/0139860 | A1 * | 6/2007 | Hoerpel | .................... H01G 9/02 361/311 |
| 2009/0181292 | A1 | 7/2009 | Kaun | |
| 2011/0200863 | A1 * | 8/2011 | Xiao | ....................... H01M 2/16 429/144 |
| 2012/0231321 | A1 | 9/2012 | Huang et al. | |
| 2013/0327704 | A1 | 12/2013 | Wu et al. | |
| 2014/0045033 | A1 | 2/2014 | Zhang et al. | |
| 2017/0098810 | A1 * | 4/2017 | Whear | .................. H01M 2/145 |

* cited by examiner

Metal or metal oxide deposition

Metal or metal oxide deposition

Organic material deposition

Organic material deposition

| Film construction | JIS Gurley, s | Thickness, um | Side A (film side) | Side B (facing metal) |
|---|---|---|---|---|
| R052/2500Al/R0052 | 626 | 44 | | |

FIG. 41

| Film construction | JIS Gurley, s | Thickness, um | Side A (film side) | Side B (facing metal) |
|---|---|---|---|---|
| 2500Al/PP NW | 225 | 92 | | |

FIG. 42

MEMBRANES, SEPARATORS, BATTERIES, AND METHODS

CROSS-REFERENCE TO RELATED APPLICATIONS

This application claims priority to and the benefit of four U.S. Provisional Patent Applications having Ser. Nos. 62/195,452 filed Jul. 22, 2015, 62/195,457 filed Jul. 22, 2015, 62/195,464 filed Jul. 22, 2015, and 62/308,492 filed Mar. 15, 2016, and each of which is hereby fully incorporated by reference herein.

FIELD OF THE INVENTION

In accordance with at least selected embodiments, the present application, disclosure or invention is directed to novel or improved porous membranes or substrates, separator membranes, separators, composites, electrochemical devices, batteries, methods of making such membranes or substrates, separators, composites, electrochemical devices, and/or batteries, and/or methods of using such membranes or substrates, separators composites, electrochemical devices, and/or batteries. In accordance with at least certain embodiments, the present application is directed to novel or improved microporous membranes, battery separator membranes, separators, energy storage devices, batteries including such separators, methods of making such membranes, separators, and/or batteries, and/or methods of using such membranes, separators and/or batteries. In accordance with at least certain selected embodiments, the present invention is directed to a separator for a battery which has an oxidation protective and binder-free deposition layer and/or a separator for a lithium battery which has an oxidation protective and binder-free deposition layer which is stable up to at least 5.2, or up to at least 5.5 volts in a battery. The deposition layer is preferably a thin, very thin or ultra-thin deposition and may be: metal or metal oxide, one or more organic materials, one or more inorganic materials, or a conductive metal or ceramic layer applied to or embedded within a polymeric microporous membrane or separator via a binder-free and solvent-free deposition method. By employing an ultra-thin deposition layer, the energy density of a battery may be increased. Furthermore, the deposition method may preferably deposit a uniform layer that is less than 0.5 $\mu$m in thickness, which combination of uniformity and thickness may not be accomplished by other coating techniques. In accordance with at least particular embodiments, the battery separator membrane or separator described herein is directed to a multilayer or composite microporous membrane battery separator which may have excellent oxidation resistance and may be stable in a high voltage battery system up to 5.2 volts or more, or 5.5 volts. In accordance with at least other selected embodiments, the present disclosure or invention is directed to a membrane or separator for a battery which has a conductive deposition layer which is stable up to at least 5.2 volts, or 5.5 volts or higher, in a lithium battery. In accordance with at least still other selected embodiments, the present invention or disclosure is directed to a separator for a battery which has an oxidation protective and binder-free treatment or deposition layer which is stable up to at least 5.2 volts, at least 5.5 volts, or up to 7 volts in a cell, battery, pack, or system, the deposition layer being preferably a thin, very thin or ultra-thin deposition of metal or metal oxide applied to a polymeric microporous membrane via a binder-free and solvent-free deposition method such as PVD, laser PVD, pulsed laser PVD, or the like, an electrochemical device that uses a conductive microporous membrane or substrate which has a conductive deposition layer on one side or two sides of a polymeric porous membrane, a separator for a battery which has a conductive, semi-conductive or non-conductive deposition layer which is stable up to at least 5.2 volts or higher, for example, up to 5.5 volts, in a battery, an electrochemical device that uses a nonconductive microporous membrane or substrate which has a nonconductive deposition layer on one side or two sides of a polymeric porous membrane, a separator for a battery which has a nonconductive deposition layer (at least in electrolyte) which is stable up to at least 5.2 volts, or higher, in a battery, a reinforced separator for an energy storage device, such as a secondary lithium ion battery, having a top microporous membrane having a first surface and a second surface, wherein said microporous membrane is at least one of a single layer, multiple layer, single ply, and/or multiple ply structure, and, a bottom microporous membrane having a first surface and a second surface, wherein said microporous membrane is at least one of a single layer, multiple layer, single ply, and/or multiple ply structure, and, a ceramic layer is between the two surfaces of said microporous membranes, said ceramic layer comprising a layer of ceramic particles and a polymer binder, wherein said ceramic reinforced separator provides at least one of improved safety, cycle life, or high temperature performance, an oxidation or reduction reaction interface, surface or boundary, an oxidized or reduced interfacial layer between the separator and battery electrodes during use, prevents or stops further oxidation or reduction reactions from occurring during use, improves safety, cycle life, or high temperature performance of a lithium ion battery, and high dimensional stability at elevated temperatures, or combinations thereof.

BACKGROUND OF THE INVENTION

Applications of polymeric coatings and ceramic-containing polymeric coatings are known methods to improve the thermal safety performance of a microporous battery separator membrane in a lithium battery. Such coatings may be applied as a coating or a layer onto one or both sides of a microporous battery separator membrane in order to promote high temperature stability, control oxidation at the separator-cathode interface of the microporous battery separator membrane, and improve safety performance of the microporous battery separator membrane in various battery systems, such as lithium ion rechargeable battery systems.

U.S. Pat. No. 6,432,586, which is incorporated herein by reference in its entirety, discloses various ceramic coated separators. Additionally, U.S. Patent Publication No. 2014/0045033, which is also incorporated herein by reference in its entirety, discloses various ceramic particle-containing polymeric coatings for microporous battery separator membranes which may provide improvement in safety, battery cycle life and high temperature performance. Such coatings may include one or more polymeric binders, one or more types of inorganic ceramic particles and a water based (aqueous) or a non-aqueous solvent. Such coatings may be applied using various technologies such as, but not limited to, dip coating, knife, gravure, curtain, spray, etc. Furthermore, various known ceramic particle-containing polymeric coatings may be applied at varying thicknesses, such as a thickness of, for example, 2 to 6 microns (or um) onto one or both sides of a microporous battery separator membrane. However, known coating techniques may not be able to apply a layer having a uniform, controlled thickness that is less than one micron (10,000 Å), more preferably less than 1,000 Å and most preferably less than 500 Å.

Furthermore, U.S. Pat. No. 8,455,132 may disclose it may be difficult to form an oxidation resistance layer that is uniform and has a thickness below 1 µm. At least certain known polymeric coatings and ceramic-containing polymeric coatings applied by various fabrication methods may be intrinsically thick, prone to defects, and/or prone to non-uniformity in the coating layer, therefore possibly limiting the effectiveness of oxidation protection to the separators.

Hence, there is a need for an ultra-thin, uniform deposition of a metal and/or metal oxide onto a polymeric microporous membrane that specifically addresses the above issues.

In addition, there is a need for an excellent oxidation resistant layer for a microporous separator membrane for a lithium ion battery, a need for an oxidation resistant layer on the side of the separator membrane which faces the cathode where the layer may be ultra-thin at the interface of the separator and the cathode, and a need for an oxidation resistant layer for a microporous separator membrane that may be stable at voltages up to at least 5.2 volts, or up to 5.5 volts, in a high voltage battery system.

Further, there is a need for an ultra-thin highly oxidation resistant microporous separator that may prevent trickle charge at high voltages up to at least 5.2 volts, or up to 5.5 volts, in a battery.

SUMMARY OF THE INVENTION

In accordance with at least selected embodiments, aspects or objects, the present application or invention may address the above needs or issues, and/or may provide a thin, very thin or ultra-thin deposition and may be: metal or metal oxide, one or more organic materials, or a conductive metal or ceramic layer applied to or embedded within a polymeric microporous membrane, an excellent oxidation resistant layer for a microporous separator membrane for a lithium battery, such as a rechargeable lithium ion battery, an oxidation resistant layer on at least the side of the separator membrane which faces the cathode where the layer may be ultra-thin at the interface of the separator and the cathode, and that may also be stable at voltages up to at least 5.2 volts, or up to 5.5 volts, in a high voltage battery system, an ultra-thin highly oxidation resistant microporous separator that may prevent trickle charge at high voltages up to at least 5.2 volts, or up to 5.5 volts, in a battery, an ultra-thin, uniform deposition of a metal and/or metal oxide onto a polymeric microporous membrane or substrate, and/or the like.

In accordance with at least selected embodiments, aspects or objects, the present application or invention may address the above problems, needs or issues, and/or may provide a thin, very thin or ultra-thin deposition on a porous or microporous membrane or substrate of a layer or layers of at least one of an inorganic material, organic material, conductive material, semi-conductive material, non-conductive material, reactive material, or mixtures, blends or combinations thereof, such as a metal and/or metal oxide on at least one side of a polymeric porous or microporous membrane or substrate wherein the layer is applied using a deposition method or technique such as physical vapor deposition, a layer having a uniform, controlled thickness that is less than one micron (10,000 Å), more preferably less than 1,000 Å and most preferably less than 500 Å, an oxidation resistance layer that is uniform and has a thickness below 1 µm, an ultra-thin, uniform deposition of a metal and/or metal oxide onto a polymeric microporous membrane, an excellent oxidation resistant layer for a microporous separator membrane for a lithium ion battery, an oxidation resistant layer on the side of the separator membrane which faces the cathode where the layer may be ultra-thin at the interface of the separator and the cathode, an oxidation resistant layer for a microporous separator membrane that may be stable at voltages up to at least 5.2 volts, or up to 5.5 volts or higher, in a high voltage battery system, an ultra-thin highly oxidation resistant microporous separator that may prevent trickle charge at high voltages up to at least 5.2 volts, or up to 5.5 volts, in a battery, and/or the like.

In accordance with at least selected embodiments, the present application, disclosure or invention is directed to novel or improved porous membranes or substrates, separator membranes, separators, composites, electrochemical devices, batteries, methods of making such membranes or substrates, separators, composites, electrochemical devices, and/or batteries, and/or methods of using such membranes or substrates, separators composites, electrochemical devices, and/or batteries. In accordance with at least certain embodiments, the present application is directed to novel or improved microporous membranes, battery separator membranes, separators, energy storage devices, batteries including such separators, methods of making such membranes, separators, and/or batteries, and/or methods of using such membranes, separators and/or batteries. In accordance with at least certain selected embodiments, the present invention is directed to a separator for a battery which has an oxidation protective and binder-free deposition layer and/or a separator for a lithium battery which has an oxidation protective and binder-free deposition layer which is stable up to at least 5.2, or up to at least 5.5 volts in a battery. The deposition layer is preferably an ultra-thin deposition and may be: metal or metal oxide, one or more organic materials, one or more inorganic materials, or a conductive metal or ceramic layer applied to or embedded within a polymeric microporous membrane or separator via a binder-free and solvent-free deposition method. By employing an ultra-thin deposition layer, the energy density of a battery may be increased. Furthermore, the deposition method may preferably deposit a uniform layer that is less than 0.5 µm in thickness, which combination of uniformity and thickness may not be accomplished by other coating techniques. In accordance with at least particular embodiments, the battery separator membrane or separator described herein is directed to a multi-layer or composite microporous membrane battery separator which may have excellent oxidation resistance and may be stable in a high voltage battery system up to 5.2 volts or more, or 5.5 volts. In accordance with at least other selected embodiments, the present disclosure or invention is directed to a membrane or separator for a battery which has a conductive deposition layer which is stable up to at least 5.2 volts, or 5.5 volts or higher, in a lithium battery. In accordance with at least still other selected embodiments, the present invention or disclosure is directed to a separator for a battery which has an oxidation protective and binder-free treatment or deposition layer which is stable up to at least 5.2 volts, at least 5.5 volts, or up to 7 volts in a cell, battery, pack, or system, the deposition layer being preferably a thin, very thin or ultra-thin deposition of metal or metal oxide applied to a polymeric microporous membrane via a binder-free and solvent-free deposition method such as PVD, laser PVD, pulsed laser PVD, or the like, an electrochemical device that uses a conductive microporous membrane or substrate which has a conductive deposition layer on one side or two sides of a polymeric porous membrane, a separator for a battery which has a conductive, semi-conductive or non-conductive deposition layer which is stable up to at least 5.2 volts or higher, for example, up to 5.5 volts, in a battery, an electrochemical device that uses a nonconductive microporous membrane or substrate which has a nonconductive deposition layer on one side or two sides of a polymeric porous membrane, a separator for a battery which has a nonconductive deposition layer (at least in electrolyte) which is stable up to at least 5.2 volts, or higher, in a battery, a reinforced separator for an energy storage device, such as a secondary lithium ion battery, having a top microporous membrane having a first surface and a second surface, wherein said microporous membrane is at least one of a single layer, multiple layer, single ply, and/or multiple ply structure, and, a bottom microporous membrane having a first surface and a second surface, wherein said microporous membrane is at least one of a single layer, multiple layer, single ply, and/or multiple ply structure, and, a ceramic layer is between the two surfaces of said microporous membranes, said ceramic layer comprising a layer of ceramic particles and a polymer binder, wherein said ceramic reinforced separator provides at least one of improved safety, cycle life, or high temperature performance, an oxidation or reduction reaction interface, surface or boundary, an oxidized or reduced interfacial layer between the separator and battery electrodes during use, prevents or stops further oxidation or reduction reactions from occurring during use, improves safety, cycle life, or high temperature performance of a lithium ion battery, and high dimensional stability at elevated temperatures, or combinations thereof.

In accordance with certain embodiments, the separator membrane described herein is directed to a microporous battery separator membrane having a very thin or ultra-thin deposition of metal and/or metal oxide deposition where the thickness of the deposition is in the range of 1 Å to 1 µm. A very thin or ultra-thin deposition, on a microporous membrane, of a metal and/or metal oxide in the thickness range of 1 Å to 1 µm may result in a separator having the same or better targeted performance properties as separators that are coated using thicker coatings and/or coatings generated by previously known coating methods.

A metallic element used herein may be inert or reactive. The preferred ultra-thin deposition of a metal and/or metal oxide, as described herein, contributes very little additional thickness to the overall thickness of the polymeric porous or microporous membrane or substrate (for example, a coated or uncoated microporous membrane) yet may provide equivalent oxidation resistance as a much thicker oxidation resistant coating that, for example, is 2 to 6 µm thick (or thicker) applied using a coating method (such as, for example, dip, knife, curtain, gravure, etc. coating methods). The ultra-thin deposition of a metal and/or metal oxide described herein may add one or more conductive layers to a single or multi-layer polymeric microporous membrane and may create a polymeric microporous membrane having one or more conductive layers and/or one or more non-conductive layers where the non-conductive layers may be a polymer coating and/or at least one microporous polyolefin separator membrane.

In at least certain embodiments, the inventive metal and/or metal oxide deposition may be electrically conductive and may provide uniform current distribution in a lateral direction across a polymeric microporous membrane that may be an effective method to dissipate current distribution into a larger area in the event of a thermal runaway event or potential thermal runaway event in a battery, such as a lithium ion battery. A conductive layer comprising a very thin or ultra-thin deposition of a conductive material, such as a metal and/or metal oxide, with a preferred thickness in the range of 1 Å to 1 µm, may provide an effective method of dissipating current in a battery.

In at least certain embodiments, the ultra-thin deposition of a reactive metal and/or a reactive metal oxide, as described herein, may react with an electrolyte (for example, an electrolyte which contains a lithium salt such as lithium hexafluorophosphate ($LiPF_6$)) to form a passivation layer. In the case of using aluminum (or some reactive form of aluminum) in the ultra-thin deposition, the aluminum may react with the electrolyte, such as the $LiPF_6$ electrolyte, to form an aluminum fluoride ($AlF_3$) passivation layer. This passivation layer may be resistant to oxidation and may provide a protective layer on the surface of the reactive aluminum that may prevent oxidation of a polymeric separator or membrane, such as a polyolefin separator or membrane. Once the reactive aluminum layer has formed, the passivation layer has formed, or both have formed, a level of oxidation stability for the improved separator may be achieved which is equivalent to that of a separator bearing a much thicker oxidation resistant coating that is, by way of example only, 2 to 6 µm thick (or thicker) applied using some known coating method (for example, one or more of dip, knife, curtain, gravure, etc. coating methods).

In accordance with at least selected embodiments, the inventive excellent oxidation resistant layer on a microporous membrane for a lithium battery, such as a lithium ion battery, may be at least on the side of the separator membrane which faces the cathode where the layer may be ultra-thin at the interface of the separator and the cathode, and may be stable at voltages up to at least 5.2 volts, or up to 5.5 volts or higher in a high voltage battery system, and/or may provide an ultra-thin highly oxidation resistant microporous separator that may prevent trickle charge at high voltages up to at least 5.2 volts, or up to 5.5 volts or higher in a lithium battery such as a high voltage secondary lithium battery, lithium ion battery, lithium polymer battery, lithium gel battery, lithium prismatic battery, or the like.

In accordance with at least selected embodiments, the present application or invention is directed to novel or improved porous membranes or substrates, separator membranes, separators, composites, electrochemical devices, batteries, methods of making such membranes or substrates, separators, and/or batteries, and/or methods of using such membranes or substrates, separators and/or batteries. In accordance with at least certain embodiments, the present application is directed to novel or improved microporous membranes, battery separator membranes, separators, energy storage devices, batteries including such separators, methods of making such membranes, separators, and/or batteries, and/or methods of using such membranes, separators and/or batteries. In accordance with at least certain selected embodiments, the present invention is directed to a separator for a battery which has an oxidation protective and binder-free deposition layer which is stable up to at least 5.2 volts, or up to 5.5 volts, in a battery. The deposition layer is preferably an ultra-thin deposition of metal or metal oxide applied to a polymeric microporous membrane via a binder-free and solvent-free deposition method. By employing an ultra-thin deposition layer, the energy density of a battery may be increased. Furthermore, the deposition method may preferably deposit a uniform layer that is less than 0.5 µm in thickness, which combination of uniformity and thickness may not be accomplished by other coating techniques. In accordance with at least particular embodiments, the battery separator membrane described herein is directed to a multilayer or composite microporous membrane battery separator membrane which may have excellent oxidation resistance and may be stable in a high voltage battery system up to 5.2 volts or more, for example, up to 5.5 volts. In accordance with at least other selected embodiments, the present invention is directed to a separator for a battery which has a conductive deposition layer which is stable up to at least 5.2 volts, or up to 5.5 volts, in a battery.

In accordance with at least certain embodiments, the present application is directed to a novel or improved microporous battery separator membrane, separators, batteries including such separators, methods of making such membranes, separators, and/or batteries, and/or methods of using such membranes, separators and/or batteries. In accordance with at least certain embodiments, the present invention is directed to a battery separator for a primary or secondary battery which may include an ultra-thin layer of a metal and/or metal oxide formed via a deposition method such as vapor deposition, vacuum deposition, physical vapor deposition, atomic layer deposition, or chemical vapor deposition, with a very thin or ultra-thin deposition of a thickness less than one micron. The metal may be an inert metal or a reactive metal. An inert metal and/or metal oxide deposition may be oxidation resistant in a battery. A reactive metal or metallic element deposition may react with lithium salts or additives which are present in electrolytes and form a stable preservation or passivation layer against further oxidation of the separator membrane. In accordance with at least certain embodiments, the invention herein is directed to a polymeric microporous membrane with a metal and/or metal oxide deposition which may have excellent oxidation resistance and high voltage stability in a battery up to at least 5.2 volts, for example, up to 5.5 volts.

An ultra-thin deposition of a metal and/or metal oxide may be desirable in order to limit the thickness of the overall separator membrane, membrane, or separator. Ultra-thin deposition preferably refers to a deposition layer, coating or coatings of 1 Å to 50 nm. The deposition layer may be an ultra-thin coating of metal or metal oxide. Furthermore, the ultra-thin layer of a metal and/or metal oxide may be binder-free. Very thin deposition preferably refers to a deposition layer, coating or coatings of less than 1 um, preferably less than 0.75 um, more preferably less than 0.5 um, and most preferably less than 0.1 um (and greater than 50 nm). Thin preferably refers to a deposition layer, coating or coatings of less than 10 um.

In accordance with at least certain selected embodiments, the present invention is directed to a separator for a battery which has a thin, very thin or ultra-thin deposition, layer or coating (preferably less than 200 nm) that provides oxidation protection, maintained or improved porosity, maintained or improved mechanical strength, maintained or improved shutdown behavior, and maintained or improved water content. The deposition, layer or coating is preferably applied to the separator using Physical Vapor Deposition (PVD), Chemical Deposition (ALD), Pulsed Laser Deposition (PLD), Atomic Layer Deposition (ALD), or ultra-short pulsed laser deposition.

In accordance with at least certain embodiments, the present invention is directed to a battery separator for a primary or secondary lithium battery which may include an ultra-thin deposition of metal and/or metal-oxide. A metallic element may be inert metal or reactive metal. A deposition of an inert metallic element and/or a metal oxide may have excellent oxidation resistance. A deposition of a reactive metallic element may react with lithium salts or additives which are present in various electrolytes and form a stable preservation or passivation layer which is stable against oxidation in a battery separator membrane. One such invention described herein is directed to a polymeric microporous membrane with a deposition of metal and/or metal oxide which may have excellent oxidation resistance and may have high voltage stability in a battery up to at least 5.2 volts, for example, up to 5.5 volts. Furthermore, another invention described herein is directed to a microporous battery separator membrane with a reactive metallic element deposition which may react with an electrolyte containing a lithium salt such as $LiPF_6$ to create a passivation layer which, once formed, may have excellent oxidation resistance and may be stable at high voltages up to at least 5.2 volts in a battery, for example, up to 5.5 volts.

In at least one embodiment shown in FIG. 1, a metal and/or metal oxide deposition may be applied to the side of the non-conductive polymeric microporous membrane or film which faces the cathode in a battery, due to the susceptibility of the polymeric microporous membrane or film to undergo oxidation at the cathode/separator membrane interface. In at least another embodiment shown in FIG. 3, the metal and/or metal oxide deposition may be applied to the side of the non-conductive polymeric microporous membrane or film which faces the anode. In at least another embodiment shown in FIG. 2, the metal and/or metal oxide deposition may be applied to both sides of the non-conductive polymeric microporous membrane or film. When the metal is a reactive metal, after it has reacted with an electrolyte containing a lithium salt such as $LiPF_6$ to create a passivation layer, an oxidation resistant layer is formed on the polymeric microporous membrane or film that may be stable at voltages up to 5.2 volts or greater (for example, up to 5.5 volts) in a battery. Although FIGS. 1-12, 24-35, 38, and 39 mention Polymeric Microporous Film or Polymeric Microporous Separator (which may be preferred), it is understood that the membrane, membranes, film, substrate, or separator may be one or more layers or plies of porous (such as macro, micro, meso, or nano porous) or microporous polymeric material. Although FIGS. 1-12 mention Metal or metal oxide deposition, it is understood that the deposition, layer, coating, or coatings may be one or more depositions, layers or coatings of inorganic material, organic material, conductive material, semi-conductive material, non-conductive material, reactive material, or mixtures, blends or combinations thereof, such as a thin, very thin or ultra-thin metal and/or metal oxide deposition. Although FIGS. 24-35 mention Organic material deposition, it is understood that the deposition, layer, coating, or coatings may be one or more depositions, layers or coatings of inorganic material, organic material, conductive material, semi-conductive material, non-conductive material, reactive material, or mixtures, blends or combinations thereof, such as a thin, very thin or ultra-thin organic material deposition.

In accordance with certain embodiments, the present invention is directed to a polymeric microporous membrane, film, and/or substrate, which has an ultra-thin deposition of metal and/or metal oxide applied using a vapor deposition method with a thickness that may be less than one micron. This method of vapor deposition may be based on a physical vapor deposition process, such as but not limited to, sputter and evaporation, an atomic layer deposition (ALD) process or a chemical vapor deposition process. A physical vapor deposition method may involve vaporizing a metal or metal oxide and forming an extremely thin layer on a substrate such as a polymeric microporous membrane. A vapor deposition which is comprised of a single layer of individual atoms or molecules of a metal and/or metal oxide may be deposited onto a polymeric microporous membrane. Furthermore, a vapor deposition layer which is comprised of a multiple layers of individual atoms or molecules of a metal and/or metal oxide may be deposited onto a polymeric microporous membrane. In addition, one or more layers of possible combinations applied in various orders of a metal and/or metal oxide may be formed at a thickness of less than one micron, more preferably at a thickness of less than 0.5 µm, more preferably at a thickness less than 1,000 Å, and most preferably at a thickness less than 500 Å on a polymeric microporous membrane.

Such a reliable method of applying a thin or ultra-thin deposition at a thickness less than 1 µm may not be attained using, for example, dip, gravure, knife, curtain, etc. coating methods. An application of an ultra-thin deposition using a physical vapor deposition method, an atomic layer deposition method, or a chemical vapor deposition method may provide a method to apply a uniform oxidation resistant layer. The level of deposition application control achieved using a physical vapor deposition method, an atomic layer deposition method, or a chemical vapor deposition method may have sufficient accuracy so as to contribute an insignificant increase in thickness of a polymeric microporous membrane, when considering a polymeric microporous membrane for a lithium ion battery may typically have a thickness between 5 and 25 µm.

Furthermore, a benefit of using a physical vapor deposition method may be that the use of solvents and/or polymeric binders is not required. Physical vapor deposition may offer a method to apply a binder-free deposition which may increase the voltage stability of a battery. This approach of not using a binder in an oxidation resistance layer may remove what is sometimes considered a vulnerable aspect of some known ceramic coatings, namely oxidation of the binder component.

In accordance with certain embodiments, the polymeric microporous membrane described herein is directed to a polymeric microporous membrane to which is applied a thin or ultra-thin deposition of a metal and/or metal oxide with a layer thickness in the range of 1 Å to 1 µm.

The ultra-thin deposition of metallic element and/or metal oxide described herein contributes very little additional thickness to the overall thickness of the polymeric microporous membrane yet may provide equivalent oxidation resistant stability as a much thicker oxidation resistant coating that is, for example, 2 to 6 or more µm thick applied using other coating methods, e.g., dip, knife, curtain, gravure, etc. coating methods.

In accordance with certain embodiments, the separator membrane described herein is directed to a microporous battery separator membrane having a thin or ultra-thin deposition of an organic material deposition where the thickness of the deposition is in the range of 20 Å to 1 µm. A thin or ultra-thin deposition, on a microporous membrane, of an organic material deposition layer in the thickness range of 20 Å to 1 µm may result in a separator having the same or better targeted performance properties as separators that are coated using thicker coatings and/or coatings generated by previously known coating methods.

The ultra-thin deposition of an organic material deposition, as described herein, contributes very little additional thickness to the overall thickness of the polymeric microporous membrane or substrate (for example, a coated or uncoated microporous membrane) yet may provide equivalent oxidation resistance as a much thicker oxidation resistant coating that, for example, is 2 to 6 µm thick (or thicker) applied using a coating method (such as, for example, dip, knife, curtain, gravure, etc. coating methods). The ultra-thin deposition of an organic material deposition layer described herein may add one or more oxidation resistance and/or conductive layers to a single or multi-layer polymeric microporous membrane and may create a polymeric microporous membrane having one or more conductive layers and one or more non-conductive layers where the non-conductive layers may be at least one microporous polyolefin separator membrane.

In at least certain embodiments, the inventive organic material deposition layer may be electrically conductive and may provide uniform current distribution in a lateral direction across a polymeric microporous membrane that may be an effective method to dissipate current distribution into a larger area in the event of a thermal runaway event or potential thermal runaway event in a battery, such as a lithium ion battery. A conductive layer comprising a thin or ultra-thin deposition of an organic material with a thickness in the range of 20 Å to 1 µm may provide an effective method of dissipating current in a battery. A conductive layer comprising a thin or ultra-thin but higher density deposition of an organic material with a thickness in the range of 20 Å to 1 µm may provide an effective method of dissipating current in a battery.

The inventive excellent organic material based oxidation resistant layer on a microporous membrane for a lithium battery, such as a lithium ion battery, may be at least on the side of the separator membrane which faces the cathode where the layer may be ultra-thin at the interface of the separator and the cathode, and may be stable at voltages up to at least 5.2 volts, or up to 5.5 volts in a high voltage battery system, and/or may provide an ultra-thin highly oxidation resistant microporous separator that may prevent trickle charge at high voltages up to at least 5.2 volts, or up to 5.5 volts in a lithium battery.

An ultra-thin deposition of organic material deposition may be desirable in order to limit the thickness of the overall separator membrane. Furthermore, the ultra-thin layer of organic material deposition may be binder-free.

In at least one embodiment shown in FIG. 1, an organic material may be applied to the side of the non-conductive polymeric microporous membrane or film which faces the cathode in a battery, due to the susceptibility of the polymeric microporous membrane or film to undergo oxidation at the cathode/separator membrane interface. In at least another embodiment shown in FIG. 3, an organic material deposition may be applied to the side of the non-conductive polymeric microporous membrane or film which faces the anode. In at least another embodiment shown in FIG. 2, the organic material deposition may be applied to both sides of the non-conductive polymeric microporous membrane or film.

In accordance with certain embodiments, the present invention is directed to a polymeric microporous membrane, film, and/or substrate, which has a thin or ultra-thin deposition of an organic material deposition applied using a vapor deposition method with a thickness that may be less than one micron, preferably less than 50 nm. This method of vapor deposition may be based on chemical vapor deposition method, atomic layer deposition method or physical vapor deposition method A vapor deposition method may involve vaporizing organic materials and forming an extremely thin layer on a substrate such as a polymeric microporous membrane. A vapor deposition which is comprised of a single layer of individual atoms or molecules of an organic material may be deposited onto a polymeric microporous membrane. Furthermore, a vapor deposition layer which is comprised of a multiple layers of individual atoms or molecules of an organic material may be deposited onto a polymeric microporous membrane. In addition, one or more layers of possible combinations applied in various orders of an organic material deposition may be formed at a thickness of less than one micron, more preferably at a thickness of less than 0.5 μm, more preferably at a thickness less than 1,000 Å, and most preferably at a thickness less than 500 Å on a polymeric microporous membrane.

In accordance with certain embodiments, the polymeric microporous membrane described herein is directed to a polymeric microporous membrane to which is applied an ultra-thin deposition of an organic material with a layer thickness in the range of 20 Å to 1 μm.

Furthermore, the ultra-thin deposition of reactive metallic element described herein may contribute little additional thickness to the overall thickness of the polymeric microporous membrane, yet, after forming a passivation layer by reacting with an electrolyte containing a lithium salt such as $LiPF_6$, may provide equivalent oxidation resistant stability as a much thicker oxidation resistant coating that is, for example, 2 to 6 or more μm thick applied using other coating methods, e.g., dip, knife, curtain, gravure, etc. coating methods.

In accordance with at least particular embodiments, the instant disclosure or invention is directed to a novel or improved battery separator having at least one conductive layer. In accordance with at least one embodiment, a battery separator for a lithium secondary battery includes a conductive layer. The conductive layer is electrically and/or thermally conductive. The conductive layer is embedded within or between one or more thermoplastic layers. The conductive layer may be embedded within a polyethylene-based layer. The polyethylene-based layer may be sandwiched between polypropylene layers. The conductive layer preferably includes a stainless steel material. The stainless steel material may be stainless steel particles, stainless steel fibers, and/or a stainless steel foil. The stainless steel foil may be porous. A particular lithium secondary battery includes the foregoing separator with the conductive layer.

In accordance with at certain embodiments the conductive layer may also act as a reinforcing layer that consists of a thermal mechanically stable material such as a metal-oxide ceramic compound, a high melting point polymer, a metal oxide and polymer composite, embedded inside a microporous separator membrane via a step-wised fabrication process. A separate coating process such as physical vapor deposition, chemical vapor deposition, or atomic layer deposition may be used to deposit a reinforcing layer or layers with a thickness range between about 50 Å to 10 microns, preferably at least about 10 nm and less than about 1 micron. The deposition of the thin, very thin or ultra-thin reinforcement layer inside the separator may provide mechanical strength and improved safety. In selected embodiments the reinforced layer with or without the conductive element may improve separator curling, coating adhesion, reduce static aiding in battery assembly, and improve thermal stability. In accordance with at least particular embodiments, the conductive layer deposition layer maybe applied to a nonwoven monolayer or a microporous membrane laminated or attached to a nonwoven membrane. Furthermore, in at least certain embodiments, the embedded ceramic conductive layer may contain a ceramic coating with >2% volatile components at ≥250° C. In at least certain embodiments the conductive or embedded or reinforced separator may include a ceramic layer with an ionically conductive binder. In at least certain embodiments the conductive or embedded layer is about 1-10 μm (or um) thick or more, preferably about 2-10 μm thick, more preferably about 3-10 μm thick, and most preferably about 3-5 μm thick.

BRIEF DESCRIPTION OF THE FIGURES

FIG. 41 includes an image of a 44 µm Celgard 2500 separator trilayer with a conductive aluminum layer.

FIG. 42 includes an image of a 92 µm Celgard® 2500 separator/nonwoven bilayer with a conductive aluminum layer.

DETAILED DESCRIPTION OF THE INVENTION

Figure 1:
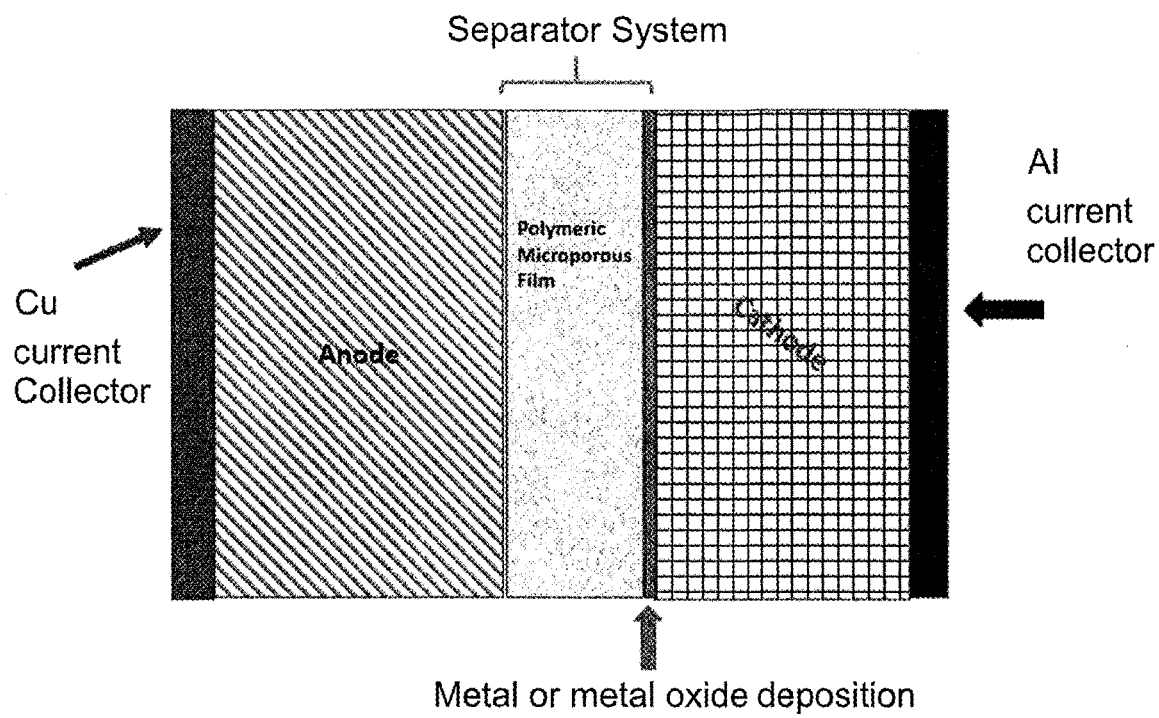
FIG. 1 includes a schematic of a battery cell comprising an anode, cathode, and a separator system where the separator system includes a polymeric microporous membrane or film with metal and/or metal oxide deposition on the side of the microporous membrane or film facing the cathode.
Figure 2:
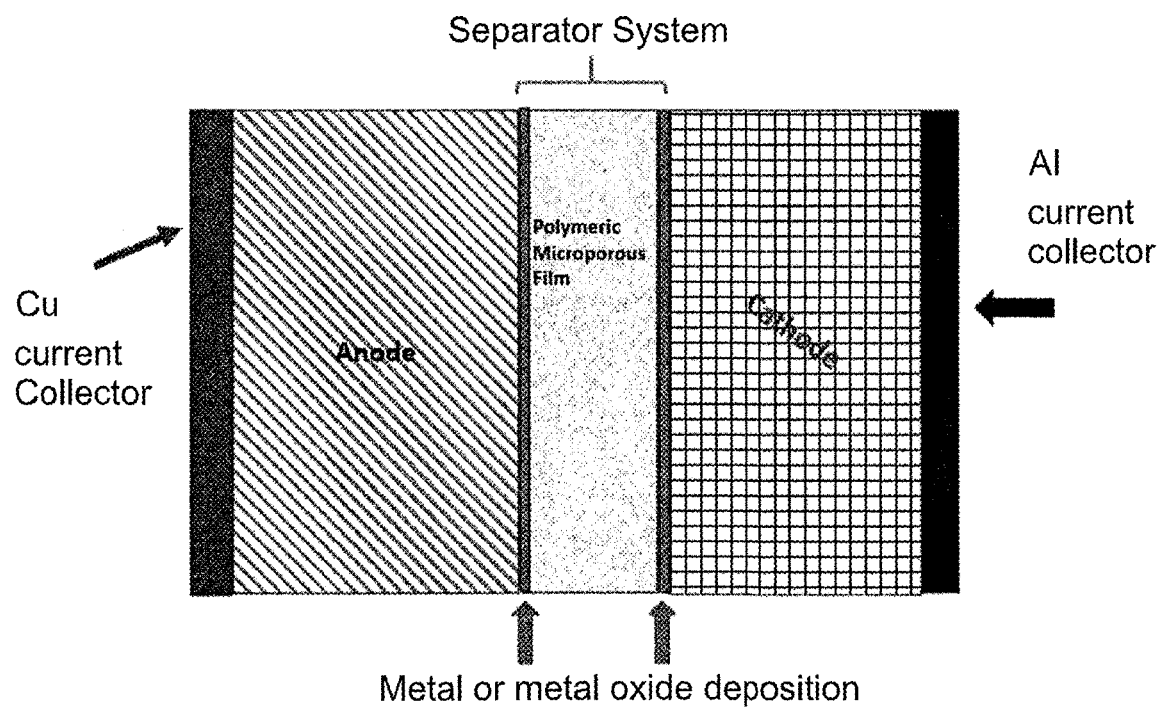
FIG. 2 includes a schematic of a battery cell comprising an anode, cathode, and a separator system where the separator system includes a polymeric microporous membrane or film with metal and/or metal oxide deposition on both sides of the microporous membrane or film.
Figure 3:
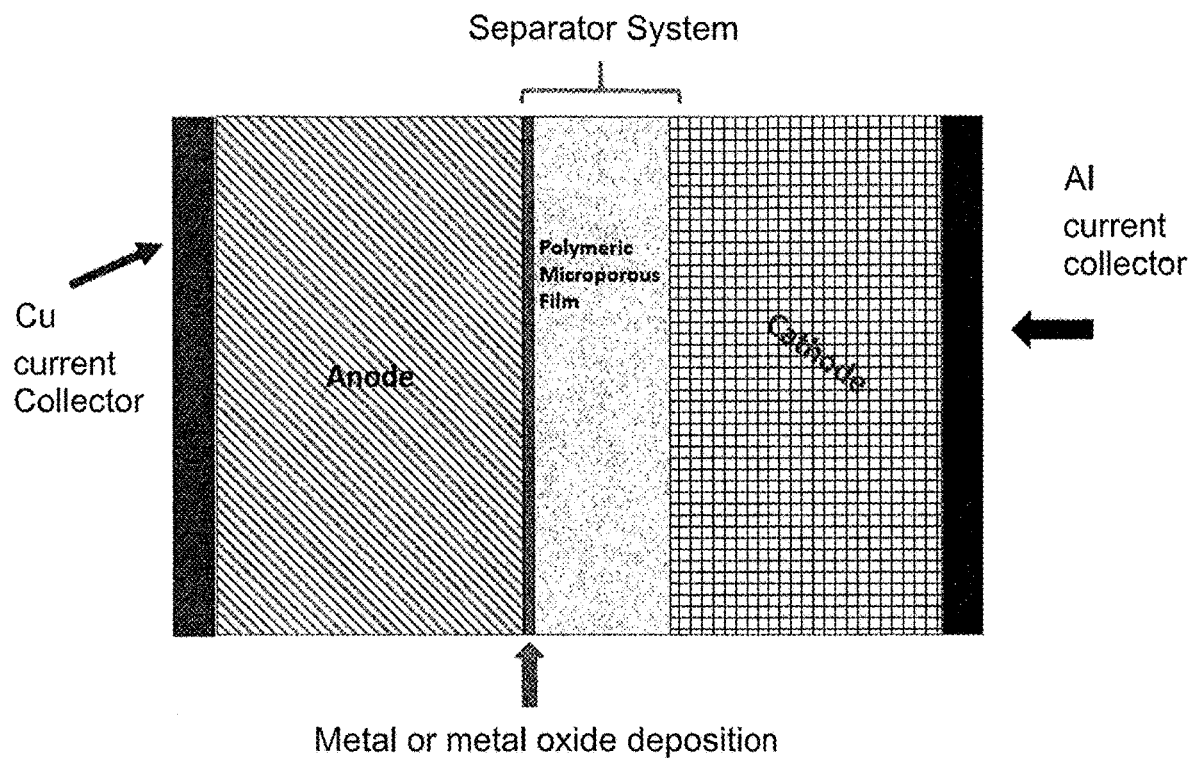
FIG. 3 includes a schematic of a battery cell comprising an anode, cathode, and a separator system where the separator system includes a polymeric microporous membrane or film with metal and/or metal oxide deposition on the side of the microporous membrane or film facing the anode.
Figure 4:
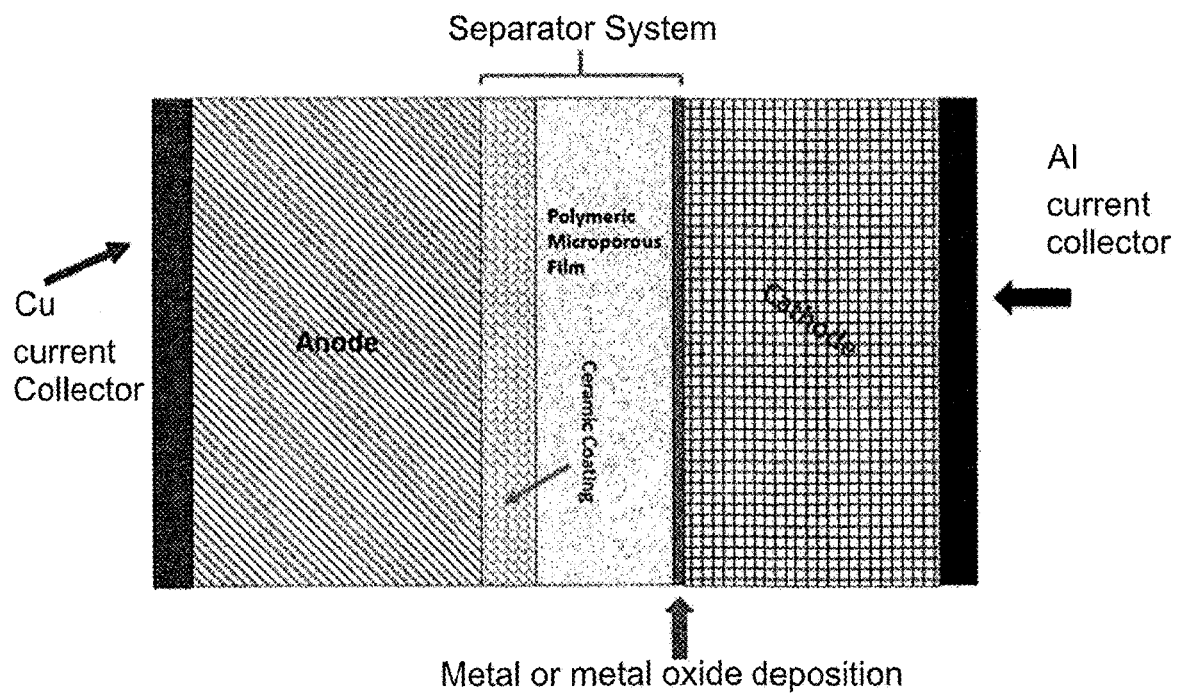
FIG. 4 includes a schematic of a battery cell comprising an anode, cathode, and a separator system where the separator system includes a polymeric microporous membrane or film with a metal and/or metal oxide deposition on the side of the microporous membrane or film facing the cathode and a ceramic coating on the other side of the microporous membrane or film that faces the anode.
Figure 5:
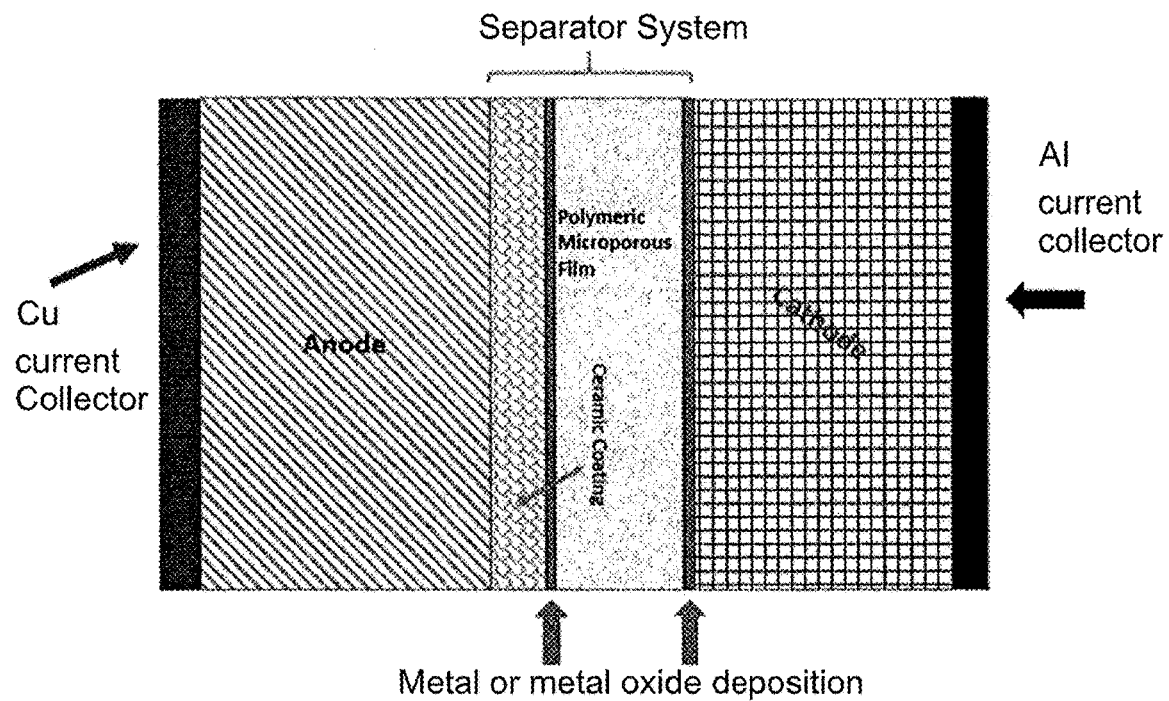
FIG. 5 includes a schematic of a battery cell comprising an anode, cathode, and a separator system where the separator system includes a polymeric microporous membrane or film with a metal and/or metal oxide deposition on both sides of the microporous membrane or film and a ceramic coating on top of the metal and/or metal oxide deposition layer on the side of the microporous membrane or film that faces the anode.
Figure 6:
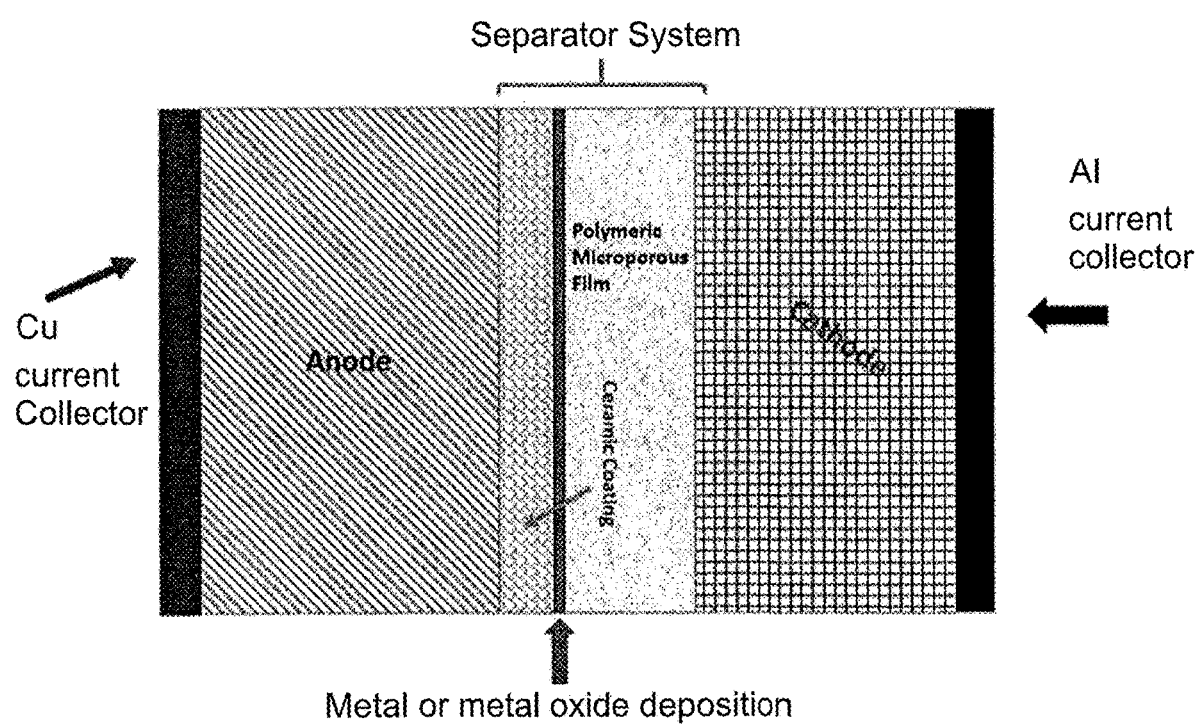
FIG. 6 includes a schematic of a battery cell comprising an anode, cathode, and a separator system where the separator system includes a polymeric microporous membrane or film with a metal and/or metal oxide deposition on the side of the microporous membrane or film facing the anode and a ceramic coating on top of the metal and/or metal oxide deposition layer on the side of the microporous membrane or film that faces the anode.
Figure 7:
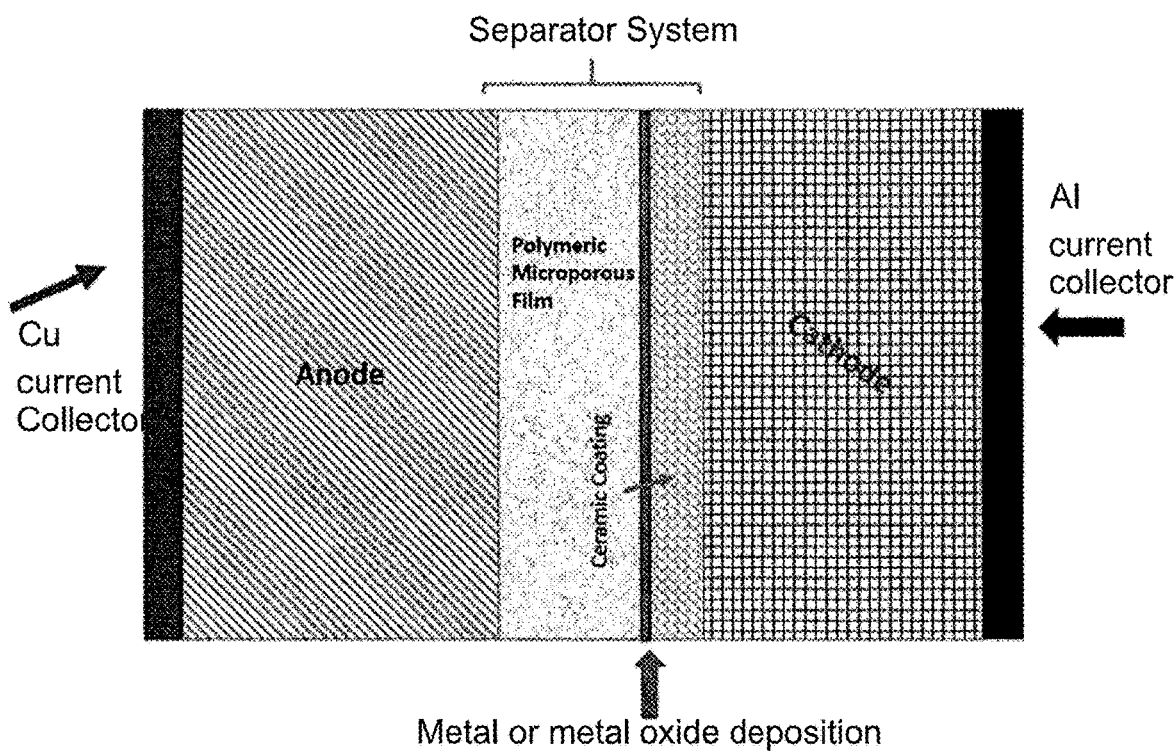
FIG. 7 includes a schematic of a battery cell comprising an anode, cathode, and a separator system where the separator system includes a polymeric microporous membrane or film with a metal and/or metal oxide deposition on the side of the microporous membrane or film facing the cathode and a ceramic coating on top of the metal and/or metal oxide deposition layer on the side of the microporous membrane or film that faces the cathode.
Figure 8:
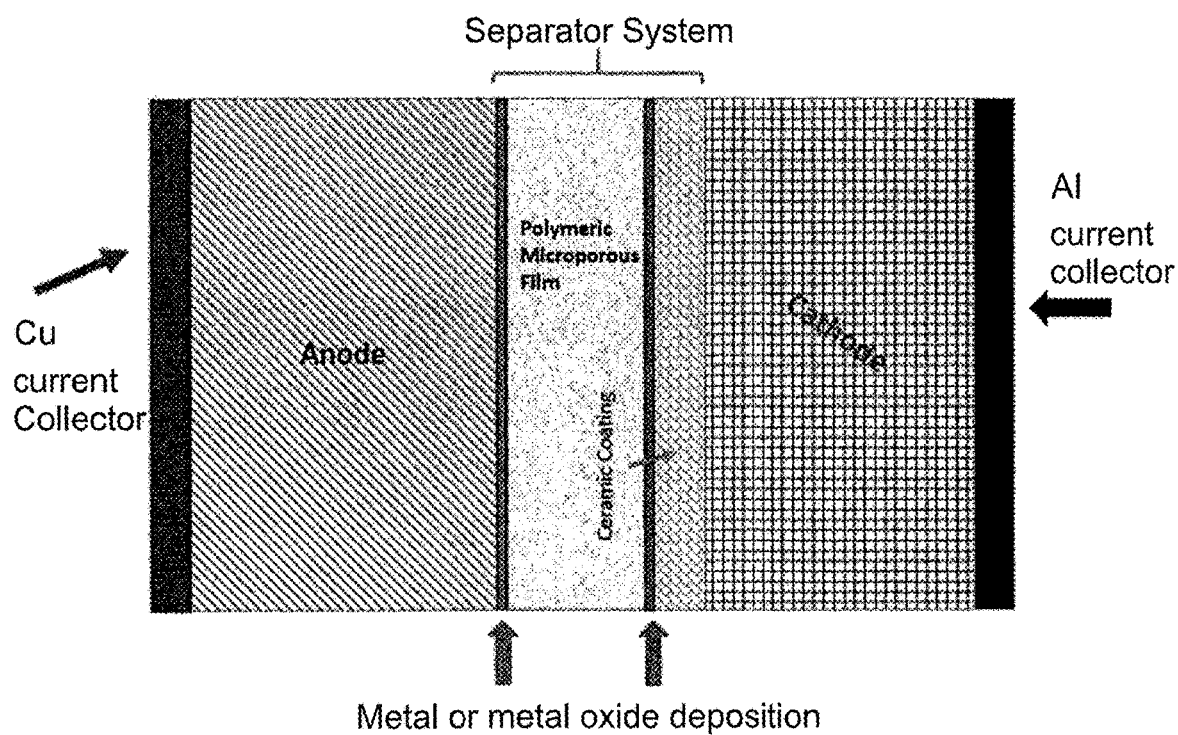
FIG. 8 includes a schematic of a battery cell comprising an anode, cathode, and a separator system where the separator system includes a polymeric microporous membrane or film with a metal and/or metal oxide deposition on both sides of the microporous membrane or film and a ceramic coating on top of the metal and/or metal oxide deposition layer on the side of the microporous membrane or film that faces the cathode.
Figure 9:
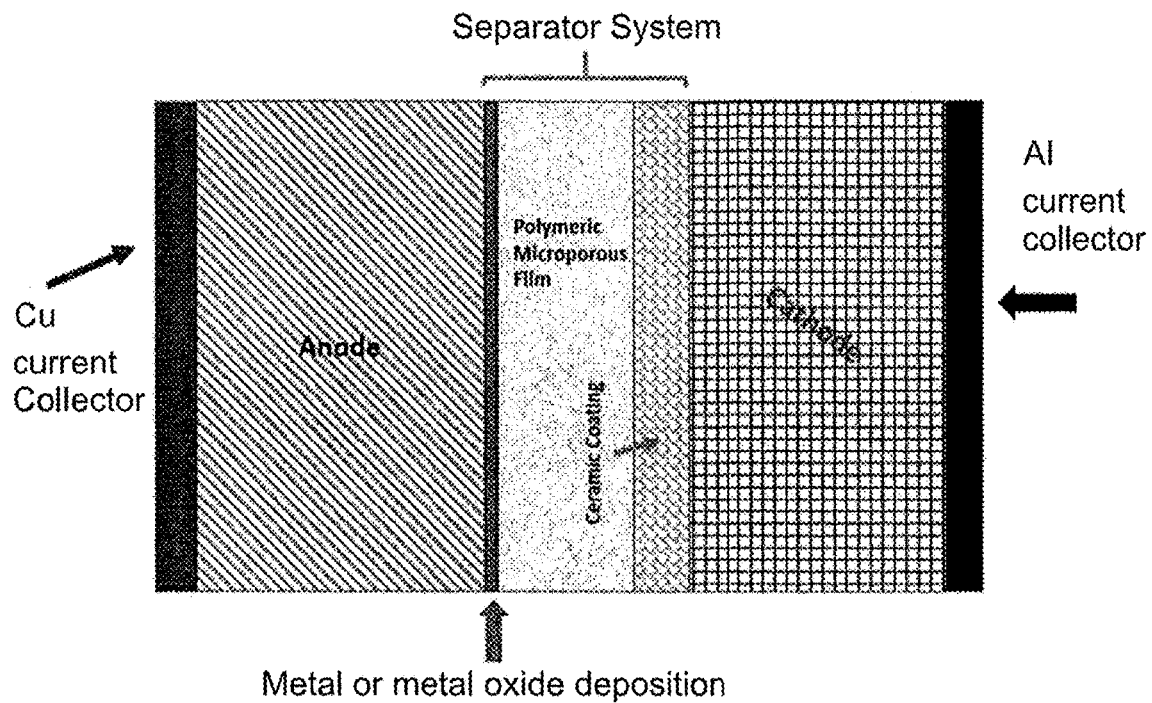
FIG. 9 includes a schematic of a battery cell comprising an anode, cathode, and a separator system where the separator system includes a polymeric microporous membrane or film with a metal and/or metal oxide deposition on the side of the microporous membrane or film that faces the anode and a ceramic coating on the side of the microporous membrane or film that faces the cathode.
Figure 10:
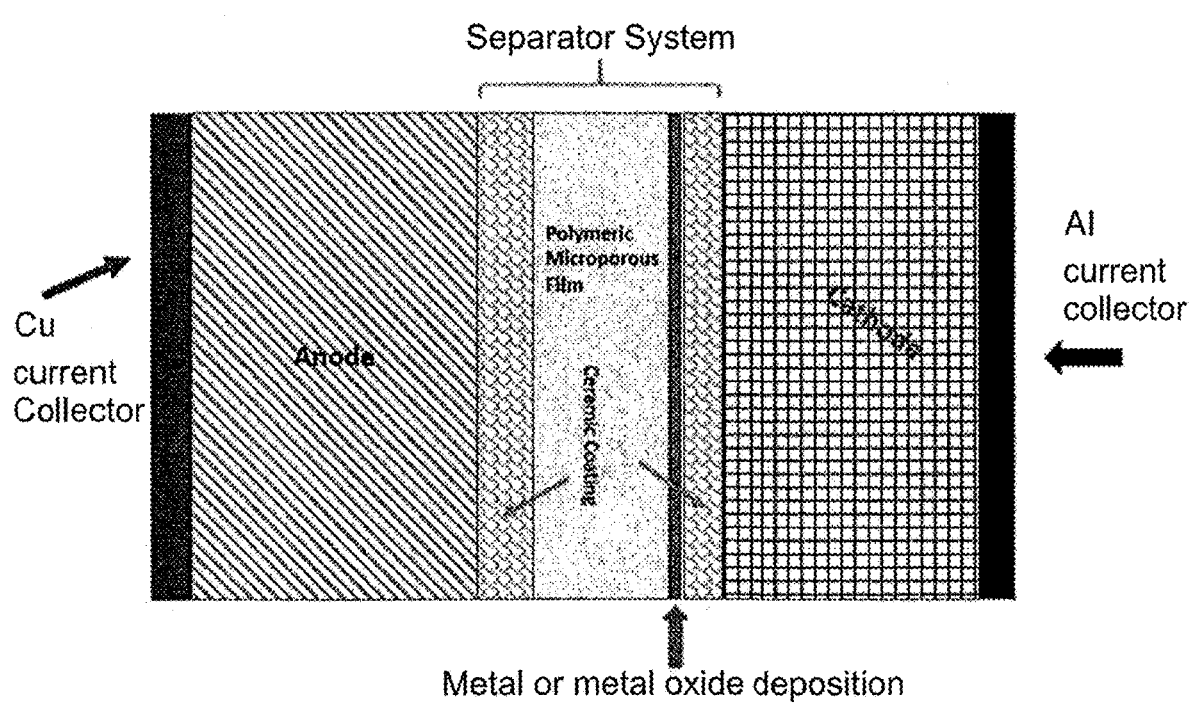
FIG. 10 includes a schematic of a battery cell comprising an anode, cathode, and a separator system where the separator system includes a polymeric microporous membrane or film with a metal and/or metal oxide deposition on the side of the microporous membrane or film that faces the cathode and a ceramic coating on the side of the microporous membrane or film that faces the anode as well as a ceramic coating on top of the metal and/or metal oxide deposition layer on the side of the microporous membrane or film that faces the cathode.
Figure 11:
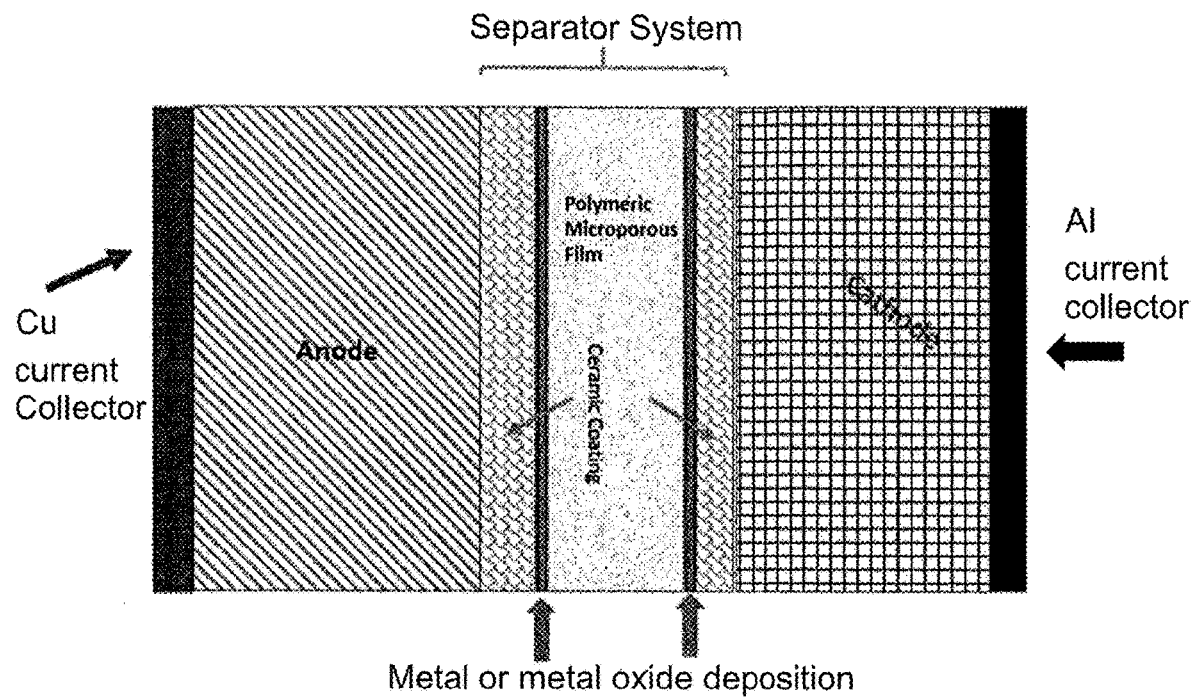
FIG. 11 includes a schematic of a battery cell comprising an anode, cathode, and a separator system where the separator system includes a polymeric microporous membrane or film with a metal and/or metal oxide deposition on both sides of the microporous membrane or film that face the cathode and anode and a ceramic coating on top of both metal and/or metal oxide deposition layers on both sides of the microporous membrane or film that face the cathode and anode.
Figure 12:
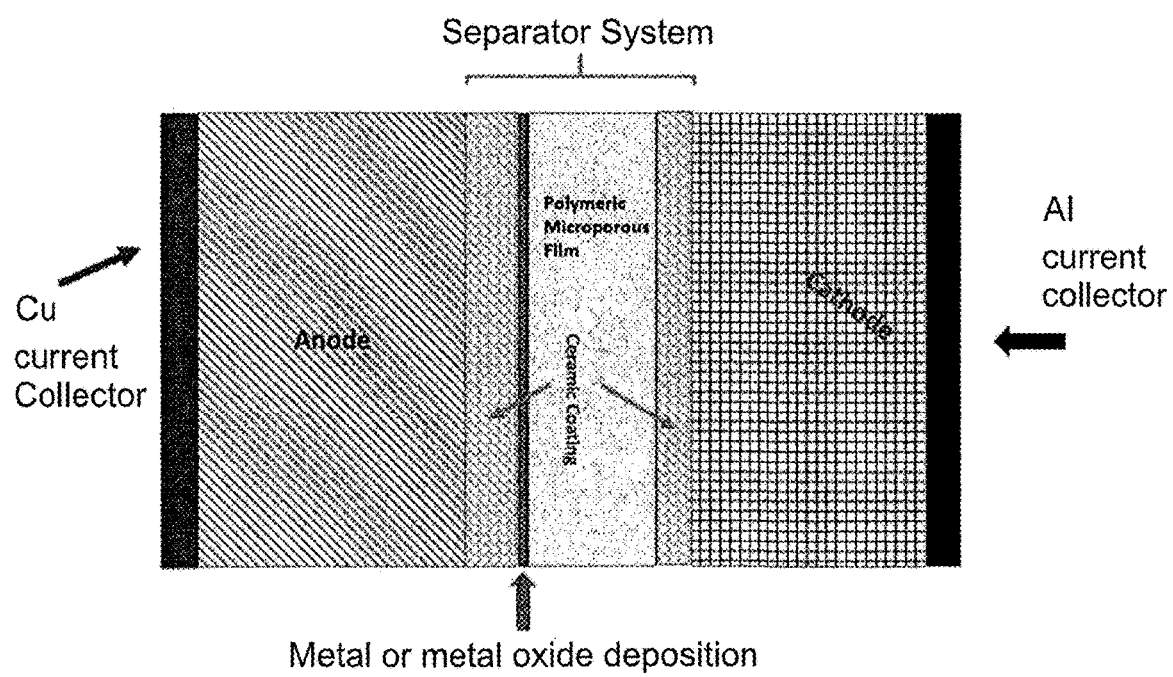
FIG. 12 includes a schematic of a battery cell comprising an anode, cathode, and a separator system where the separator system includes a polymeric microporous membrane or film with a metal and/or metal oxide deposition on the side of the microporous membrane or film that faces the anode and a ceramic coating on top of the metal and/or metal oxide deposition layer on the side of the microporous membrane or film that faces the anode and also a ceramic coating on the side of the microporous membrane or film that faces the cathode.
Figure 13:
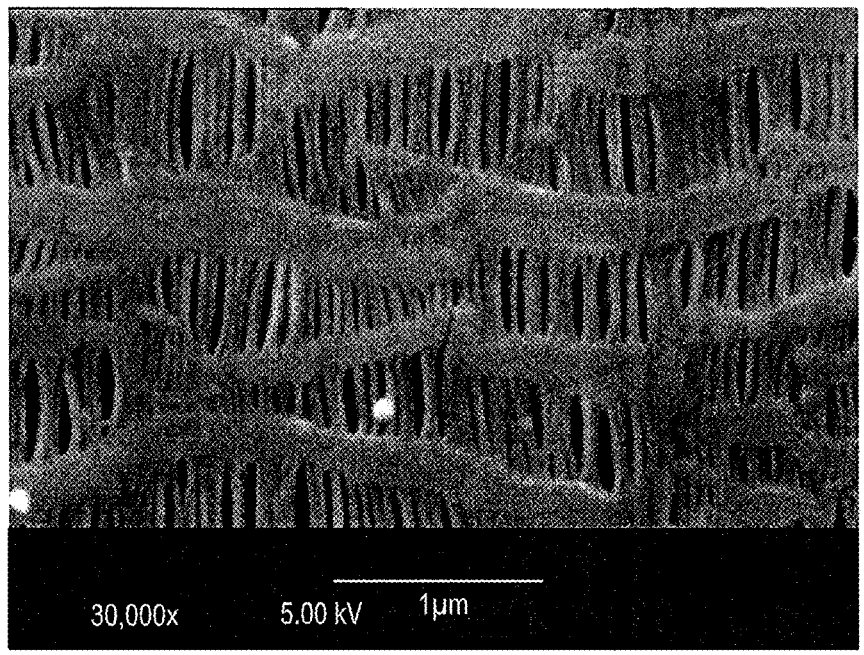
FIG. 13 includes a Scanning Electron Micrograph (SEM) image of the surface of a Celgard® 2500 microporous membrane at a magnification 30,000×.
Figure 14:
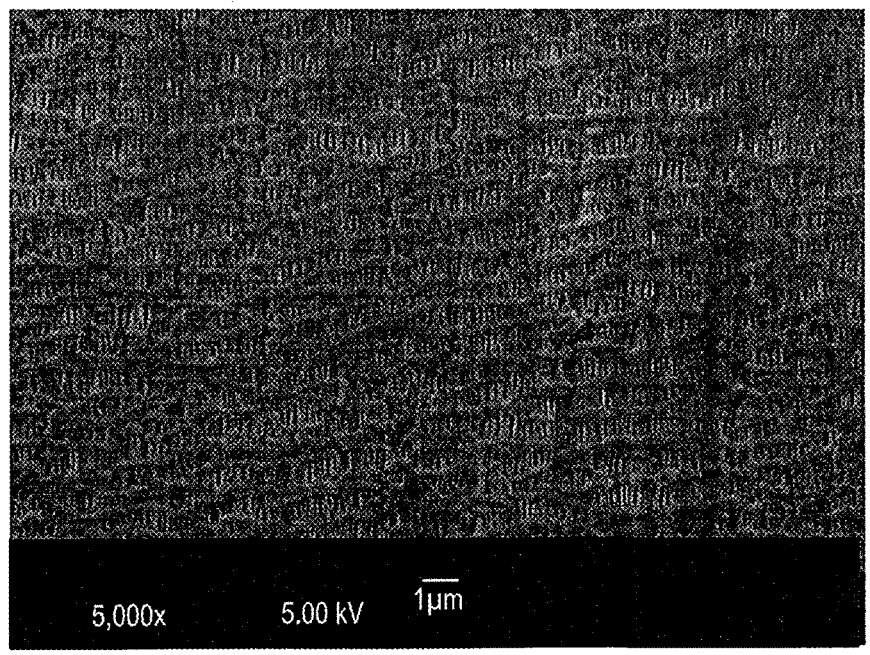
FIG. 14 includes a Scanning Electron Micrograph (SEM) image of the surface of a Celgard® 2500 microporous membrane with an aluminum deposition according to an embodiment described herein, at a magnification of 5,000×.
Figure 15:
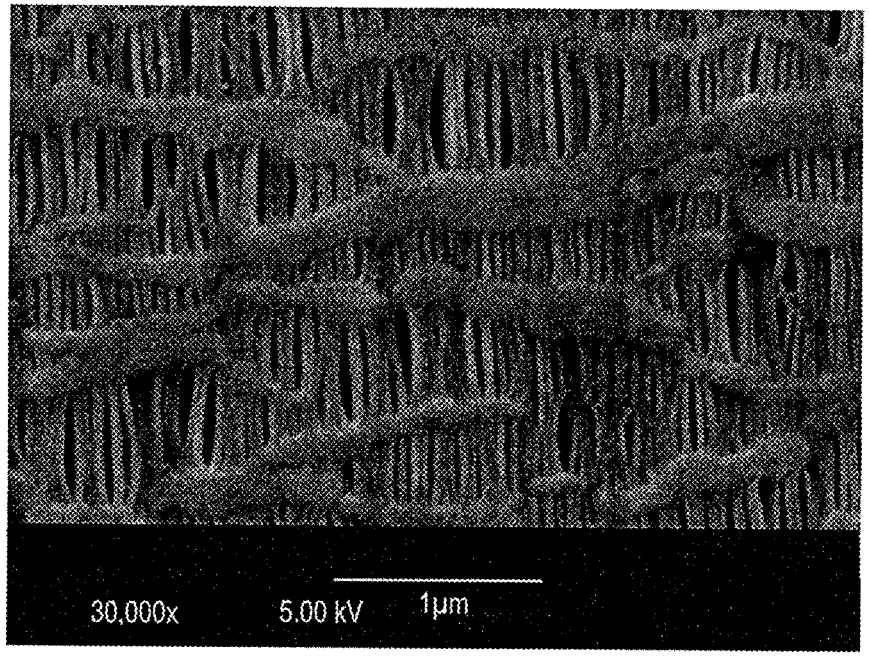
FIG. 15 includes a Scanning Electron Micrograph (SEM) image of the surface of the Celgard® 2500 microporous membrane with aluminum deposition, as shown in FIG. 14, at a higher magnification of 30,000×.
Figure 16:
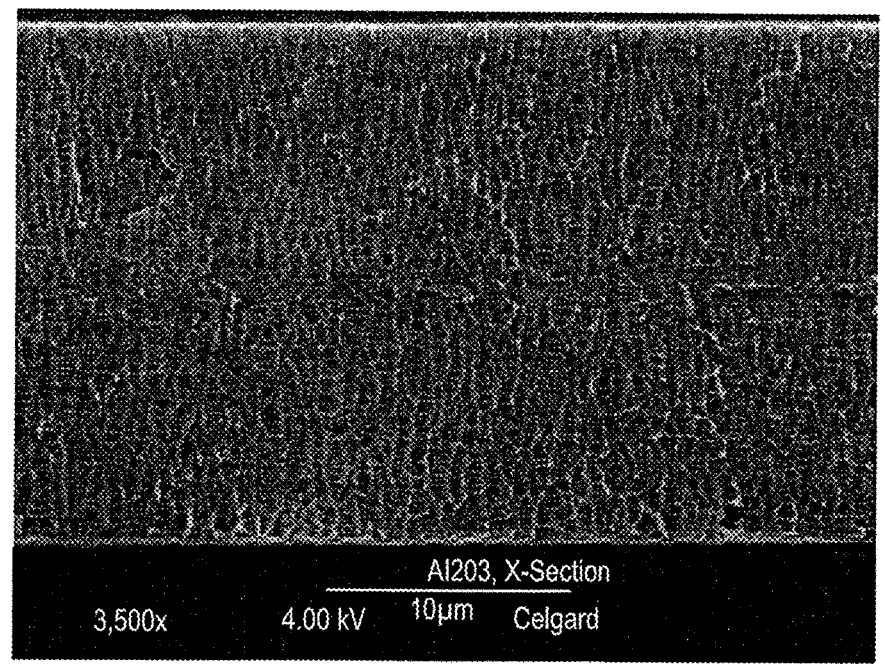
FIG. 16 includes a Scanning Electron Micropgraph (SEM) image of the surface of the Celgrad® 2500 microporous membrane with 20 nm aluminum oxide deposition according to an embodiment described herein, at a magnification of 3,000×.
Figure 17:
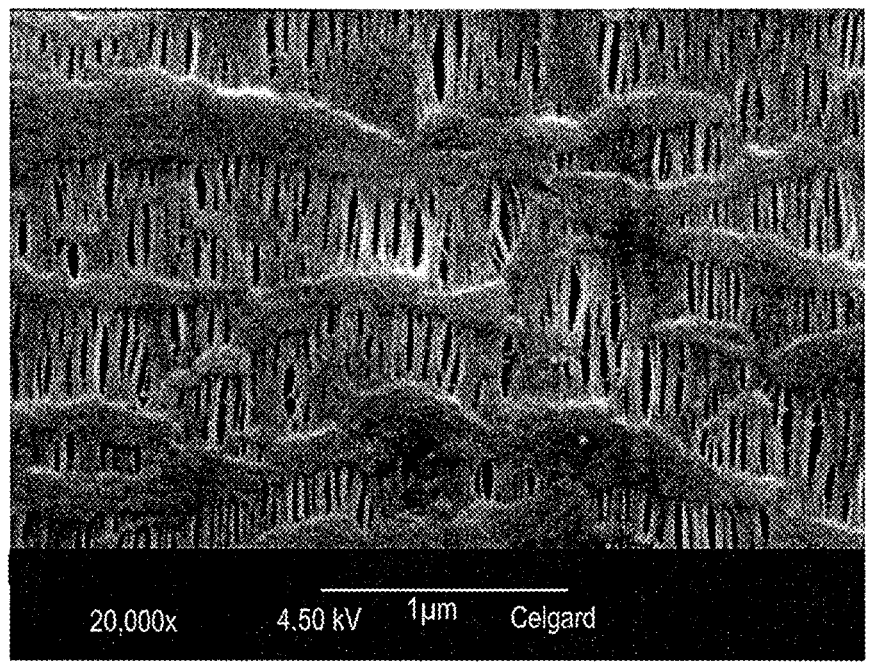
FIG. 17 includes a Scanning Electron Micropgraph (SEM) image of the surface of the Celgrad® 2500 microporous membrane with 20 nm aluminum oxide deposition, as shown in FIG. 16, at a magnification of 20,000×.
Figure 18:
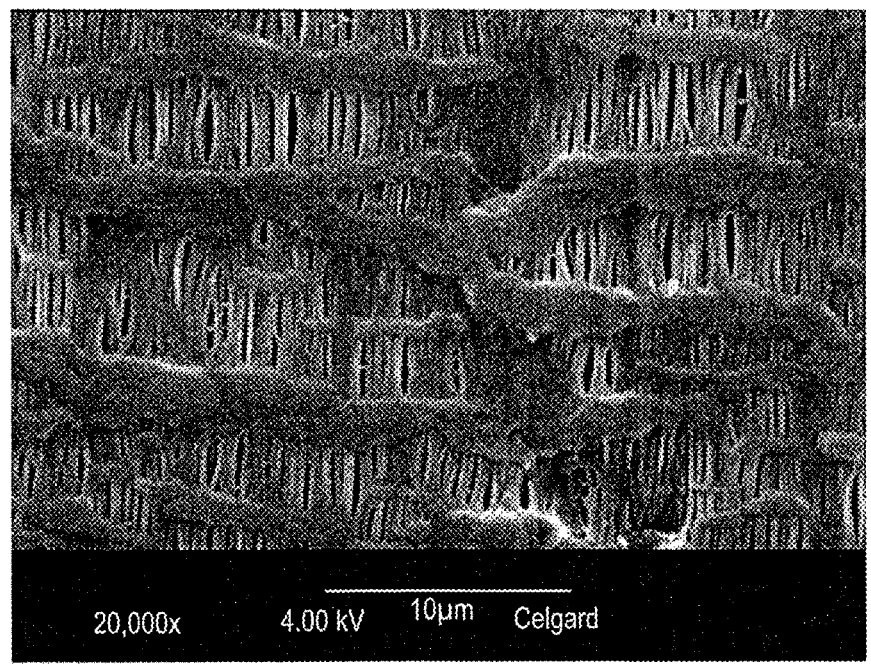
FIG. 18 includes a Scanning Electron Micropgraph (SEM) image of the surface of the Celgrad® 2500 microporous membrane with 10 nm aluminum oxide deposition according to an embodiment described herein, at a magnification of 20,000×.

In accordance with at least certain embodiments, the present invention is directed to a separator for a battery which may have one or more layers on a polymeric microporous membrane or substrate that comprises a thin or ultra-thin deposition of a metal and/or metal oxide and/or organic material applied via a binder-free and solvent-free deposition process. The very thin or ultra-thin deposition of a metal and/or metal oxide and/or organic material has a preferred thickness less than or equal to 1 µm. By employing such a very thin or ultra-thin deposition layer, the energy density of a lithium battery, such as a rechargeable lithium ion battery, may be increased. Furthermore, the binder-free and solvent-free deposition method may deposit a uniform deposition layer that may have a thickness that is less than 1 µm, preferably less than 1,000 Å, and most preferably less than 500 Å, which combination of uniformity and thickness may not be accomplished by known coating techniques. In accordance with at least certain embodiments, various embodiments described herein are directed to a polymeric microporous battery separator membrane which may have excellent oxidation resistance and may be stable in a high voltage system up to at least 5.2 volts, for example, up to 7 volts. The very thin or ultra-thin deposition of inert metallic element, reactive metallic element, and/or metal oxide and/or organic material may be applied to a polymeric microporous membrane via a physical vapor deposition method, an atomic layer deposition method, or a chemical vapor deposition method.

Physical vapor deposition (PVD) may include a variety of vapor and/or vacuum deposition methods used to deposit thin films by the condensation of a vaporized form of the desired film material onto various substrate surfaces. PVD is used in the manufacture of various items, including, by way of example only, semiconductor devices, aluminized PET film for balloons and snack bags, and coated cutting tools for metalworking. Vacuum metallizing is a form of physical vapor deposition, a process of combining metal with a non-metallic substrate through evaporation. The most common metal used in vacuum metallization is aluminum for a variety of reasons such as cost, thermodynamics, and reflective properties.

A vapor deposition process is one preferred method of application of an ultra-thin deposition of inert metallic element, reactive metallic element, and/or metal oxide according to various embodiments described herein, due to its excellent control of thickness of the deposition layer, the ultra-thin thickness of the deposition layer, and the defect-free or substantially defect-free quality of the ultra-thin deposition layer. In at least certain embodiments the deposition layer may organic material. A very thin deposition layer thickness in the range of less than 1 µm is desirable so as not to add to the overall thickness of the separator membrane. The very thin deposition layer described herein contributes little additional thickness to the overall thickness of the separator membrane. The ultra-thin deposition of inert metallic element, metal oxide, and/or organic material may provide a separator having an equivalent level of oxidation stability as a much thicker separator, for example, a separator bearing a 2 to 6 µm thick (or thicker) coating that is applied using a coating method such as dip, knife, curtain, etc. coating methods. The ultra-thin deposition of reactive metallic element (for example, aluminum) may react with the battery electrolyte, which may contain, for example, a lithium salt such as $LiPF_6$, and form an $AlF_3$ passivation layer. This ultra-thin passivation layer is resistant to oxidation and may provide a separator having an equivalent level of oxidation stability as a much thicker separator, for example, a separator bearing a 2 to 6 µm thick (or thicker) coating that is applied using a coating method such as dip, knife, curtain, gravure, etc. coating methods.

A very thin battery separator or separator membrane may be desirable because it occupies less volume in a battery and may enable a battery to have higher volumetric and gravimetric energy density.

In forming the deposition layers described herein, a vapor deposition technology may be employed to deposit a very thin layer of a metal and/or metal oxide as a deposition layer at a thin or ultra-thin thickness of less than 1 µm. Physical vapor deposition (PVD), chemical vapor deposition (CVD) and atomic layer deposition (ALD) are three commonly known types of vapor deposition technology. Non-limiting examples of physical vapor deposition are sputter and evaporation. Physical vapor deposition may involve vaporizing a metallic element, a reactive metallic element, an inert metallic element, or a metal oxide and forming an extremely thin layer on a substrate such as a separator membrane. A vapor deposition layer may be deposited onto a microporous separator membrane, which vapor deposition layer is comprised of a single layer of individual atoms or molecules of highly oxidation resistant materials such as a metal and/or metal oxide. Furthermore, a vapor deposition layer may be deposited onto a microporous separator membrane, which vapor deposition layer is comprised of multiple layers of individual atoms or molecules of highly oxidation resistant materials such as an inert metallic element, a reactive metallic element, or a metal oxide compound and/or an organic material. In addition, one or more layers of possible combinations applied in various orders of a metal and/or metal oxide and/or an organic material may be formed at a thickness of less than one micron, more preferably at a thickness of less than 0.5 µm, more preferably less than 1,000 Å, and most preferably at a thickness less than 500 Å on a microporous separator membrane.

Atomic layer deposition (ALD) which is a film growth method that deposits a deposition in layers, may also be used to apply an ultra-thin deposition layer in a controlled fashion. In general, a vapor of film precursor is absorbed on a substrate in a vacuum chamber. The vapor is then pumped from the chamber, leaving a thin layer of absorbed precursor, usually essentially a monolayer, on the substrate. A reactant is then introduced into the chamber under thermal conditions, which promote reaction with the absorbed precursor to form a layer of the desired material. The reaction products are pumped from the chamber. Subsequent layers of material can be formed by again exposing the substrate to the precursor vapor and repeating the deposition process. ALD can produce very thin films with extremely dense layer production and a minimum amount of defects. ALD is suitable for fabricating barrier layers for packaging sensitive electronic devices and components built on plastic substrates.

Chemical vapor deposition (CVD) technology may also be used to apply a very thin or ultra-thin deposition layer in a controlled fashion. Chemical vapor deposition is another widely used materials-processing technology to apply solid thin-films to surfaces. It has been used to deposit a very wide range of materials. In its simplest incarnation, CVD involves flowing a precursor gas or gases into a chamber containing one or more heated objects onto which the CVD layer is to be applied. Chemical reactions occur on and near the hot surfaces, resulting in the deposition of a thin film on the surface. This is accompanied by the production of chemical by-products that are exhausted out of the chamber along with unreacted precursor gases. It can be done in hot-wall reactors and cold-wall reactors, at sub-torr total pressures to above-atmospheric pressures, with and without carrier gases, and at temperatures typically ranging from 200-1600° C. There are also a variety of enhanced CVD processes, which involve the use of plasmas, ions, photons, lasers, hot filaments, or combustion reactions to increase deposition rates and/or lower deposition temperatures.

Application of a deposition layer using PVD, CVD or ALD may provide reliable methods to control the added thickness of a deposition of inert metallic element, reactive metallic element, and/or metal oxide compound. The thickness of the deposition layer or layers may be ultra-thin and in the range of less than 1 µm, more preferably less than 0.5 µm, more preferably less than 1,000 Å, and most preferably at a thickness less than 500 Å. Such a reliable method of applying a thin, very thin or ultra-thin deposition at a thickness less than 1 µm may not be attained using, for example, other coating methods such as dip, gravure, knife, curtain, etc. coating methods. An application of an ultra-thin deposition using one or more of the PVD, CVD or ALD deposition methods may provide a reliable method to apply a uniform oxidation resistant layer. The level of application control achieved in PVD, CVD or ALD deposition methods may have sufficient accuracy so as to contribute an insignificant increase in thickness of a polymeric microporous membrane, when considering a polymeric microporous membrane for a battery may, in some instances, have a thickness between 5 and 25 µm.

Alternative coating methods for applying a polymeric coating or a ceramic-containing polymeric coating are known to those skilled in the art, and some may improve performance of a microporous battery separator membrane in a battery by improving safety, battery cycle life, and high temperature performance, among other things. Such coatings may include one or more polymeric binders, one or more types of particles (for example, inorganic ceramic particles) and a water-based solvent or a non-aqueous solvent. Such coatings may be applied as a coating or a layer onto one or both sides of a microporous battery separator membrane in order to, among other things, promote high temperature stability, reduce thermal shrinkage, control oxidation at the separator-cathode interface of the battery, and improve safety performance of the microporous battery separator membrane in a battery, such as lithium ion rechargeable battery systems. Such coatings may be applied using known technologies such as, but not limited to, dip coating, knife, gravure, curtain, etc. These polymeric and/or ceramic particle-containing polymeric coatings are typically applied at a thickness of 2 to 6 microns, or more, onto one or both sides of a microporous battery separator membrane. However, these known coating techniques may not be able to apply uniform layers having a controlled thickness of less than one micron, less than 0.5 µm, more preferably less than 1,000 Å and most preferably less than 500 Å.

In accordance with certain embodiments, polymeric and/or ceramic particle-containing polymeric coatings may be applied on top of or in addition to a metal and/or metal oxide deposition layer in order to further improve various properties of the separator, for example, the thermal stability of the separator membrane at high temperatures. U.S. Pat. No. 6,432,586, which is incorporated herein by reference in its entirety, discloses various ceramic-coated separators. Additionally, U.S. Patent Publication No. 2014/0045033, which is also incorporated herein by reference in its entirety, discloses various ceramic particle-containing polymeric coatings for microporous battery separator membranes which may provide improvement in safety, battery cycle life and high temperature performance. Such coatings may include one or more polymeric binders, one or more types of inorganic ceramic particles and a water based or a non-aqueous solvent. Such coatings may be applied using various technologies such as, but not limited to, dip coating, knife, gravure, curtain, spray, etc. Furthermore, various known ceramic particle-containing polymeric coatings may be applied at varying thicknesses, such as a thickness of, for example, 2 to 6 microns onto one or both sides of a microporous battery separator membrane.

In accordance with certain embodiments, the battery separator membrane described herein is directed to a polymeric microporous membrane (preferred thickness of such membrane is in the range of 2 to 200 µm, more preferably less than 50 µm) to which is applied a deposition layer comprising a deposition of one or more organic materials, and the thickness of such deposition layer is in the range of 20 Å to 1 µm. In some embodiments, the organic material may include one or more non-conductive and/or conductive polymers. In various embodiments, the organic material deposition layer may include one or more of the conductive or conducting forms of, in varying combinations: polypyrrole (PPY), poly(3,4-ethylenedioxythiophene) (PEDOT), polythiophene, polyaniline, polyacetylenes, poly(3-thiophenacetic acid) (PTAA), poly(fluorine)s, polyphenylenes, polypyrenes, polyazulenes, polynaphthalenes, poly(p-phenylene vinylene) (PPV), polycarbazoles, polyindoles, polyazepines, and/or poly(p-phenylene sulfide) (PPS).

In accordance with certain embodiments, the battery separator membrane described herein is directed to a polymeric microporous membrane to which is applied a deposition layer comprising a highly oxidation resistant material such as an inert metallic element where the deposition layer thickness is in the range of 20 Å to 1 µm. Non-limiting examples of an inert metallic element may be gold and platinum. A deposition of a chemically stable metal such as gold or platinum onto a microporous polymeric membrane or film may create an oxidation resistant layer when the side of the microporous polymeric membrane bearing the deposition layer is placed in contact with the cathode. When a battery is a high voltage battery (e.g., a battery up to 5.2 volts or more, for example, a battery up to 7.0 volts or more), oxidation may be more aggressive, and a protective oxidation resistant layer is desirable to limit the oxidative degradation of the microporous polymeric membrane against the cathode. A metal deposition layer according to various embodiments herein is a conductive layer and may dissipate current distribution within a battery cell.

In at least certain embodiments, the inventive metal oxide, organic, and/or metal, conductive deposition layer described herein may be applied to a non-conductive layer or layers of a polymer, such as a polyolefin, such as, but not limited to, a polypropylene, a polypropylene blend, a polypropylene copolymer, or mixtures thereof and a polyethylene, a polyethylene blend, a polyethylene copolymer, or mixtures thereof. Non-limiting examples of the non-conductive layer may include single layer, bilayer, trilayer or multilayer (coextruded or laminated) porous membranes manufactured by a dry process or by a wet process, both of which are commonly known by those skilled in the art.

In accordance with at least certain embodiments, examples of a reactive metal element may include aluminum (Al), nickel (Ni) and copper (Cu). As an example of a reactive metal element, when exposed to oxygen in air, aluminum will form an ultra-thin protective layer of aluminum oxide ($Al_2O_3$). A layer of $Al_2O_3$ may be stable against further oxidation in air. Furthermore, when aluminum (Al) is exposed to a battery electrolyte which contains a lithium salt such as $LiPF_6$, aluminum may react and form an ultra-thin protective layer of aluminum fluoride ($AlF_3$) which may be stable to oxidation. Furthermore, aluminum, nickel and copper are conductive metals. Aluminum fluoride ($AlF_3$) may be non-conductive.

The schematics shown in FIGS. 1-12 may include a reactive metal, an inert metal, a metal oxide, or some combination thereof as part of the metal or metal oxide deposition layer(s) depicted in those drawings. By way of example only, using a reactive metal such as aluminum as just one example, FIG. 1 can show a schematic representation of a battery cell where a polymeric microporous membrane or film is between the cathode and anode and a thin, very thin or ultra-thin protective deposition of the reactive metal aluminum has been applied to the side of the polymeric microporous membrane or film that is adjacent or in contact with the cathode. The application of one or more aluminum deposition layers may form a polymeric microporous membrane or film which contains one or more conductive layers. Aluminum may be used in the inventive deposition layer(s) described herein and may be applied to one or both sides of a nonconductive polymeric microporous membrane or film using a physical vapor deposition method, an atomic layer deposition method, or a chemical vapor deposition method. Polymers such as, but not limited to, polyethylene (PE) may be more susceptible to oxidation in a battery than polypropylene. An aluminum deposition layer applied to a PE separator membrane may protect the separator from oxidation at the cathode/separator interface because the aluminum may react with electrolyte in the battery, which electrolyte may contain a lithium salt such as lithium hexafluorophosphate ($LiPF_6$) to form a passivation layer of aluminum fluoride ($AlF_3$). The $AlF_3$ passivation layer is stable against further oxidation.

The Al deposition may be described as a reactive "in-situ" layer because it may react with the electrolyte which contains a $LiPF_6$ salt and form a layer of aluminum fluoride ($AlF_3$). A layer of aluminum fluoride which may form on the surface of an aluminum deposition layer may be described as a passivation layer due to its inert chemical behavior. Fresh, unreacted, newly exposed, etc. aluminum in such a system is believed to be self-healing since there is ample supply of electrolyte to flood back over the site of the fresh, unreacted, newly exposed, etc. aluminum to react with the Al to form more $AlF_3$. The $AlF_3$ layer may provide a protective layer to prevent further reactions of various materials, for example, prevent reactions of electrode materials with the $LiPF_6$-containing electrolyte that could contribute to performance degradation of a lithium ion battery and/or cell.

A non-limiting example of a metal oxide compound may be aluminum oxide ($Al_2O_3$). $Al_2O_3$ is an oxidation resistant material which may not undergo oxidation in, for example, typical mixtures of alkyl carbonate electrolytes which contain a lithium salt such as $LiPF_6$. An $Al_2O_3$ oxidation resistant deposition layer may be applied to both sides of a battery separator membrane a using a physical vapor deposition method, an atomic layer deposition method, or a chemical vapor deposition method to protect the membrane from undergoing oxidation, which oxidation might limit the safety performance of a polymeric microporous membrane in a battery and/or might have an adverse effect on the lifetime of a battery. Oxidation processes may be more of a concern at the cathode/separator interface; additionally, oxidation processes may be more of a concern for certain types of membranes due to the susceptibility of a polymeric microporous membrane, for example, but not limited to, a polyethylene, to oxidation. Application of an $Al_2O_3$ oxidation resistant deposition layer on the side of a polymeric microporous membrane that is in contact with a cathode in a lithium ion battery may protect the polymeric microporous membrane from undergoing oxidation.

Vapor deposition technology offers a method to apply an $Al_2O_3$ oxidation resistant deposition at a very thin thickness of less than 1 µm, preferably less than 0.5 µm, more preferably less than 1,000 Å and most preferably at a thickness less than 500 Å. Furthermore, vapor deposition may apply an oxidation resistant $Al_2O_3$ deposition that is uniform. Other coating methods such as dip, knife, curtain, etc. coating methods, may not be capable of achieving the level of uniformity and defect-free layer quality that can be achieved using vapor deposition technology. A further advantage of a vapor deposition method, such as a physical vapor deposition method, is that a binder component may not be required for the application of the metal and/or metal oxide deposition. This approach of improving a separator by depositing an oxidation resistance deposition layer without a binder may remove a vulnerable aspect of some ceramic coatings, which may include oxidation of the binder component.

In some of the embodiments described herein, a ceramic coating may be applied to the inventive separators, and such a ceramic coating may include a polymer or combination of polymers, such as PVDF, PVDF:HFP, PEO, PTFE, SBR, PVA, acrylic, and/or the like, as well as particles, for example, a metal-oxide ceramic compound, such as aluminum oxide ($Al_2O_3$). See FIGS. 4, 9, 10, and 12. Such a ceramic coating can be applied as a coating on top of the ultra-thin metal and/or metal oxide deposition layer in order to further improve various characteristics of the separator membrane, such as the thermal stability of the separator membrane at high temperature. FIGS. 5, 6, 7, 8, 10, 11 and 12 depict various embodiments of the present invention in which a ceramic coating, for example, an aluminum oxide ($Al_2O_3$)-containing ceramic coating is applied on top of the vapor-deposited preferably ultra-thin metal and/or metal oxide deposition layer. Furthermore, FIGS. 4, 9, 10, and 12 depict various embodiments of the present invention in which a ceramic coating, for example, an aluminum oxide-containing ceramic coating, is applied on one side of the polymeric microporous membrane or film. The additional ceramic coating may be applied using various coating methods, such as dip, gravure, knife etc. coating methods, as a thicker layer with a thickness in a range of 1 to 10, in some cases, 2 to 10 μm in order to further improve the thermal stability of the separator membrane at higher temperatures, for example, temperatures up to or above 180° C.

In various embodiments shown and described herein, a deposition layer of metal and/or metal oxide, by way of example only, a PVD-applied reactive metal layer, may be electrically conductive and may provide uniform current distribution in a lateral direction across a battery separator membrane which may be an effective method to dissipate current distribution into a larger area in the event of a thermal runaway event or a potential or possible thermal runaway event in a battery.

Figure 23:
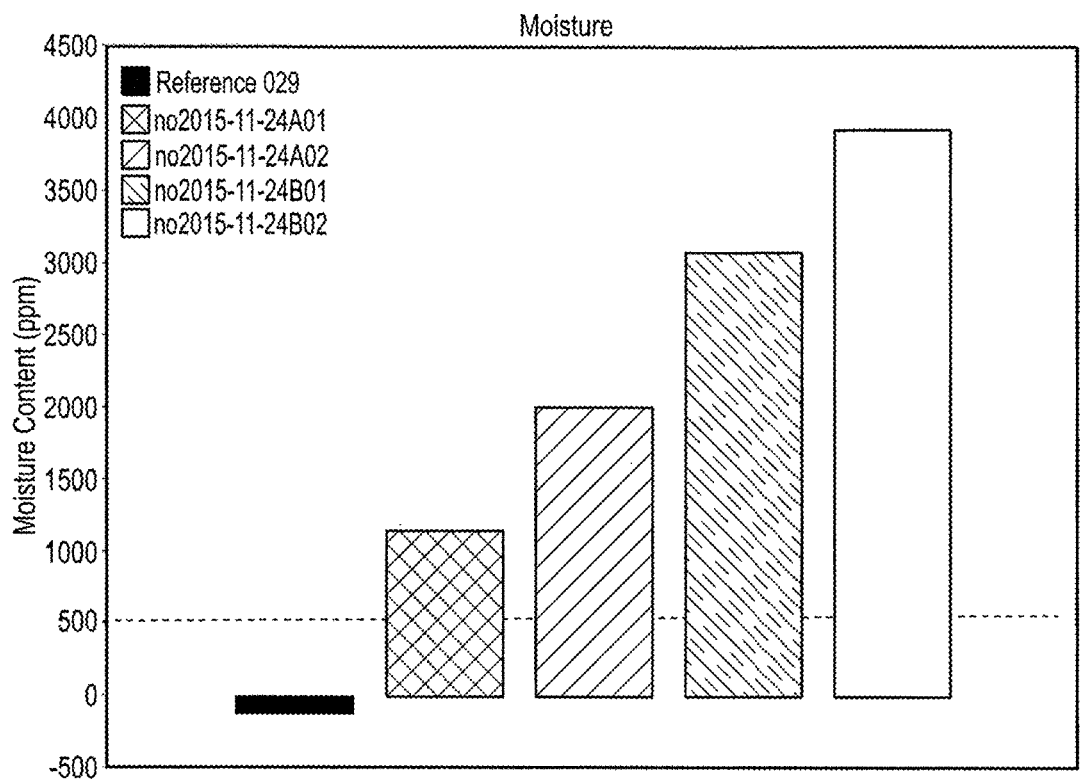
FIG. 23 includes a Karl Fisher moisture plot. The dotted line represents industry acceptable moisture threshold.

In various embodiments the present application or invention may address the reduced performance parameters and film characteristics associated with the deposition of metal and or metal oxide at thicknesses greater than 50 nm on to microporous separators in lithium ion batteries. Same or improved film characteristics include but not limited water content or retention properties and electrolyte wetting. Lithium ion battery industry standards suggest that that the moisture content be below 500 ppm as acceptable Table 1 displays the moisture content of two deposition coated samples. Both samples were coated with 10 nm of Aluminum Oxide and displayed acceptable levels of moisture content at 401.3 and 212.6 ppm respectively. Those films with Al2O3 layers thicker than 50 nm exhibit moisture levels above the standard as determined using Karl Fischer titration (FIG. 23).

TABLE 1

| Sample ID | Weight (g) | Moisture Content (ppm) | Moisture Content (%) |
| --- | --- | --- | --- |
| PE EK1246 10 nm AlOx | 0.1916 | 401.3 | 0.040 |
| PP 2500 10 nm AlOx | 0.1938 | 212.6 | 0.021 |

Figure 21:
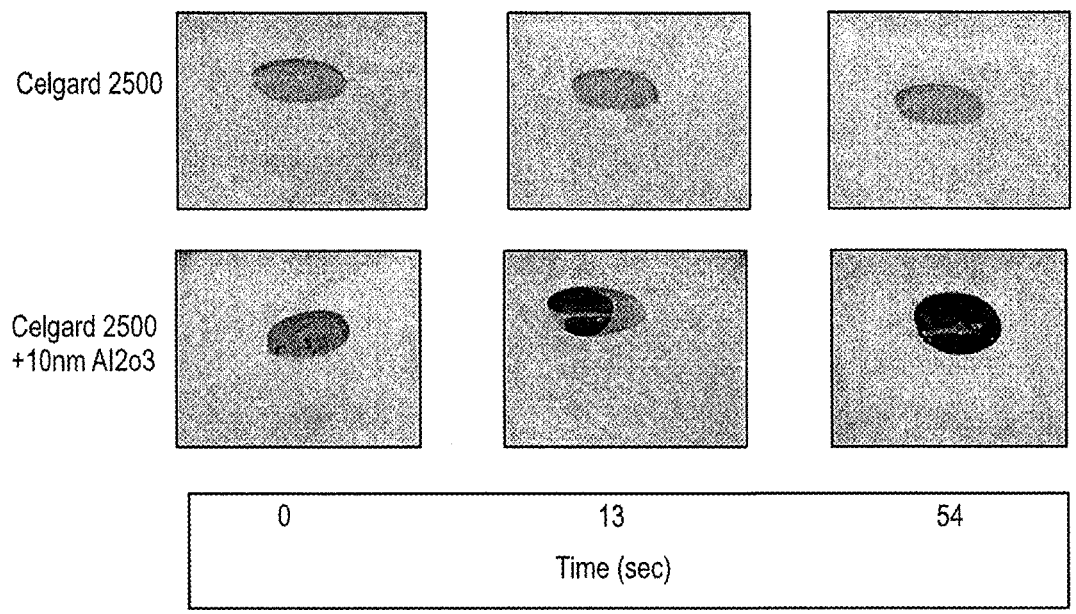
FIG. 21 includes images of Celgard 2500® microporous membrane uncoated and Celgard 2500® coated with an aluminum oxide deposition according to an embodiment described herein that demonstrate improved electrolyte wetting.
Figure 22:
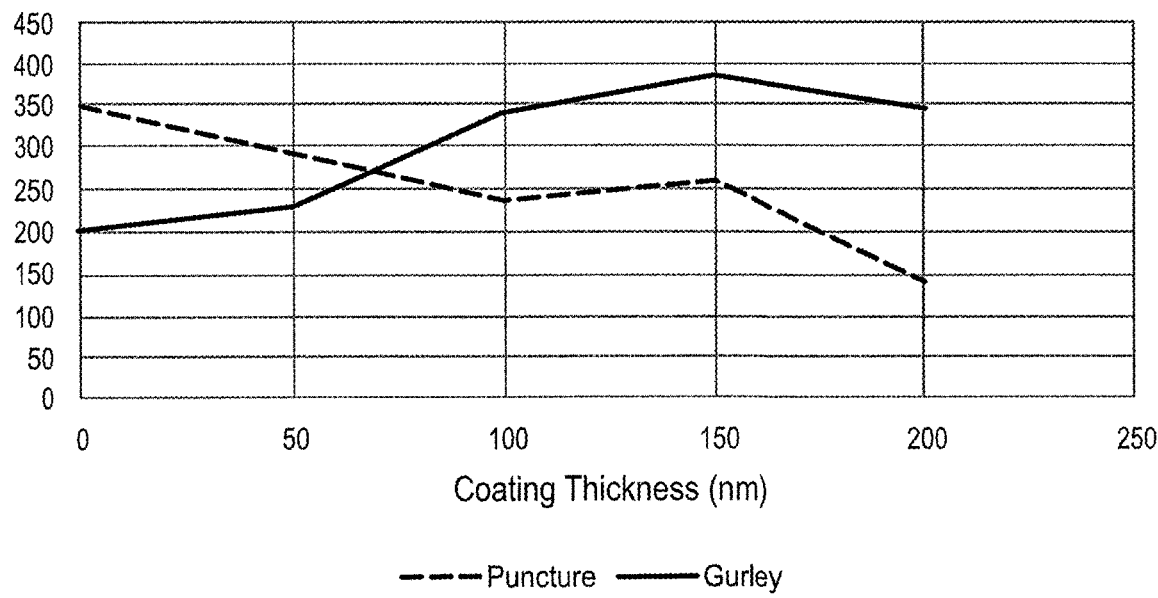
FIG. 22 includes a relationship plot showing the relationship between puncture strength, gurley, and thickness.

In various embodiments shown and described herein, the ultra-thin deposition layer may provide improved wetting. FIG. 21 illustrates the improved wettability when compared to the Celgard® 2500 base film.

In various embodiments shown and described herein, ultra-thin deposition of an organic material may be applied to a polymeric microporous membrane via a chemical vapor deposition method an atomic layer deposition method or a physical vapor deposition method.

Figure 24:
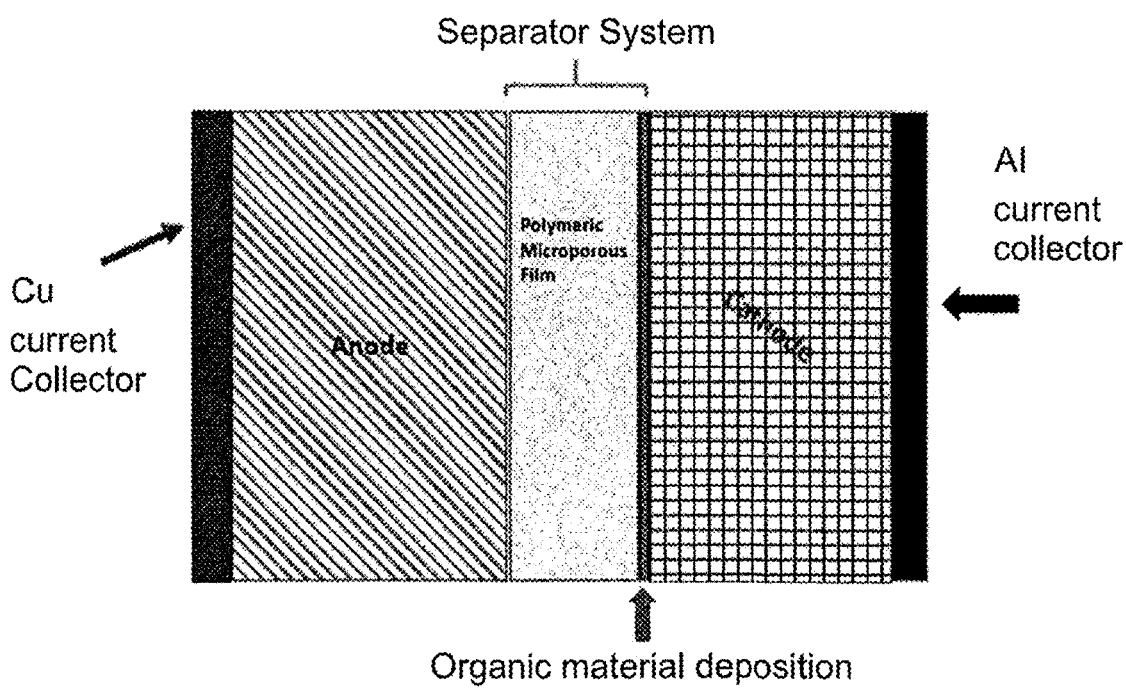
FIG. 24 includes a schematic of a battery cell comprising an anode, cathode, and a separator system where the separator system includes a polymeric microporous membrane or film with an organic material deposition on the side of the microporous membrane or film facing the cathode.
Figure 25:
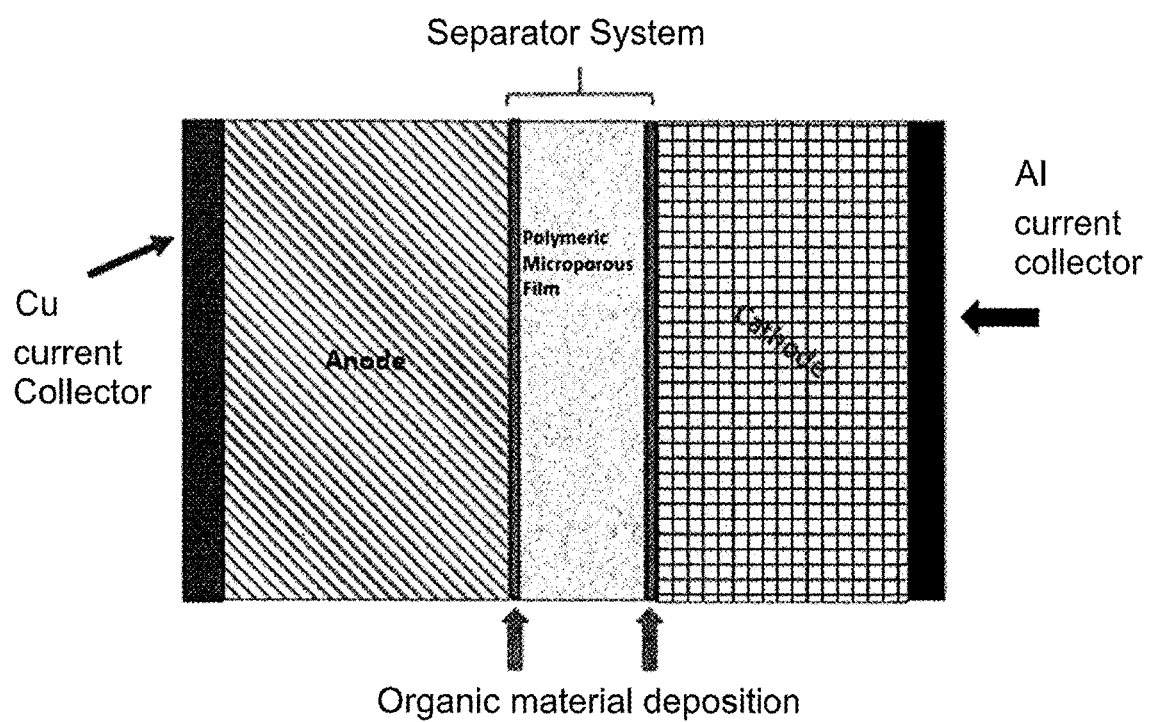
FIG. 25 includes a schematic of a battery cell comprising an anode, cathode, and a separator system where the separator system includes a polymeric microporous membrane or film with an organic material deposition on both sides of the microporous membrane or film.
Figure 26:
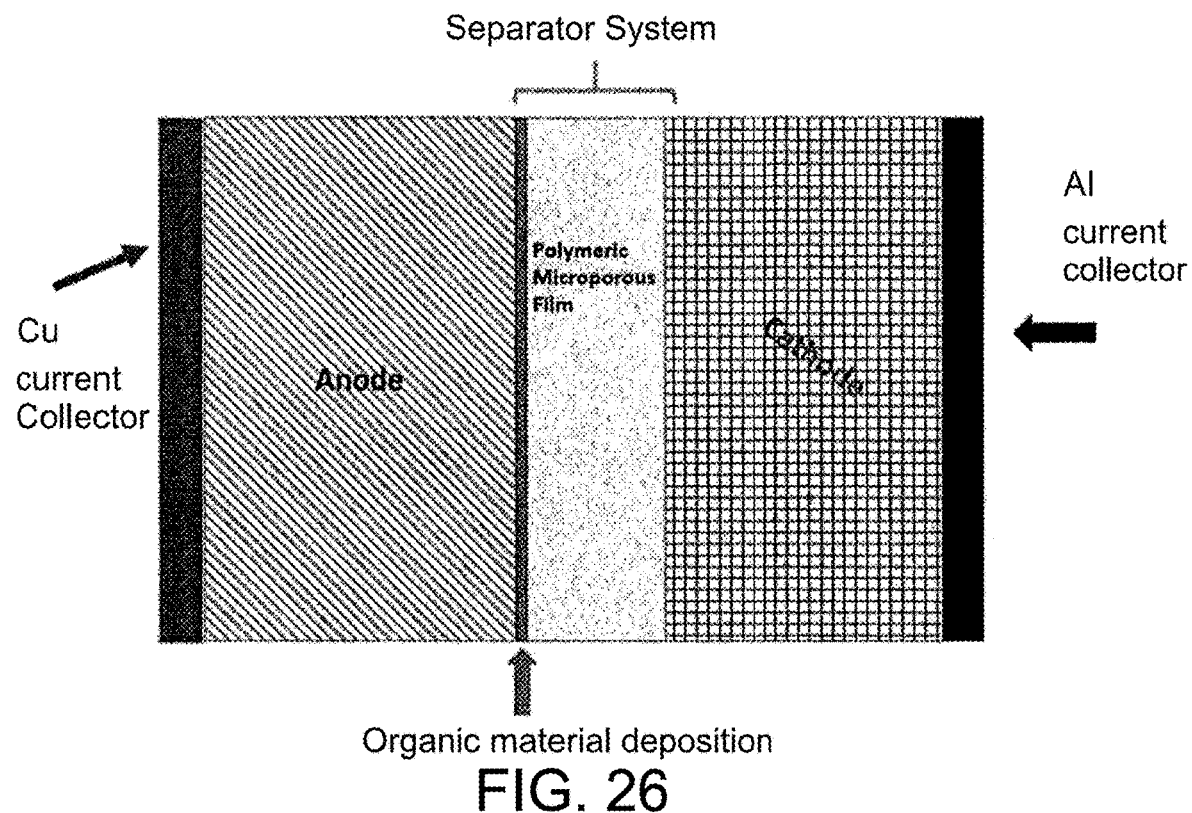
FIG. 26 includes a schematic of a battery cell comprising an anode, cathode, and a separator system where the separator system includes a polymeric microporous membrane or film with an organic material deposition on the side of the microporous membrane or film facing the anode.
Figure 27:
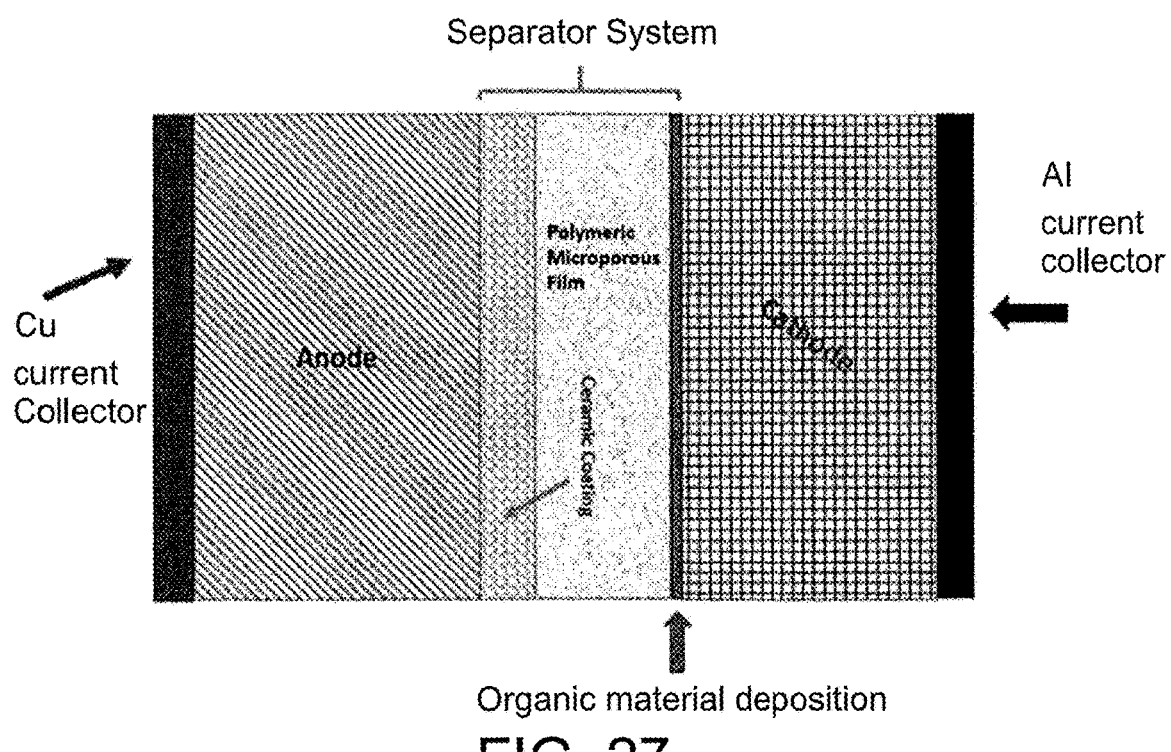
FIG. 27 includes a schematic of a battery cell comprising an anode, cathode, and a separator system where the separator system includes a polymeric microporous membrane or film with an organic material deposition on the side of the microporous membrane or film facing the cathode and a ceramic coating on the other side of the microporous membrane or film that faces the anode.
Figure 28:
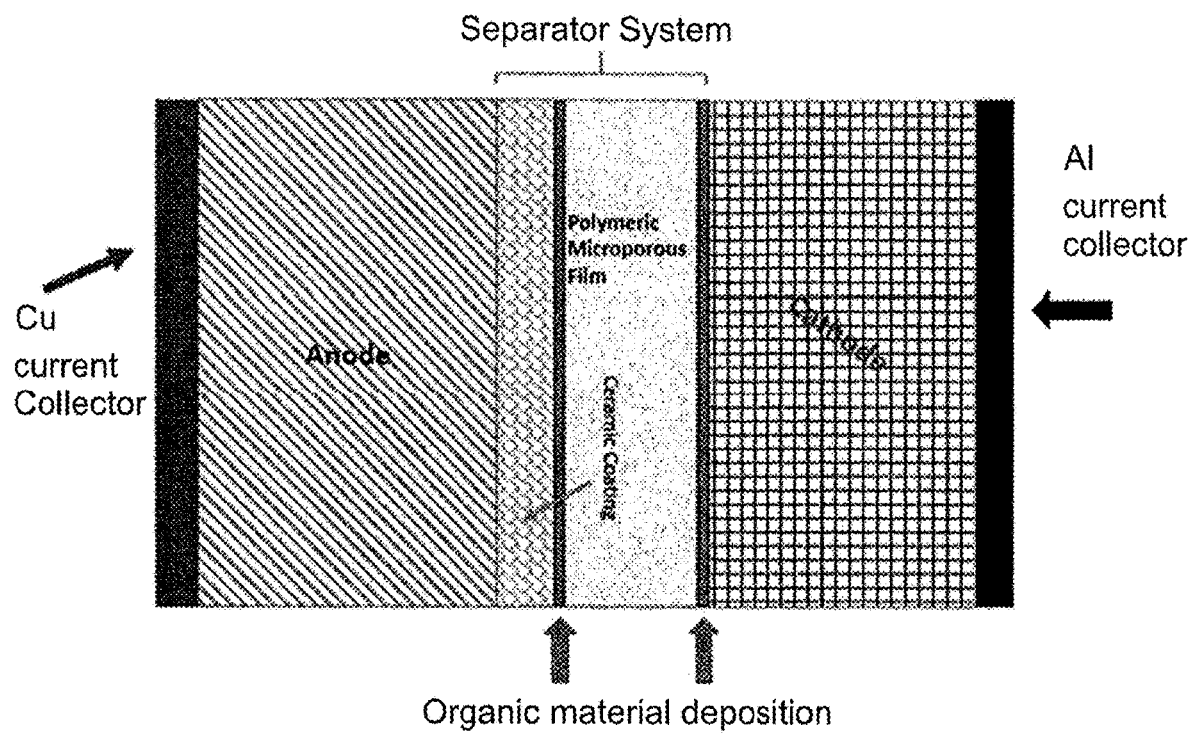
FIG. 28 includes a schematic of a battery cell comprising an anode, cathode, and a separator system where the separator system includes a polymeric microporous membrane or film with an organic material deposition on both sides of the microporous membrane or film and a ceramic coating on top of the organic material deposition layer on the side of the microporous membrane or film that faces the anode.
Figure 29:
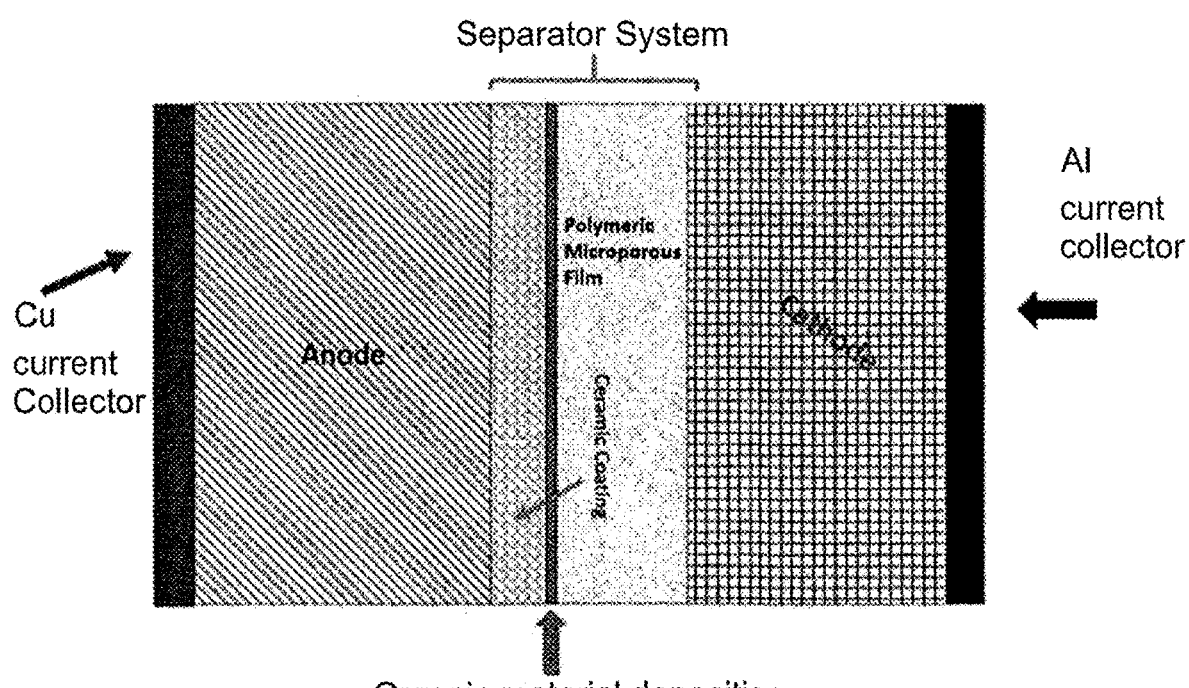
FIG. 29 includes a schematic of a battery cell comprising an anode, cathode, and a separator system where the separator system includes a polymeric microporous membrane or film with an organic material deposition on the side of the microporous membrane or film facing the anode and a ceramic coating on top of an organic material deposition layer on the side of the microporous membrane or film that faces the anode.
Figure 30:
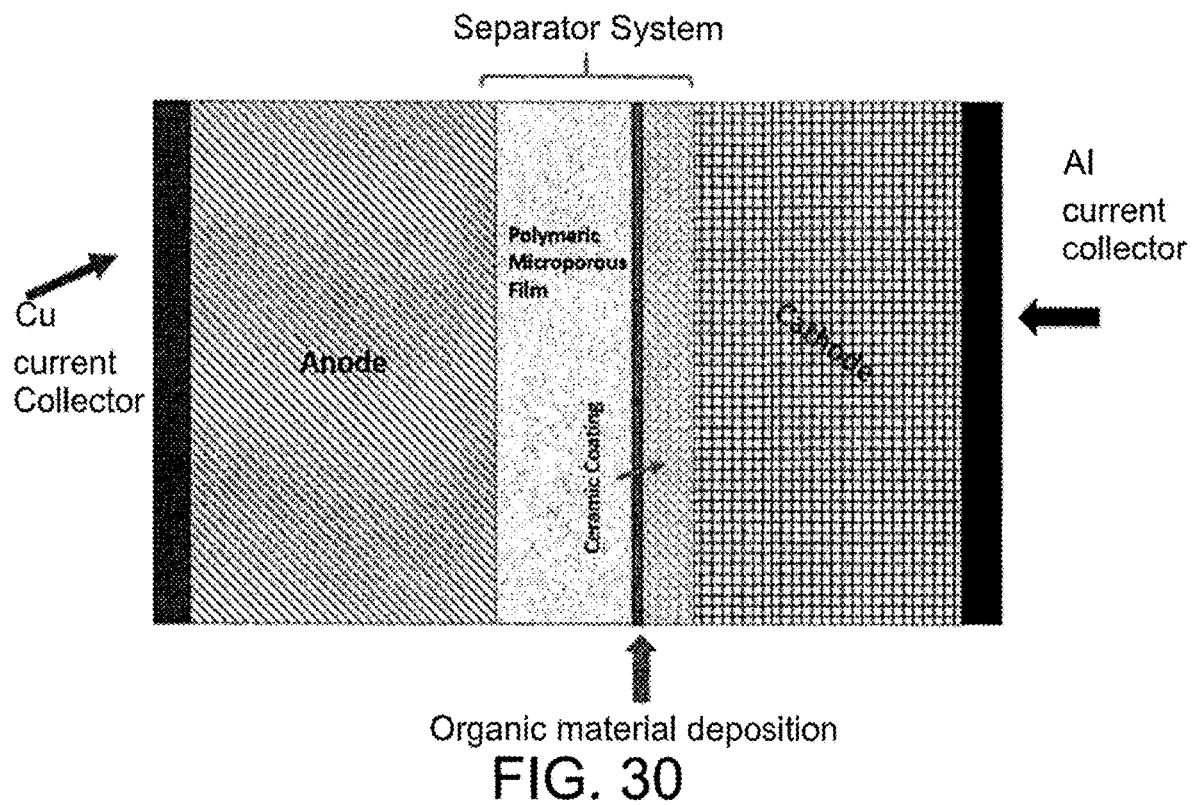
FIG. 30 includes a schematic of a battery cell comprising an anode, cathode, and a separator system where the separator system includes a polymeric microporous membrane or film with an organic material deposition on the side of the microporous membrane or film facing the cathode and a ceramic coating on top of the organic material deposition layer on the side of the microporous membrane or film that faces the cathode.
Figure 31:
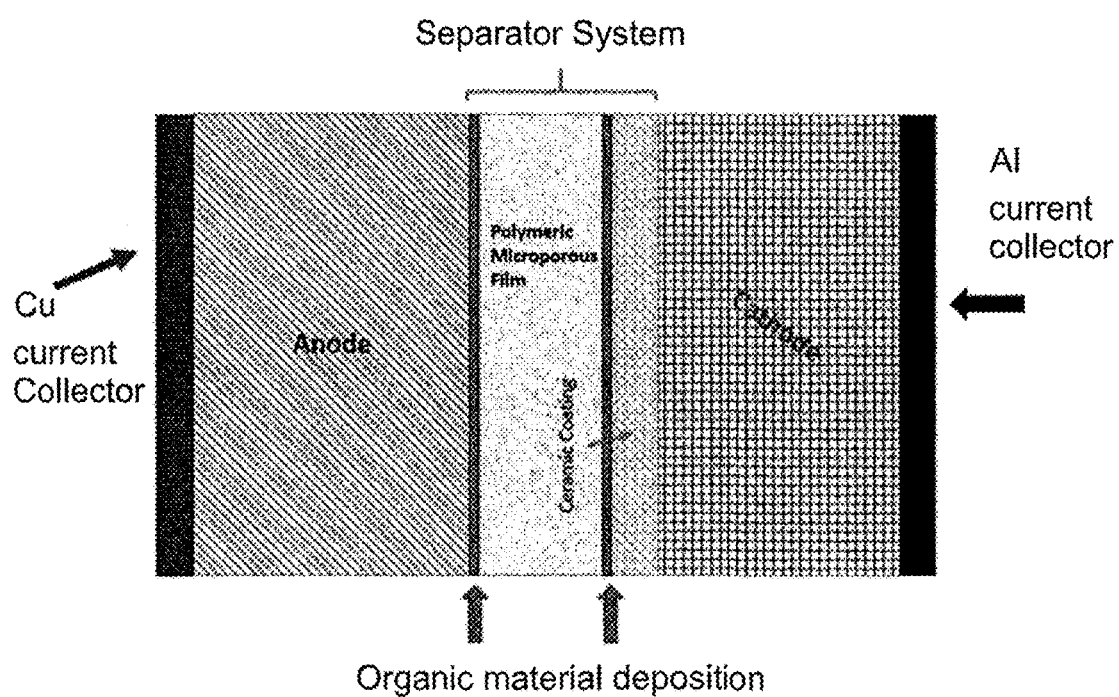
FIG. 31 includes a schematic of a battery cell comprising an anode, cathode, and a separator system where the separator system includes a polymeric microporous membrane or film with an organic material deposition on both sides of the microporous membrane or film and a ceramic coating on top of the organic material deposition layer on the side of the microporous membrane or film that faces the cathode.
Figure 32:
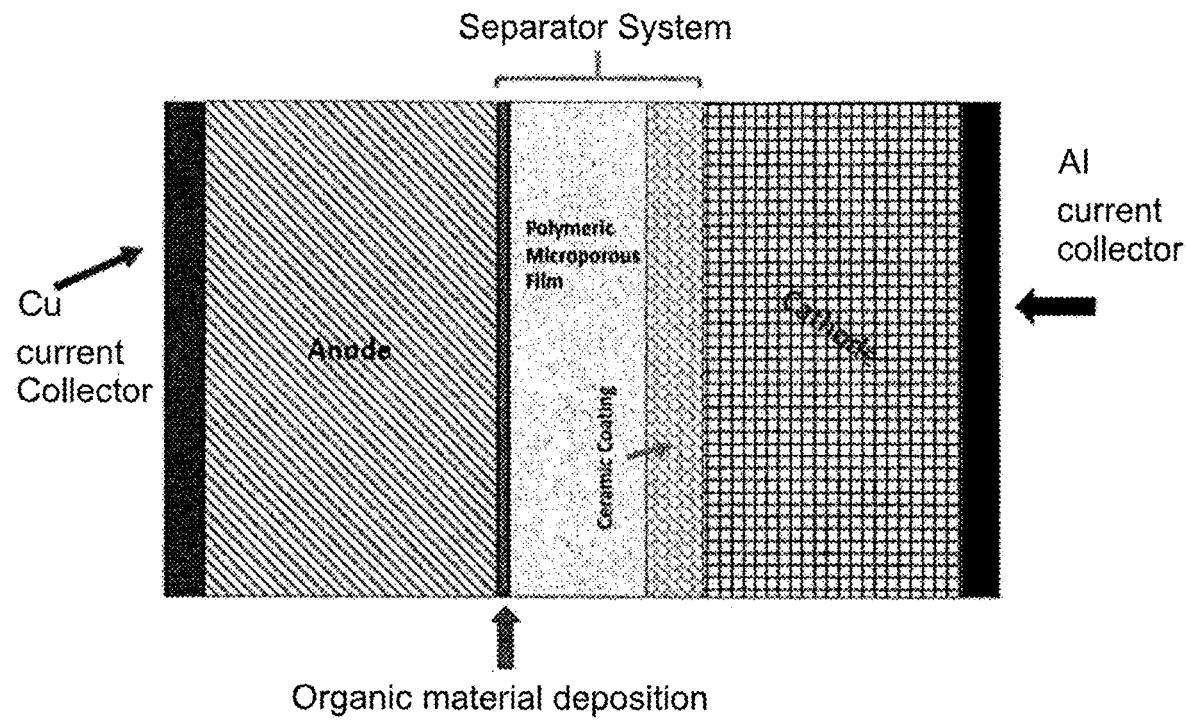
FIG. 32 includes a schematic of a battery cell comprising an anode, cathode, and a separator system where the separator system includes a polymeric microporous membrane or film with an organic material deposition on the side of the microporous membrane or film that faces the anode and a ceramic coating on the side of the microporous membrane or film that faces the cathode.
Figure 33:
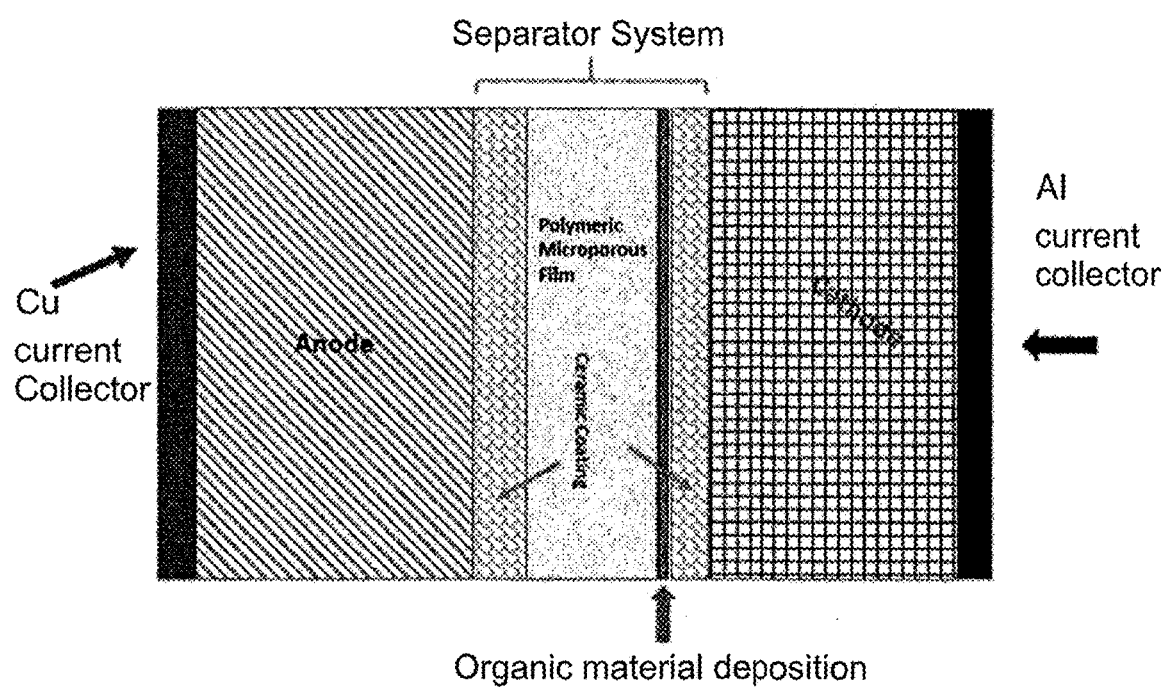
FIG. 33 includes a schematic of a battery cell comprising an anode, cathode, and a separator system where the separator system includes a polymeric microporous membrane or film with an organic material deposition on the side of the microporous membrane or film that faces the cathode and a ceramic coating on the side of the microporous membrane or film that faces the anode as well as a ceramic coating on top of the organic material deposition layer on the side of the microporous membrane or film that faces the cathode.
Figure 34:
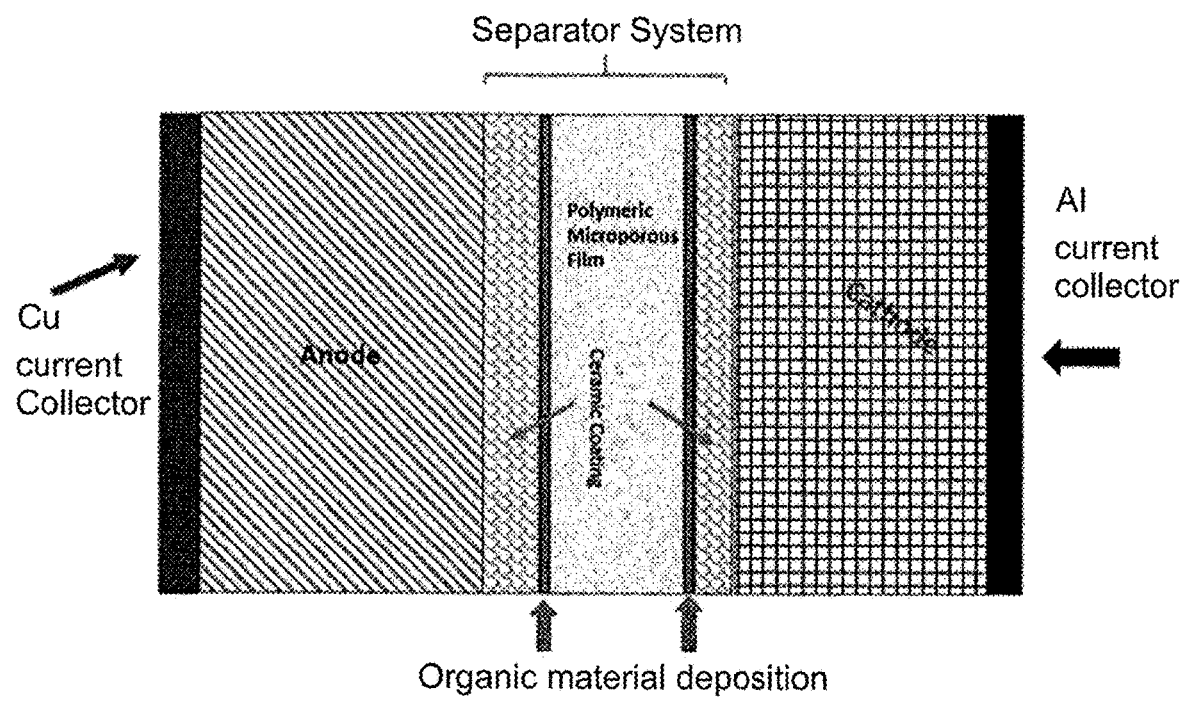
FIG. 34 includes a schematic of a battery cell comprising an anode, cathode, and a separator system where the separator system includes a polymeric microporous membrane or film with an organic material deposition on both sides of the microporous membrane or film that face the cathode and anode and a ceramic coating on top of both organic material deposition layers on both sides of the microporous membrane or film that face the cathode and anode.
Figure 35:
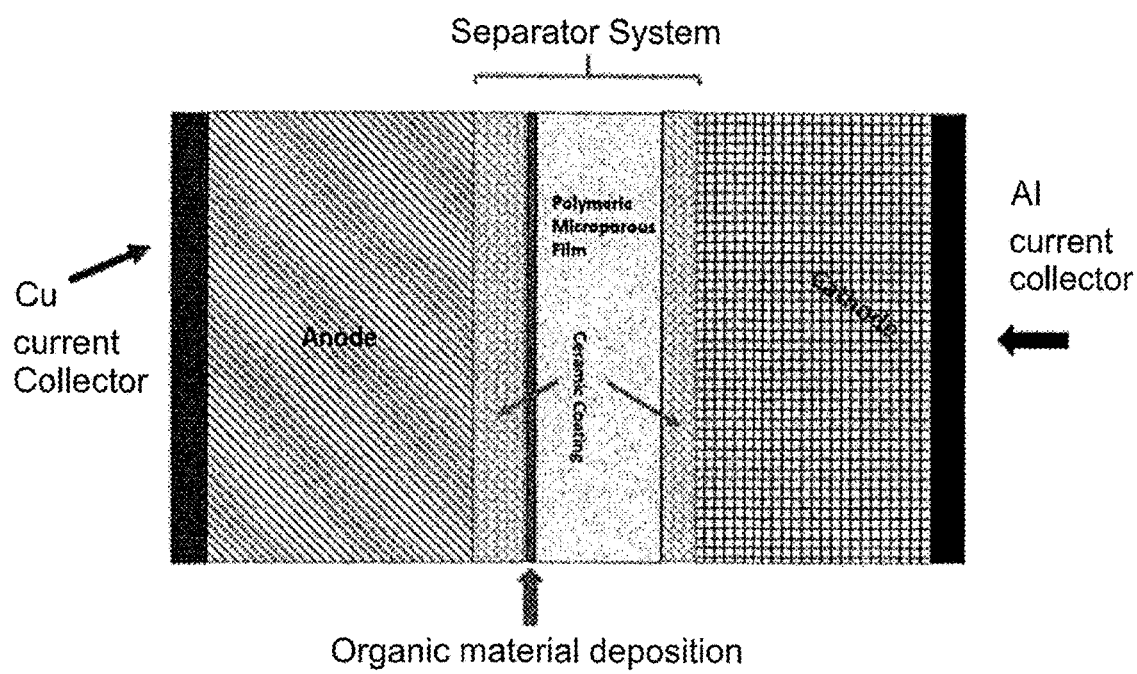
FIG. 35 includes a schematic of a battery cell comprising an anode, cathode, and a separator system where the separator system includes a polymeric microporous membrane or film with an organic material deposition on the side of the microporous membrane or film that faces the anode and a ceramic coating on top of the organic material deposition layer on the side of the microporous membrane or film that faces the anode and also a ceramic coating on the side of the microporous membrane or film that faces the cathode.

The schematic diagrams shown in FIGS. 24-35 include an organic material deposition layer or layers. Using an organic material deposition, FIG. 24 shows a schematic representation of a battery cell where a polymeric microporous membrane or film is between the cathode and anode and a thin, very thin or ultra-thin protective deposition of one or more organic material deposition layers has been applied to the side of the polymeric microporous membrane or film that is adjacent or in contact with the cathode. The application of one or more organic material deposition layers may form a polymeric microporous membrane or film which contains one or more conductive layers. An organic material deposition may be used in the inventive deposition layer(s) described herein and may be applied to one or both sides of a non-conductive polymeric microporous membrane or film using a chemical vapor deposition method, an atomic layer deposition method or physical vapor deposition method. Polymers such as, but not limited to, polyethylene (PE) may be more susceptible to oxidation in a battery than polypropylene. An organic material deposition layer applied to a PE separator membrane may protect the separator from oxidation at the cathode/separator interface.

An organic material deposition layer may be applied to both sides of a battery separator membrane a using a chemical vapor deposition method, an atomic layer deposition method or a physical vapor deposition method. An organic material deposition layer may add value to the separator in various ways. It may help dissipate energy. Additionally, it may provide an electrically conductive layer. Further, it may act to protect the membrane from undergoing oxidation which might limit the safety performance of a polymeric microporous membrane in a battery and/or might have an adverse effect on the lifetime of a battery. Oxidation processes may be more of a concern at the cathode/separator interface; additionally, oxidation processes may be more of a concern for certain types of membranes due to the susceptibility of a polymeric microporous membrane, for example, but not limited to, a polyethylene, to oxidation. Application of an organic material deposition layer on the side of a polymeric microporous membrane that is in contact with a cathode in a lithium ion battery may protect the polymeric microporous membrane from undergoing oxidation, may promote adhesion of a coating, may provide a sticky separator, may provide a non-sticky separator, may provide a stronger puncture resistant separator, and/or the like.

In some of the embodiments described herein, a ceramic coating may be applied to the inventive separators, and such a ceramic coating may include a polymer or combination of polymers as well as particles, for example, metal oxide ceramic compound, such as aluminum oxide ($Al_2O_3$). Such a ceramic coating can be applied as a coating on top of the thin, very thin or ultra-thin organic material deposition layer in order to further improve various characteristics of the separator membrane, such as the thermal stability of the separator membrane at high temperature. FIGS. 28, 29, 30, 31, 33, 34 and 35 depict various embodiments of the present invention in which a ceramic coating, for example, an aluminum oxide ($Al_2O_3$)-containing ceramic coating is applied on top of the vapor-deposited ultra-thin organic material deposition layer. Furthermore, FIGS. 27, 32, 33, and 35 depict various embodiments of the present invention in which a ceramic coating, for example, an aluminum oxide-containing ceramic coating, is applied on one side of the polymeric microporous membrane or film. The additional ceramic coating may be applied using various coating methods, such as dip, gravure, knife etc. coating methods, as a thicker layer with a thickness in a range of 1 to 10, in some cases, 2 to 10 µm in order to further improve the thermal stability of the separator membrane at higher temperatures, for example, temperatures up to or above 180° C.

In various embodiments shown and described herein, a deposition layer of organic material, by way of example only, a CVD-applied organic material, may be electrically conductive and may provide uniform current distribution in a lateral direction across a battery separator membrane which may be an effective method to dissipate current distribution into a larger area in the event of a thermal runaway event or a potential or possible thermal runaway event in a battery.

One conductive material that may be used for the conductive layer is stainless steel. Any stainless steel may be used. Stainless steels include: austenitic stainless steels (200 and 300 series), ferritic stainless steels, martensitic stainless steels, and duplex stainless steels The stainless steels may include super-ferritic stainless steel and super-austenitic stainless steels. In one embodiment, the stainless steel may be a super-ferritic stainless steel. Super-ferritic stainless steels are characterized as iron (Fe) alloys containing more than 25 wt. % chromium (Cr) and less than 0.05 wt. % carbon (C). Examples of super-ferritic stainless steels include: SHOMAC® 302 (30 wt. %—Cr; 2 wt. %—Mo (molybdenum) and SHOMAC® R261 (26 wt. %—Cr; 1.3 wt. % Mo) from Nippon Koshuha Steel Co., Ltd of Tokyo, Japan. In another embodiment, the stainless steel may be a super-austenitic stainless steel. Super-austenitic stainless steels are generally characterized as iron (Fe) alloys containing more than 20 wt. % nickel (Ni). Examples of super-austenitic stainless steels include: AL-6XN (20.5-21.8 wt. % Cr; 24.0-25.3 wt. % Ni; 6.2-6.7 wt. % Mo; 0.40-0.30 wt. % Mn, 0.40-0.35 wt. % Si) and 254SMO (19.5-20.5 wt. % Cr; 17.5-18.5 wt. % Ni; 6.0-6.5 wt. % Mo; 1.0 max. wt. % Mn, 0.80 max. wt. % Si) from ATI of Pittsburgh, Pa.

Figure 36:
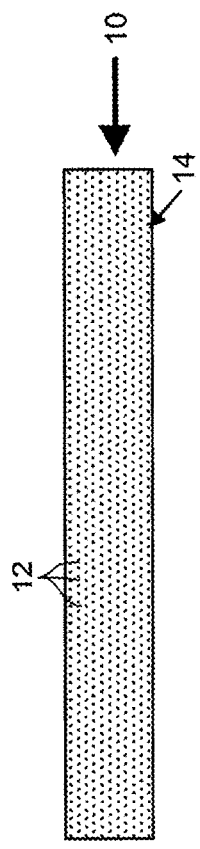
FIG. 36 is a schematic illustrating a conductive material 12 is distributed in a thermoplastic resin 14 to form the conductive layer 10.
Figure 37:
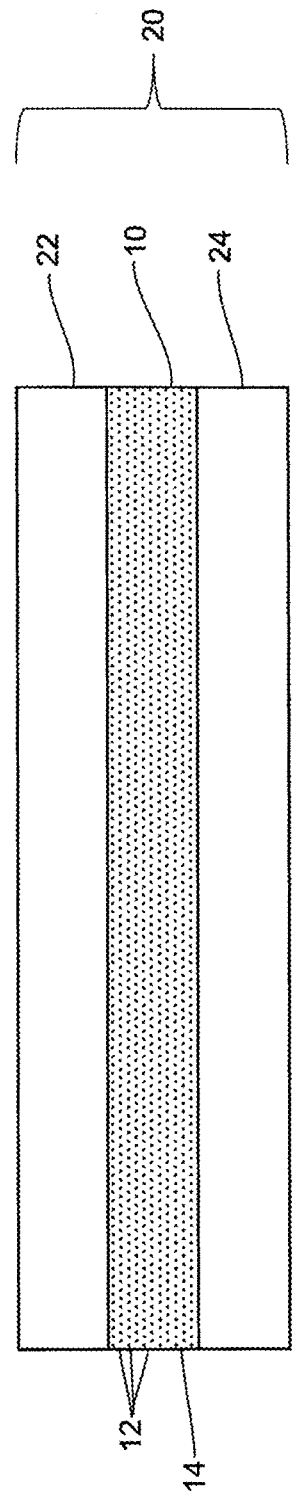
FIG. 37 is a schematic illustrating a conductive layer 10 is sandwiched between microporous layers 22 and 24 to form a multilayered membrane (or battery separator) 20.
Figure 38:
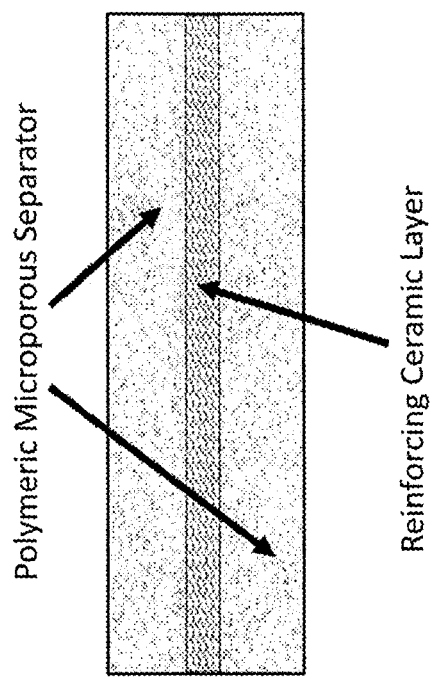
FIG. 38 is a schematic drawing of a cross-sectional view of a reinforced separator.
Figures 39, 40:
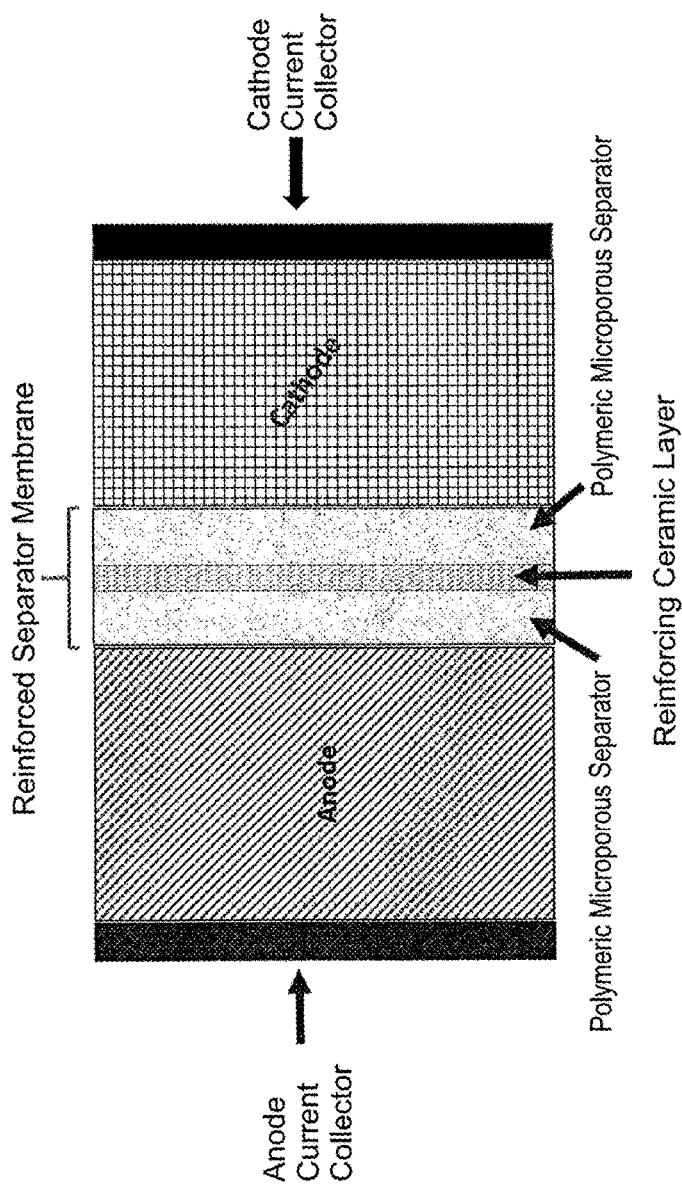
FIG. 39 is a sectional view of a lithium ion battery with the reinforced separator.
FIG. 40 includes an image of a 35 µm Celgard 2500 separator bilayer with a conductive aluminum layer.

The conductive materials may be in any form. Such forms include particles, fibers and foils (e.g., porous foils). These materials may be embedded into one or more thermoplastic layers. In one embodiment, the conductive layer may be a thermoplastic resin layer with the conductive materials disbursed there through (thermoplastic resins are discussed in greater detail below). In one embodiment, the conductive material may be disbursed in a polyethylene or polyethylene containing resin (hereinafter both are referred to as polyethylene-based). When the conductive material is incorporated into the thermoplastic resin layer, it should be of a sufficient density to ensure good conductivity. The conductive material may range from 0.1-99.9 wt. % of the conductive layer. The conductive material may range from 2-50 wt. %. The conductive material may range from 3-30 wt. %. The conductive material may range from 3-25 wt. %. In another embodiment, when the conductive material is a foil, it may be inserted into the separator (encapsulated in the thermoplastic resin or between resin layers). In one embodiment, for example, see FIGS. 36 and 37, the conductive material 12 is distributed in a thermoplastic resin 14 to form the conductive layer 10.

The conductive layer may be incorporated into a microporous membrane. The microporous membrane is a thermoplastic membrane film. The thermoplastic resins include, but are not limited to, polyvinyl chlorides, nylons, fluorocarbons, polyolefins, and polyesters. Polyolefins include, but are not limited to, polyethylenes, polypropylenes, polybutylenes, and polymethyl pentenes. Most preferably, the polyolefin is polyethylene or copolymers of polyethylene (including ultrahigh molecular weight polyethylene). In another embodiment, for example see FIG. 37, conductive layer 10 is sandwiched between microporous layers 22 and 24 to form a multilayered membrane (or battery separator) 20.

EXAMPLES

Example 1

Preparation of a Celgard® 2500 Microporous Separator Membrane with 50 Angstroms Thick Aluminum Deposition Layer Using Physical Vapor Deposition (PVD) Method A running length of Celgard® 2500, a 25 micron thick microporous polypropylene membrane (commercially available from Celgard, LLC), was passed through a vacuum metallizer to deposit aluminum metal on one surface of the microporous separator membrane at a thickness of about 50 angstroms. The aluminum layer was applied to the Celgard® 2500 microporous membrane at a web speed of 800 meter/minute. A high vacuum was maintained, and the aluminum in the chamber was heated by induction to a point at which a steady rate of evaporation of the aluminum was maintained.

Example 2

Preparation of a Celgard® 2500 Microporous Separator Membrane with 200 Angstroms Thick Aluminum Deposition Layer Using Physical Vapor Deposition (PVD) Method A running length of Celgard® 2500, a 25 micron thick microporous polypropylene membrane (commercially available from Celgard, LLC), was passed through a vacuum metallizer to deposit aluminum metal on one surface of the microporous separator membrane at a thickness of about 200 angstroms. The aluminum layer was applied to the Celgard® 2500 microporous membrane at a web speed of 800 meter/minute. A high vacuum was maintained, and the aluminum in the chamber was heated by induction to a point at which a steady rate of evaporation of the aluminum was maintained.

Example 3

Preparation of a Celgard® 2500 Microporous Separator Membrane with 100 Angstroms Thick Aluminum Oxide Deposition Layer Using Physical Vapor Deposition (PVD) Method A running length of Celgard® 2500, a 25 micron thick microporous polypropylene membrane (commercially available from Celgard, LLC), was passed through a vacuum metallizer to deposit aluminum oxide on one surface of the microporous separator membrane at a thickness of about 100 angstroms. The aluminum oxide layer was applied to the Celgard® 2500 microporous membrane at a web speed of 800 meter/minute. A high vacuum was maintained, and the aluminum oxide in the chamber was heated by induction to a point at which a steady rate of evaporation of the aluminum was maintained.

Example 4

Preparation of a Celgard® 2340 Microporous Separator Membrane with 200 Angstroms Thick Aluminum Deposition Layer Using Physical Vapor Deposition (PVD) Method A running length of Celgard® 2340, a 38 micron thick microporous trilayer (PP/PE/PP) membrane (commercially available from Celgard, LLC) was passed through a vacuum metallizer to deposit aluminum metal on one surface of the Celgard® 2340 microporous membrane at a thickness of about 200 angstroms. Line speed was set to 200 meter/minute. A high vacuum was maintained, and the aluminum in the chamber was heated by induction to a point at which a steady rate of evaporation of the aluminum was maintained.

Example 5

Preparation of a Celgard® 2500 Microporous Separator Membrane with 100 Nm Thick Aluminum Oxide ($Al_2O_3$) Deposition Layer Using Atomic Layer Deposition (ALD) Method An $Al_2O_3$ deposition was deposited onto Celgard® 2500 membrane using atomic layer deposition (ALD). Trimethylaluminum was used as the precursor for aluminum and ozone ($O_3$) as the oxidant. Celgard® 2500 microporous membrane substrate temperature during deposition was 150° C. In the ALD process, the Celgard® 2500 microporous membrane substrate was placed in a vacuum chamber equipped with a mechanical pump. The chamber was evacuated. The trimethylaluminum precursor was admitted to the chamber at a pressure of 500 millitorr for approximately 2 seconds. The chamber was then purged with argon for approximately 2 seconds. The oxidant, ozone, was then admitted to the chamber at approximately 500 millitorr for approximately 2 seconds. Finally, the oxidant was purged with argon for approximately 2 seconds. This deposition process was repeated approximately 50 times to obtain a deposition of approximately 100 nanometers (equal to about 1,000 angstroms) of $Al_2O_3$ in thickness.

Example 6

Preparation of Celgard® 2500 Microporous Separator Membrane with an Aluminum Deposition on One Side Using Physical Vapor Deposition (PVD) Method and Coated on the Other Side with a Ceramic Coating Process Celgard® 2500 microporous membrane was treated with aluminum deposition using PVD on one side as described in Example 1. The untreated side of the Celgard® 2500 microporous membrane was coated with a ceramic coating comprising a mixture of ceramic particles and an aqueous polymeric binder of a copolymer of an acrylate, acrylamide and acrylonitrile. The ceramic coating was gravure-coated onto the untreated side of the Celgard® 2500 membrane with a total coating thickness of 4 μm. The final separator membrane thickness was 29 μm.

Example 7

Preparation of Celgard® 2500 Microporous Separator Membrane with an Aluminum Deposition Using PVD on One Side Followed by a Coating on Both Sides with a Ceramic Coating Process Celgard® 2500 microporous membrane was treated with aluminum deposition using PVD on one side as described in Example 1. In an additional step using a gravure coating process, both sides of the aluminum deposition layer-treated Celgard® 2500 membrane described in Example 1 were coated, and the ceramic coating included a mixture of ceramic particles and an aqueous polymeric binder of a copolymer of an acrylate, acrylamide and acrylonitrile. The aqueous polymeric binder-ceramic coating was applied by first casting the mixture followed by drying in a heated chamber. The total coating thickness was 8 μm (4 μm on each side). The final membrane thickness was 33 μm.

Example 8

Preparation of a Celgard® EK1246 Microporous Separator Membrane with 50 Angstroms Thick Aluminum Deposition Layer Using Physical Vapor Deposition (PVD) Process A running length of Celgard® EK1246, a 12 micron thick microporous polyethylene membrane (commercially available from Celgard, LLC), was passed through a vacuum metallizer to deposit aluminum metal on one surface of the microporous membrane at a thickness of about 50 angstroms. The Celgard® EK1246 microporous membrane was PVD-treated at a web speed of 500 meter/minute. A high vacuum was maintained, and the aluminum in the chamber was heated by induction to a point at which a steady rate of evaporation of the aluminum was maintained.

Cell Construction and Testing.

The electrochemical cycling and trickle charge test takes place in full-cell arrangements. In the full-cell arrangement, the separators of the present invention are measured in a sandwich arrangement of working cathode/metal and/or metal oxide inventive deposition layer/separator membrane (with or without ceramic coating)/working anode. The working cathode (positive electrode) used is an electrode having an electrode material comprising 90% by weight of commercially available $LiCoO_2$ powder from Aldrich (99.8% purity) and 5% by weight of polyvinylidene fluoride (PVdF) binder and 5% by weight Super-P graphite from TIMCAL, SA, Switzerland. The working anode (negative electrode) used is an electrode having an electrode material comprising 90% by weight of commercially available OMAC-R powder from Osaka Gas Chemicals, Osaka, Japan and 8% by weight of polyvinylidene fluoride (PVdF) binder and 8% by weight Super-P graphite from TIMCAL, SA, Switzerland.

The fabricated working electrodes were cut into 15 cm² pieces, and pouch cells were fabricated using laminated pouch cell plastic packing film. Commercial electrolytes such as 1M $LiPF_6$ in EC/DEC/DMC (1:1:1) and a high voltage electrolyte were used to produce the fuel cells. Cells were then constructed using graphite as anode and Li cobalt oxide as cathode, with the separators of the present invention used as separators. The separator separates the electrodes from each other mechanically. After the cell was constructed it was filled with the electrolyte. The cycling rate is reported in terms of C-rate to charge or discharge the fabricated cells to 4.55V and 3V. Charging and discharging can be effected with a current reduction on reaching the voltage limit to below a value which corresponds to C/20. The cells were then charged (formed) and discharged in the first two cycles over 20 hours and thereafter trickle charged to 4.85V. Trickle charging is a process of continuously feeding the cell with a small current in order to keep the cell voltage at a targeted voltage all the time. When electrochemical oxidation occurs inside a cell, especially on the surface of the separator, a resistant interface may be generated and the interface will cause the feeding current to rise.

Figure 19:
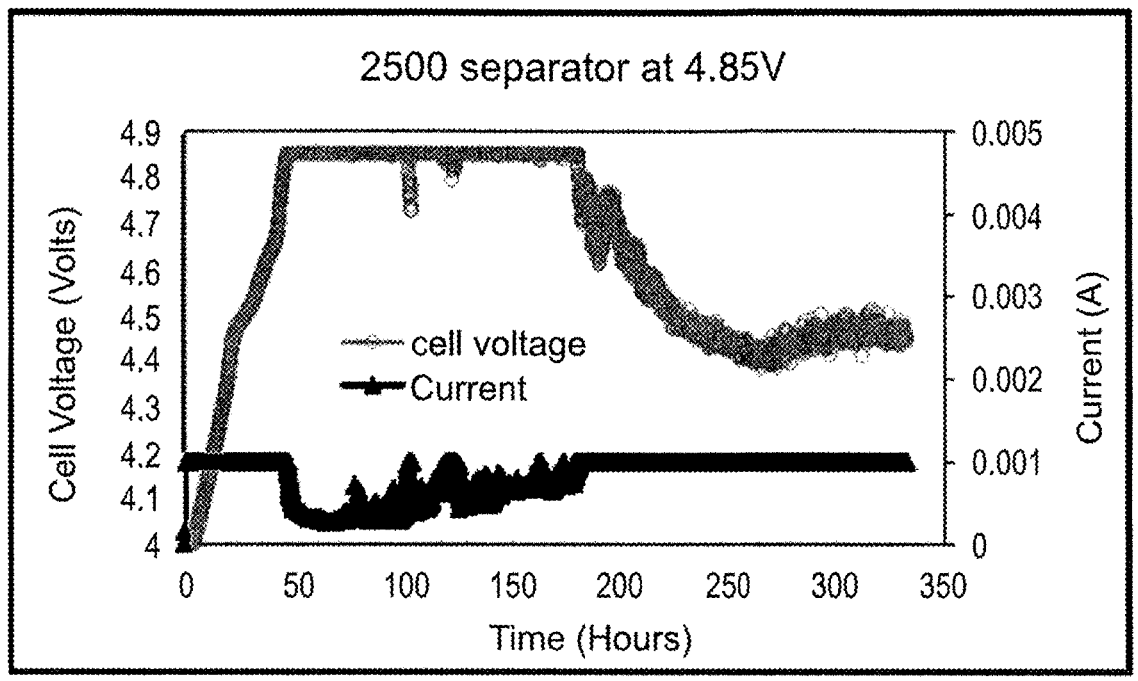
FIG. 19 includes a trickle charge plot at 4.85 volts for Celgard® 2500 microporous membrane.
Figure 20:
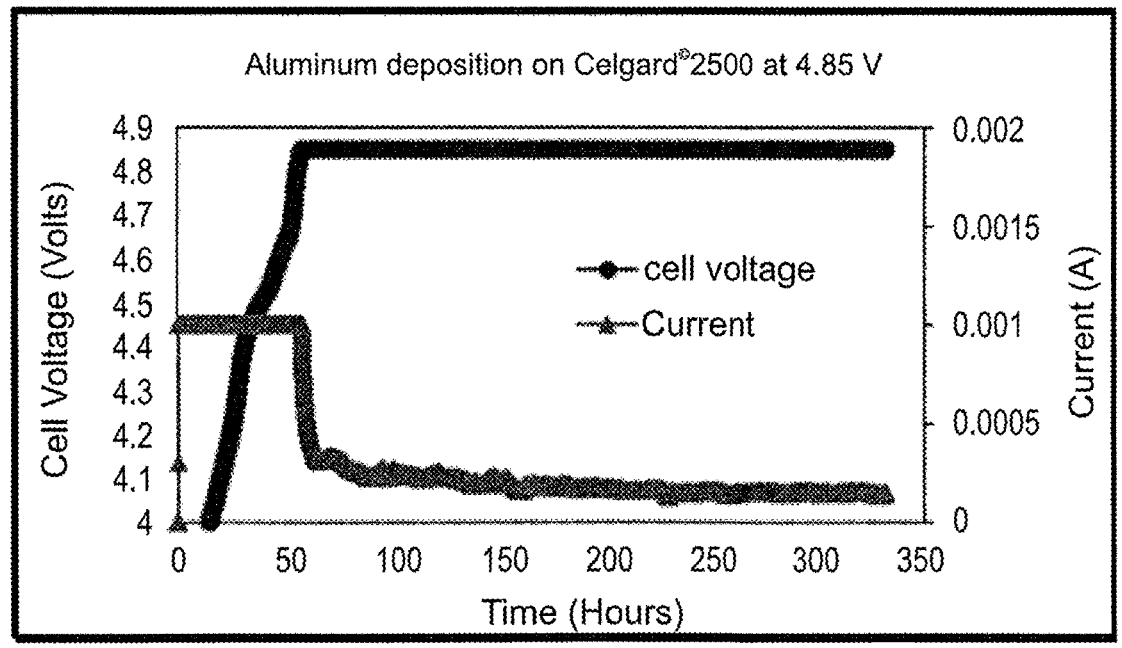
FIG. 20 includes a trickle charge plot at 4.85 volts for Celgard® 2500 microporous membrane with an aluminum deposition according to an embodiment described herein.

The trickle charge test results for an untreated Celgard® 2500 microporous membrane as well as a Celgard® 2500 microporous membrane with an aluminum deposition layer formed using PVD from Example 1, are shown in FIGS. 19 and 20, respectively. The untreated Celgard® 2500 microporous membrane started to fail after 20 hours of trickle charging at 4.85V. The Celgard® 2500 membrane with the aluminum deposition layer, on the other hand, remained intact after 100 hours. With electrodes and electrolytes being identical for these cells, the only difference between these cells is the aluminum deposition layer. After being passivated by the LiPF$_6$ electrolyte, the aluminum deposition layer is protecting the Celgard® 2500 microporous membrane surface from being electrochemically oxidized by high-valence, oxidizing cobalt compound or other oxidizing species in the vicinity of cathode. Table 2 shows trickle charge test results for uncoated and PVD coated membranes; uncoated wet PE microporous membrane, a Celgard® 2500 microporous membrane, a Celgard® 2500 microporous membrane with an aluminum deposition layer (Examples 1 and 2), and a Celgard® 2500 microporous membrane with an aluminum oxide deposition layer (Example 3). Only the Celgard® 2500 microporous membranes with the inventive aluminum deposition layer described herein survived at a high voltage of 4.85V for over 100 hours.

TABLE 2

Trickle charging test in coin cells.

| FILM | Deposition thickness, Å | 4.35 V | 4.45 V | 4.55 V | 4.65 V | 4.75 V | 4.85 V |
|---|---|---|---|---|---|---|---|
| Wet process polyethylene | 0 | Fail | | | | | |
| Celgard ®2500 | 0 | | Pass | Pass | Pass | Pass | Fail |
| Example 1. Al on Celgard ®2500 | 50 Å | | Pass | Pass | Pass | Pass | Pass |
| Example 2. Al on Celgard ®2500 | 200 Å | | Pass | Pass | Pass | Pass | Pass |
| Example 3. Al$_2$O$_3$ on Celgard ®2500 | 100 Å | | Pass | Pass | Pass | pending | pending |

Table 3 shows trickle charge test results for separators of a wet process PE separator and a dry process trilayer PP/PE/PP separator Celgard® EH2013 treated with a deposition layer as described in this invention, tested using the same electrode materials and electrolytes as above, except the cells were fabricated into CR2025 coin cells. The components were combined into a layered structure of cathode/separator/anode with the liquid electrolyte filling the void areas of the separator and cathode to form disc-shaped CR2025 coin cells of 2 cm in diameter. Discharge-charge cycling on these cells was done at C/20 for the first two cycles and then trickle charged at 45° C. at various voltages as summarized in Table 3. The average capacity for the coin cells was about 2 milli-ampere-hour (mAh). In the coin cell format, the separator with an inert metal deposition layer showed excellent performance. That separator included a 50 angstrom thick deposition layer of Au applied by PVD, which protects the separator. For comparison, another separator was tested that included a 4 μm thick ceramic coating.

TABLE 3

| FILM | 4.35 V | 4.45 V | 4.55 V | 4.65 V |
|---|---|---|---|---|
| Wet process PE separator | Fail | | | |
| EH2013 | | Pass | Fail | |
| 2500 | | Pass | Pass | Fail |
| Al coated on 2500 | | Pass | Pass | Fail |
| Au coated on EH2013 | | | | Pass |
| Ceramic Coated on PE0940 | | | Pass | Pass |

Determination of Gurley Number

The separators described in Example 1, Example 2, and Example 3 were tested for air permeability (ASTM Gurley number). Gurley number was measured by using a Gurley densometer (Model 4120), ASTM-D726 (B)-Gurley. The Gurley number was determined by determining the time t which a gas volume of 100 ml takes to pass through a 6.45 cm$^2$ area under a 31 cm hydrohead gas pressure. The time t is the Gurley number. The Gurley number for the above samples was found to be below 300 seconds.

Example A

Deposition of Fluorocarbon Polymer Film on Celgard® 2500 Membrane

A fluorocarbon polymer thin film is produced on Celgard® 2500 separator by flowing about 25 sccm of undiluted Hexafluoropropylene oxide (HFPO) of 99% purity, into a parallel plate vacuum deposition chamber. The volume between the upper powered electrode and the lower grounded electrode is about 261 cm$^3$. The reactor is pumped to a pressure of about 1 Torr, and the lower grounded electrode is cooled to maintain it at a temperature of about 295K by way of backside water cooling. An aluminum holding plate is employed on the grounded electrode to support several sheets of Celgard® 2500 membrane of about 25 μm in thickness. Films are deposited on the 2500 membrane by exciting the HFPO feed gas by application of a pulsed plasma excitation. The RF power density is about 3 W/cm$^2$ and the rf frequency is about 14 MHz. The pulsed plasma excitation duty cycle includes a plasma excitation on-time of about 10 ms and a plasma excitation off-time of about 400 ms. A power density of about 0.5 W/cm$^2$ is employed for the continuous plasma process because it is known that at higher power densities, etching, rather than deposition, occurs.

Example B

Deposition of PEDOT Film on Celgard® 2500 Membrane

Deposition of poly(ethylenedioxythiophene) (PEDOT) on Celgard® 2500 is carried out in a CVD vacuum chamber. Polyester film-supported Celgard® 2500 membrane is used for substrates. The membrane substrate is fixed on a stage that is regulated with cooling water and is kept at 34° C. The chamber pressure is maintained at approximately 300 mTorr. An oxidant, Fe(III)Cl$_3$ (97%, Aldrich) is loaded in a porous crucible with a nominal pore size of 7 μm and positioned above the stage. The crucible is heated to a temperature of about 240° C. where sublimation of the oxidant begins to occur. Argon flow at a rate of 2 sccm is delivered into the crucible as a carrier gas for the Fe(III)Cl$_3$ vapors. The crucible temperature is reduced to end sublimation once a yellow film of Fe(III)Cl$_3$ is observed on the membrane substrate. After being heated to 100° C., EDOT monomer (3,4-ethylenedioxythiophene, Aldrich) is then introduced into the reactor through heated lines and using a mass flow controller set at 95° C. The EDOT flow rate is about 10 sccm. A deposition time of 30 minutes is used for all of the films. After deposition, the films are dried for at least 2 hours in a vacuum oven heated to 80° C. at a gauge pressure of −15 inch Hg.

Example C

Deposition of Polypyrrole Film on Celgard® 2500 Membrane

Celgard® 2500 membrane is first loaded with an oxidant $Cu(ClO_4)_2 \cdot 6H_2O$ by spin-coating a 3% by weight solution in a mixture of 6:2:2 methyl alcohol, 2-buthyl alcohol and ethyl cellosolve solvents. The mixture-treated Celgard® 2500 is dried at 60° C. The membrane substrate loaded with $Cu(ClO_4)_2$ is reacted in a CVD chamber designed for generating pyrrole monomer of a saturated state for about 20-30 seconds, and then cleaned with methanol solvent to remove non-reacted materials. The resulting about 1-micron thick, conductive polypyrrole film is transparent brown in color and is about 75% in permeability and about 100 $\Omega/cm^2$ in surface resistance.

Test Methods

Thickness

Thickness is measured using the Emveco Microgage 210-A precision micrometer thickness tester according to test procedure ASTM D374. Thickness values are reported in units of micrometers, µm.

Gurley

Gurley number was measured by using a Gurley densometer (Model 4120), ASTM-D726 (B)-Gurley. The Gurley number was determined by determining the time t which a gas volume of 100 ml takes to pass through a 6.45 cm² area under a 31 cm hydrohead gas pressure. The time t is the Gurley number.

Karl Fisher Titration

The water content of the samples were measured via Karl Fisher titration apparatus equipped with accompanying dry oven accessory unit. The testing temperature was held constant at 150° C. in a dry nitrogen purge atmosphere. Sample size was also held constant at 0.2 g coated separator. The test comprised of three timed steps: 200 s drift stabilization time, 500 s mix time, and 930 s titration time. The titration was conducted with Mettler Toledo Hydranal AG as the anodic solvent, and Hydranal CG as the cathodic solvent.

In accordance with at least selected embodiments, aspects or objects, the present application, disclosure or invention is directed to or provides novel or improved porous membranes or substrates, separator membranes, separators, composites, electrochemical devices, batteries, methods of making such membranes or substrates, separators, composites, electrochemical devices, and/or batteries, and/or methods of using such membranes or substrates, separators composites, electrochemical devices, and/or batteries; novel or improved microporous membranes, battery separator membranes, separators, energy storage devices, batteries including such separators, methods of making such membranes, separators, and/or batteries, and/or methods of using such membranes, separators and/or batteries; a separator for a battery which has an oxidation protective and binder-free deposition layer and/or a separator for a lithium battery which has an oxidation protective and binder-free deposition layer which is stable up to at least 5.2, or up to at least 5.5 volts in a battery; the deposition layer is preferably an ultra-thin deposition and may be: metal or metal oxide, one or more organic materials, one or more inorganic materials, or a conductive metal or ceramic layer applied to or embedded within a polymeric microporous membrane or separator via a binder-free and solvent-free deposition method; by employing an ultra-thin deposition layer, the energy density of a battery may be increased; the deposition method may preferably deposit a uniform layer that is less than 0.5 µm in thickness, which combination of uniformity and thickness may not be accomplished by other coating techniques; a battery separator membrane or separator, or a multilayer or composite microporous membrane battery separator which may have excellent oxidation resistance and may be stable in a high voltage battery system up to 5.2 volts or more, or 5.5 volts; a membrane or separator for a battery which has a conductive deposition layer which is stable up to at least 5.2 volts, or 5.5 volts or higher, in a lithium battery; a separator for a battery which has an oxidation protective and binder-free treatment or deposition layer which is stable up to at least 5.2 volts, at least 5.5 volts, or up to 7 volts in a cell, battery, pack, or system, the deposition layer being preferably a thin, very thin or ultra-thin deposition of metal or metal oxide applied to a polymeric microporous membrane via a binder-free and solvent-free deposition method such as PVD, laser PVD, pulsed laser PVD, or the like, an electrochemical device that uses a conductive microporous membrane or substrate which has a conductive deposition layer on one side or two sides of a polymeric porous membrane, a separator for a battery which has a conductive, semi-conductive or non-conductive deposition layer which is stable up to at least 5.2 volts or higher, for example, up to 5.5 volts, in a battery, an electrochemical device that uses a nonconductive microporous membrane or substrate which has a nonconductive deposition layer on one side or two sides of a polymeric porous membrane, a separator for a battery which has a nonconductive deposition layer (at least in electrolyte) which is stable up to at least 5.2 volts, or higher, in a battery, a reinforced separator for an energy storage device, such as a secondary lithium ion battery, having a top microporous membrane having a first surface and a second surface, wherein said microporous membrane is at least one of a single layer, multiple layer, single ply, and/or multiple ply structure, and, a bottom microporous membrane having a first surface and a second surface, wherein said microporous membrane is at least one of a single layer, multiple layer, single ply, and/or multiple ply structure, and, a ceramic layer is between the two surfaces of said microporous membranes, said ceramic layer comprising a layer of ceramic particles and a polymer binder, wherein said ceramic reinforced separator provides at least one of improved safety, cycle life, or high temperature performance, an oxidation or reduction reaction interface, surface or boundary, an oxidized or reduced interfacial layer between the separator and battery electrodes during use, prevents or stops further oxidation or reduction reactions from occurring during use, improves safety, cycle life, or high temperature performance of a lithium ion battery, and high dimensional stability at elevated temperatures, or combinations thereof; and/or the like.

In accordance with at least selected embodiments, the present application, disclosure or invention is directed to novel or improved porous membranes or substrates, separator membranes, separators, composites, electrochemical devices, batteries, methods of making such membranes or substrates, separators, composites, electrochemical devices, and/or batteries, and/or methods of using such membranes or substrates, separators composites, electrochemical devices, and/or batteries. In accordance with at least certain embodiments, the present application is directed to novel or improved microporous membranes, battery separator membranes, separators, energy storage devices, batteries including such separators, methods of making such membranes, separators, and/or batteries, and/or methods of using such membranes, separators and/or batteries. In accordance with at least certain selected embodiments, the present invention is directed to a separator for a battery which has an oxidation protective and binder-free deposition layer and/or a separator for a lithium battery which has an oxidation protective and binder-free deposition layer which is stable up to at least 5.2, or up to at least 5.5 volts in a battery. The deposition layer is preferably an ultra-thin deposition and may be: metal or metal oxide, one or more organic materials, one or more inorganic materials, or a conductive metal or ceramic layer applied to or embedded within a polymeric microporous membrane or separator via a binder-free and solvent-free deposition method. By employing an ultra-thin deposition layer, the energy density of a battery may be increased. Furthermore, the deposition method may preferably deposit a uniform layer that is less than 0.5 µm in thickness, which combination of uniformity and thickness may not be accomplished by other coating techniques. In accordance with at least particular embodiments, the battery separator membrane or separator described herein is directed to a multilayer or composite microporous membrane battery separator which may have excellent oxidation resistance and may be stable in a high voltage battery system up to 5.2 volts or more, or 5.5 volts. In accordance with at least other selected embodiments, the present disclosure or invention is directed to a membrane or separator for a battery which has a conductive deposition layer which is stable up to at least 5.2 volts, or 5.5 volts or higher, in a lithium battery. In accordance with at least still other selected embodiments, the present invention or disclosure is directed to a separator for a battery which has an oxidation protective and binder-free treatment or deposition layer which is stable up to at least 5.2 volts, at least 5.5 volts, or up to 7 volts in a cell, battery, pack, or system, the deposition layer being preferably a very thin or ultra-thin deposition of metal or metal oxide applied to a polymeric microporous membrane via a binder-free and solvent-free deposition method such as PVD, laser PVD, pulsed laser PVD, or the like, an electrochemical device that uses a conductive microporous membrane or substrate which has a conductive deposition layer on one side or two sides of a polymeric porous membrane, a separator for a battery which has a conductive, semi-conductive or non-conductive deposition layer which is stable up to at least 5.2 volts or higher, for example, up to 5.5 volts, in a battery, an electrochemical device that uses a nonconductive microporous membrane or substrate which has a nonconductive deposition layer on one side or two sides of a polymeric porous membrane, a separator for a battery which has a nonconductive deposition layer (at least in electrolyte) which is stable up to at least 5.2 volts, or higher, in a battery, a reinforced separator for an energy storage device, such as a secondary lithium ion battery, having a top microporous membrane having a first surface and a second surface, wherein said microporous membrane is at least one of a single layer, multiple layer, single ply, and/or multiple ply structure, and, a bottom microporous membrane having a first surface and a second surface, wherein said microporous membrane is at least one of a single layer, multiple layer, single ply, and/or multiple ply structure, and, a ceramic layer is between the two surfaces of said microporous membranes, said ceramic layer comprising a layer of ceramic particles and a polymer binder, wherein said ceramic reinforced separator provides at least one of improved safety, cycle life, or high temperature performance, an oxidation or reduction reaction interface, surface or boundary, an oxidized or reduced interfacial layer between the separator and battery electrodes during use, prevents or stops further oxidation or reduction reactions from occurring during use, improves safety, cycle life, or high temperature performance of a lithium ion battery, and high dimensional stability at elevated temperatures, or combinations thereof.

In accordance with at least selected embodiments, aspects or objects, the present application, disclosure or invention includes, is directed to or provides a microporous membrane or substrate having a thin, very thin or ultra-thin layer of a metal and/or metal oxide on at least one side of a polymeric porous membrane, wherein said layer is applied using a deposition method or technique such as vapor deposition, a microporous membrane or substrate having a layer of a metal and/or metal oxide on at least one side of a polymeric porous membrane, wherein said layer is applied using a vacuum deposition method, a microporous membrane or substrate having a layer of metal and/or metal oxide on a polymeric porous membrane, wherein said membrane is a component of an electrochemical device, a microporous membrane or substrate having a layer of metal and/or metal oxide on a polymeric porous membrane, wherein membrane is a component of an electrochemical device that is a capacitor, a microporous membrane or substrate having a layer of metal and/or metal oxide on a polymeric porous membrane, wherein said membrane is a component of an electrochemical device that is a super capacitor or a double layer capacitor, a microporous membrane or substrate having a layer of metal and/or metal oxide on a polymeric porous membrane, wherein said membrane is a battery separator, a microporous membrane or substrate having a layer of metal and/or metal oxide on a polymeric porous membrane, wherein said membrane is a lithium battery separator, a microporous membrane or substrate having a layer of metal and/or metal oxide on a polymeric porous membrane, wherein said membrane is a primary or secondary battery separator, a microporous membrane or substrate having a layer of metal and/or metal oxide on at least one side of a polymeric porous membrane, wherein said membrane is a lithium primary or secondary battery separator, a microporous membrane or substrate having a layer of metal and/or metal oxide on a polymeric porous membrane, wherein said membrane is a lithium secondary battery separator that is stable against oxidation in a lithium ion battery with a cell voltage up to or equal to 4.9 volts, 5.0 volts, 5.2 volts, 5.5 volts, or higher, wherein cell voltage may be a measure of the potential difference between two electrodes (positive electrode and negative electrode) in an electrochemical cell, a microporous membrane or substrate having a layer of metal and/or metal oxide on a polymeric porous membrane, wherein said membrane is a lithium secondary battery separator that is stable against oxidation in a lithium ion battery with a cell voltage up to or equal to 5.2 volts or more, wherein cell voltage may be a measure of the potential difference between two electrodes (positive electrode and negative electrode) in an electrochemical cell, a microporous membrane or substrate having a layer of a metal and/or metal oxide on at least one side of a polymeric porous membrane, wherein said layer is applied using a deposition method selected from the group including physical vapor deposition, atomic layer deposition, chemical vapor deposition, sputtering, and laser plasma, a microporous membrane or substrate which has a deposition of an inert metal element where non-limiting examples of such inert metal element include gold, platinum, the like, and mixtures thereof, a microporous membrane or substrate which has a deposition of a reactive metal element where non-limiting examples of such reactive metal element include aluminum, nickel, copper, the like, and mixtures thereof, a microporous membrane or substrate which has a deposition of a metal oxide where non-limiting examples of such metal oxide include aluminum oxide ($Al_2O_3$), boehmite AlO(OH), silicon oxide, titanium oxide and oxides of transition metals and the like or mixtures thereof, a microporous membrane or substrate having a layer of a metal and/or metal oxide on at least one side of a polymeric porous membrane, wherein said layer is applied using a deposition method such as vapor deposition wherein the polymeric porous membrane comprises a polyolefin (where the polyolefin is selected from the group including polypropylene, polyethylene, polymethylpentene, polybutylene, and/or blends, mixtures thereof and their copolymers and combinations thereof) and/or where the membrane or substrate comprises polyvinylidene fluoride (PVdF), polyethylene terephthalate (PET), woven fibers, and/or nonwoven fibers, a microporous membrane or substrate having a layer of a metal and/or metal oxide on at least one side of a polymeric porous membrane, wherein said layer is applied using a deposition method and wherein the membrane or substrate is a monolayer or a multilayer membrane or substrate produced using dry process, a wet process, a particle stretch process, a biaxially oriented polypropylene (BOPP) process, a beta nucleated biaxially oriented polypropylene (BN-BOPP) process, a nonwoven membrane process, or a combination thereof, a microporous membrane or substrate having a layer of metal and/or metal oxide on at least one side of a polymeric porous membrane, wherein said membrane is a lithium primary or secondary battery separator, wherein said deposition layer is applied to the side of the separator facing the cathode, the positive electrode, a microporous membrane or substrate having a layer of metal and/or metal oxide on both sides of a polymeric porous membrane, wherein said membrane is a lithium primary or secondary battery separator, wherein said deposition layer is applied to the side of the separator facing the cathode, the positive electrode, and wherein said deposition layer is applied to the side of the separator facing the anode, the negative electrode, a microporous membrane or substrate having a layer of metal and/or metal oxide on at least one side of a polymeric porous membrane, wherein said membrane is a lithium primary or secondary battery separator, wherein said deposition layer is applied to the side of the separator facing the anode, the negative electrode, a microporous membrane or substrate having a layer of metal and/or metal oxide on at least one side of a polymeric porous membrane, wherein said membrane is a lithium primary or secondary battery separator, wherein said deposition layer is applied to the side of the separator facing the cathode, the positive electrode, and a ceramic coating is applied to the side of the separator facing the anode, the negative electrode, a microporous membrane or substrate having a deposition layer of metal and/or metal oxide applied on both sides of a polymeric porous membrane, wherein said membrane is a lithium primary or secondary battery separator, wherein said deposition layer is applied to the side of the separator facing the cathode, the positive electrode, and said deposition layer is applied to the side of the separator facing the anode, the negative electrode, and a ceramic coating is applied on top of the metal and/or metal oxide deposition layer on the side of the separator facing the anode, the negative electrode, a microporous membrane or substrate having a deposition layer of metal and/or metal oxide applied on at least one side of a polymeric porous membrane, wherein said membrane is a lithium primary or secondary battery separator, wherein said deposition layer is applied to the side of the separator facing the anode, the negative electrode, and a ceramic coating is applied on top of the metal and/or metal oxide deposition layer on the side of the separator facing the anode, the negative electrode, a microporous membrane or substrate having a deposition layer of metal and/or metal oxide applied on at least one side of a polymeric porous membrane, wherein said membrane is a lithium primary or secondary battery separator, wherein said deposition layer is applied to the side of the separator facing the cathode, the positive electrode, and a ceramic coating is applied on top of the metal and/or metal oxide deposition on the side of the separator facing the cathode, the positive electrode, a microporous membrane or substrate having a deposition layer of metal and/or metal oxide applied on both sides of a polymeric porous membrane, wherein said membrane is a lithium primary or secondary battery separator, wherein said deposition layer is applied to the side of the separator facing the cathode, the positive electrode, and wherein said deposition layer is applied to the side of the separator facing the anode, the negative electrode, and a ceramic coating is applied on top of the metal and/or metal oxide deposition layer on the side of the separator facing the cathode, the positive electrode, a microporous membrane or substrate having a deposition layer of metal and/or metal oxide applied on at least one side of a polymeric porous membrane, wherein said membrane is a lithium primary or secondary battery separator, wherein said deposition layer is applied to the side of the separator facing the anode, the negative electrode, and a ceramic coating is applied on the other side of the polymeric porous membrane or separator facing the cathode, the positive electrode, a microporous membrane or substrate having a deposition layer of metal and/or metal oxide applied on at least one side of a polymeric porous membrane, wherein said membrane is a lithium primary or secondary battery separator, wherein said deposition layer is applied to the side of the separator facing the cathode, the positive electrode, and a ceramic coating is applied on top of the metal and/or metal oxide deposition on the side of the polymeric porous membrane or separator facing the cathode, the positive electrode, and a ceramic coating is applied to the other side of the polymeric porous membrane or separator facing the anode, the negative electrode, a microporous membrane or substrate having a deposition layer of metal and/or metal oxide applied on both sides of a polymeric porous membrane, wherein said membrane is a lithium primary or secondary battery separator, wherein said deposition layer is applied to the side of the separator facing the cathode, the positive electrode, and said deposition layer is applied to the side of the separator facing the anode, the negative electrode, and a ceramic coating is applied on top of both metal and/or metal oxide deposition layers on the polymeric porous membrane, a microporous membrane or substrate having a deposition layer of metal and/or metal oxide applied on at least one side of a polymeric porous membrane, wherein said membrane is a lithium primary or secondary battery separator, wherein said deposition layer is applied to one side of the separator facing the anode, the negative electrode, and a ceramic coating is applied on top of the metal and/or metal oxide deposition layer on the side of the separator or polymeric porous membrane facing the anode, the negative electrode, and a ceramic coating is applied to the other side of the polymeric porous membrane or separator facing the cathode, the positive electrode, a microporous membrane or substrate which has a deposition layer of a reactive metal element where non-limiting examples of such reactive metal element include aluminum, nickel, copper, the like, and mixtures thereof and wherein such reactive metal element is converted partially or completely into inert material, a microporous membrane or substrate which has a deposition layer of a reactive metal element where non-limiting examples of such reactive metal element include aluminum, nickel, copper, the like, and mixtures thereof and wherein such reactive metal element is converted partially or completely into inert material in a lithium battery electrolyte comprising solvent, lithium salt, and, optionally, one or more additives, or a microporous membrane or substrate which has a deposition layer of a reactive metal element where non-limiting examples of such reactive metal element include aluminum, nickel, copper, the like, and mixtures thereof and wherein such reactive metal element, such as aluminum, is converted partially or completely into inert material in a lithium battery electrolyte comprising solvent, lithium salt, and optionally, one or more additives, wherein the lithium salt includes lithium hexafluorophosphate ($LiPF_6$); a primary or secondary battery comprising a microporous membrane or substrate according to any one of the preceding listed microporous membranes; a method of depositing one or more layers of metal and/or metal oxide onto a membrane or substrate comprising: using a deposition method selected from the group consisting of vacuum deposition, physical vapor deposition, atomic layer deposition chemical vapor deposition, and combinations thereof, and depositing at least one layer of metal and/or metal oxide onto a membrane or substrate, a method of depositing one or more layers of a metal and/or metal oxide at a total thickness less than three microns onto a microporous membrane, a method of depositing one or more layers of a metal or metal oxide at a thickness less than two µm onto a microporous membrane, a method of depositing one or more layers of a metal or metal oxide at a thickness less than one µm onto a microporous membrane, a method of depositing one or more layers of a metal or metal oxide at a thickness less than 0.1 µm onto a microporous membrane, or a method of depositing one or more layers of a metal or metal oxide at a thickness less than 0.05 µm onto a microporous membrane; a microporous membrane or substrate having a layer of metal and/or metal oxide on a polymeric porous membrane, wherein said membrane is a lithium secondary battery separator that is stable against oxidation in a lithium ion battery with a positive electrode potential of up to 7.2 volts or more versus a Li/Li+ reference electrode; a microporous membrane or substrate having a layer of metal and/or metal oxide on a polymeric porous membrane, wherein said membrane is a lithium secondary battery separator that is stable against oxidation in a lithium ion battery with a positive electrode potential of up to 5.4 volts or more versus a Li/Li+ reference electrode; a conductive microporous membrane or substrate, a conductive microporous membrane or substrate wherein a layer of conductive inorganic material is applied on at least one side of a polymeric porous membrane, a conductive microporous membrane or substrate wherein a layer of conductive inorganic material is applied on at least one side of a polymeric porous membrane wherein said layer is applied using a vacuum and/or a vapor deposition process, a conductive microporous membrane or substrate wherein a layer of conductive inorganic material is applied on at least one side of a polymeric porous membrane wherein the polymeric porous membrane comprises a polyolefin, and wherein the polyolefin may include a polypropylene, polyethylene, polymethylpentene, polybutylene, and/or blends, mixtures thereof and their copolymers and combinations thereof, and/or wherein the membrane or substrate includes polyvinylidene fluoride (PVdF), polyethylene terephthalate (PET), woven fibers, nonwoven fibers, or mixtures thereof; novel or improved porous membranes or substrates, separator membranes, separators, composites, electrochemical devices, batteries, methods of making such membranes or substrates, separators, and/or batteries, and/or methods of using such membranes or substrates, separators and/or batteries; novel or improved microporous membranes, battery separator membranes, separators, energy storage devices, batteries including such separators, methods of making such membranes, separators, and/or batteries, and/or methods of using such membranes, separators and/or batteries; a separator for a battery which has an oxidation protective and binder-free deposition layer which is stable up to at least 5.2 volts, for example, up to 7 volts, in a battery, the deposition layer is preferably an ultra-thin deposition or deposition layer on a polymeric microporous membrane applied to the polymeric microporous membrane via a binder-free and solvent-free deposition method, and wherein by employing an ultra-thin deposition layer, the energy density of a battery may be increased, the deposition method may preferably deposit a uniform deposition layer that is less than 0.5 µm in thickness, which combination of uniformity and thickness may not be accomplished by known coating techniques; a multilayer or composite microporous membrane battery separator which may have excellent oxidation resistance and may be stable in a high voltage battery system up to 5.2 volts or more (for example, up to 7 volts); an electrochemical device that uses a conductive microporous membrane or substrate which has a conductive deposition layer on one side or two sides of a polymeric porous membrane; a separator for a battery which has a conductive deposition layer which is stable up to at least 5.2 volts, for example, up to 7 volts, in a battery; an electrochemical device that uses a nonconductive microporous membrane or substrate which has a nonconductive deposition layer on one side or two sides of a polymeric porous membrane; a separator for a battery which has a nonconductive deposition layer (at least in electrolyte) which is stable up to at least 5.2 volts, for example, up to 7 volts, in a battery; a microporous membrane or substrate having a layer of an organic material deposition on at least one side of a polymeric porous membrane, wherein said layer is applied using a deposition method or technique such as a vapor deposition method or technique, a microporous membrane or substrate having a layer of an organic material deposition on at least one side of a polymeric porous membrane, wherein said layer is applied using a vacuum deposition method, a microporous membrane or substrate having a layer of an organic material deposition on a polymeric porous membrane, wherein said membrane is a component of an electrochemical device, a microporous membrane or substrate having a layer of an organic material deposition on a polymeric porous membrane, wherein membrane is a component of an electrochemical device that is a capacitor, a microporous membrane or substrate having a layer of an organic material deposition on a polymeric porous membrane, wherein said membrane is a component of an electrochemical device that is a super capacitor or a double layer capacitor, a microporous membrane or substrate having a layer of an organic material deposition on a polymeric porous membrane, wherein said membrane is a battery separator, a microporous membrane or substrate having a layer of an organic material deposition on a polymeric porous membrane, wherein said membrane is a lithium battery separator, a microporous membrane or substrate having a layer of an organic material deposition on a polymeric porous membrane, wherein said membrane is a primary or secondary battery separator, a microporous membrane or substrate having a layer of an organic material deposition on at least one side of a polymeric porous membrane, wherein said membrane is a lithium primary or secondary battery separator, a microporous membrane or substrate having a layer of an organic material deposition on a polymeric porous membrane, wherein said membrane is a lithium secondary battery separator that is stable against oxidation in a lithium ion battery with a cell voltage up to or equal to 7.0 volts, wherein cell voltage may be a measure of the potential difference between two electrodes (positive electrode and negative electrode) in an electrochemical cell, a microporous membrane or substrate having a layer of an organic material deposition on a polymeric porous membrane, wherein said membrane is a lithium secondary battery separator that is stable against oxidation in a lithium ion battery with a cell voltage up to or equal to 5.2 volts or more, wherein cell voltage may be a measure of the potential difference between two electrodes (positive electrode and negative electrode) in an electrochemical cell, a microporous membrane or substrate having a layer of an organic material deposition on at least one side of a polymeric porous membrane, wherein said layer is applied using a deposition method selected from the group including a chemical vapor deposition method, an atomic layer deposition method or a physical vapor deposition method, including sputtering and laser plasma, a microporous membrane or substrate having a layer of an organic material deposition on at least one side of a polymeric porous membrane, wherein said layer is applied using a deposition method wherein the polymeric porous membrane comprises a polyolefin (where the polyolefin is selected from the group including polypropylene, polyethylene, polymethylpentene, polybutylene, and/or blends, mixtures thereof and their copolymers and combinations thereof) and/or where the membrane or substrate comprises polyvinylidene fluoride (PVdF), polyethylene terephthalate (PET), woven fibers, and/or nonwoven fibers, a microporous membrane or substrate having a layer of an organic material deposition on at least one side of a polymeric porous membrane, wherein said layer is applied using a deposition method and wherein the membrane or substrate is a monolayer or a multilayer membrane or substrate produced using dry process, a wet process, a particle stretch process, a biaxially oriented polypropylene (BOPP) process, a beta nucleated biaxially oriented polypropylene (BN-BOPP) process, a nonwoven membrane process, or a combination thereof, a microporous membrane or substrate having a layer of an organic material deposition on at least one side of a polymeric porous membrane, wherein said membrane is a lithium primary or secondary battery separator, wherein said deposition layer is applied to the side of the separator facing the cathode, the positive electrode, a microporous membrane or substrate having a layer of an organic material deposition on both sides of a polymeric porous membrane, wherein said membrane is a lithium primary or secondary battery separator, wherein said deposition layer is applied to the side of the separator facing the cathode, the positive electrode, and wherein said deposition layer is applied to the side of the separator facing the anode, the negative electrode, a microporous membrane or substrate having a layer of an organic material deposition on at least one side of a polymeric porous membrane, wherein said membrane is a lithium primary or secondary battery separator, wherein said deposition layer is applied to the side of the separator facing the anode, the negative electrode, a microporous membrane or substrate having a layer of an organic material deposition on at least one side of a polymeric porous membrane, wherein said membrane is a lithium primary or secondary battery separator, wherein said deposition layer is applied to the side of the separator facing the cathode, the positive electrode, and a ceramic coating is applied to the side of the separator facing the anode, the negative electrode, a microporous membrane or substrate having a deposition layer of an organic material deposition applied on both sides of a polymeric porous membrane, wherein said membrane is a lithium primary or secondary battery separator, wherein said deposition layer is applied to the side of the separator facing the cathode, the positive electrode, and said deposition layer is applied to the side of the separator facing the anode, the negative electrode, and a ceramic coating is applied on top of the organic material deposition layer on the side of the separator facing the anode, the negative electrode, a microporous membrane or substrate having a deposition layer of an organic material deposition applied on at least one side of a polymeric porous membrane, wherein said membrane is a lithium primary or secondary battery separator, wherein said deposition layer is applied to the side of the separator facing the anode, the negative electrode, and a ceramic coating is applied on top of the organic material deposition layer on the side of the separator facing the anode, the negative electrode, a microporous membrane or substrate having a deposition layer of an organic material deposition applied on at least one side of a polymeric porous membrane, wherein said membrane is a lithium primary or secondary battery separator, wherein said deposition layer is applied to the side of the separator facing the cathode, the positive electrode, and a ceramic coating is applied on top of the organic material deposition on the side of the separator facing the cathode, the positive electrode, a microporous membrane or substrate having a deposition layer of an organic material deposition applied on both sides of a polymeric porous membrane, wherein said membrane is a lithium primary or secondary battery separator, wherein said deposition layer is applied to the side of the separator facing the cathode, the positive electrode, and wherein said deposition layer is applied to the side of the separator facing the anode, the negative electrode, and a ceramic coating is applied on top of an organic material deposition layer on the side of the separator facing the cathode, the positive electrode, a microporous membrane or substrate having a deposition layer of an organic material deposition applied on at least one side of a polymeric porous membrane, wherein said membrane is a lithium primary or secondary battery separator, wherein said deposition layer is applied to the side of the separator facing the anode, the negative electrode, and a ceramic coating is applied on the other side of the polymeric porous membrane or separator facing the cathode, the positive electrode, a microporous membrane or substrate having a deposition layer of an organic material deposition applied on at least one side of a polymeric porous membrane, wherein said membrane is a lithium primary or secondary battery separator, wherein said deposition layer is applied to the side of the separator facing the cathode, the positive electrode, and a ceramic coating is applied on top of the organic material deposition on the side of the polymeric porous membrane or separator facing the cathode, the positive electrode, and a ceramic coating is applied to the other side of the polymeric porous membrane or separator facing the anode, the negative electrode, a microporous membrane or substrate having a deposition layer of an organic material deposition applied on both sides of a polymeric porous membrane, wherein said membrane is a lithium primary or secondary battery separator, wherein said deposition layer is applied to the side of the separator facing the cathode, the positive electrode, and said deposition layer is applied to the side of the separator facing the anode, the negative electrode, and a ceramic coating is applied on top of both an organic material deposition layers on the polymeric porous membrane, or a microporous membrane or substrate having a deposition layer of an organic material deposition applied on at least one side of a polymeric porous membrane, wherein said membrane is a lithium primary or secondary battery separator, wherein said deposition layer is applied to one side of the separator facing the anode, the negative electrode, and a ceramic coating is applied on top of the organic material deposition layer on the side of the separator or polymeric porous membrane facing the anode, the negative electrode, and a ceramic coating is applied to the other side of the polymeric porous membrane or separator facing the cathode, the positive electrode; a primary or secondary battery comprising a microporous membrane or substrate according to any one of the preceding listed microporous membrane or substrates; a method of depositing one or more layers of an organic material deposition onto a membrane or substrate comprising: using a deposition method selected from the group consisting of a chemical vapor deposition method, an atomic layer deposition method or a physical vapor deposition method and combinations thereof, and depositing at least one layer of an organic material deposition onto a membrane or substrate, a method of depositing one or more layers of an organic material deposition at a thickness less than three microns onto a microporous membrane, a method of depositing one or more layers of an organic material deposition at a thickness less than two µm onto a microporous membrane, a method of depositing one or more layers of an organic material deposition at a thickness less than one µm onto a microporous membrane, a method of depositing one or more layers of an organic material deposition at a thickness less than 0.1 µm onto a microporous membrane, or a method of depositing one or more layers of an organic material deposition at a thickness less than 0.05 µm onto a microporous membrane; a microporous membrane or substrate having a layer of an organic material deposition on a polymeric porous membrane, wherein said membrane is a lithium secondary battery separator that is stable against oxidation in a lithium ion battery with a positive electrode potential of up to 7.2 volts or more versus a Li/Li+ reference electrode; a microporous membrane or substrate having a layer of an organic material deposition on a polymeric porous membrane, wherein said membrane is a lithium secondary battery separator that is stable against oxidation in a lithium ion battery with a positive electrode potential of up to 5.4 volts or more versus a Li/Li+ reference electrode; a conductive microporous membrane or substrate wherein a layer of conductive organic material is applied on at least one side of a polymeric porous membrane, a conductive microporous membrane or substrate wherein a layer of conductive organic material is applied on at least one side of a polymeric porous membrane wherein said layer is applied using a vapor deposition process, or a conductive microporous membrane or substrate wherein a layer of conductive organic material is applied on at least one side of a polymeric porous membrane wherein the polymeric porous membrane comprises a polyolefin, and wherein the polyolefin may include a polypropylene, polyethylene, polymethylpentene, polybutylene, and/or blends, mixtures thereof and their copolymers and combinations thereof, and/or wherein the membrane or substrate includes polyvinylidene fluoride (PVdF), polyethylene terephthalate (PET), woven fibers, nonwoven fibers, or mixtures thereof; novel or improved porous membranes or substrates, separator membranes, separators, composites, electrochemical devices, batteries, methods of making such membranes or substrates, separators, and/or batteries, and/or methods of using such membranes or substrates, separators and/or batteries; novel or improved microporous membranes, battery separator membranes, separators, energy storage devices, batteries including such separators, methods of making such membranes, separators, and/or batteries, and/or methods of using such membranes, separators and/or batteries; a separator for a battery which has an oxidation protective and binder-free deposition layer which is stable up to at least 5.2 volts, for example, up to 7 volts, in a battery, and/or the deposition layer is preferably an ultra-thin deposition or deposition layer on a polymeric microporous membrane; a battery separator for a lithium secondary battery comprises: a conductive layer, a battery separator wherein the conductive layer is electrically and/or thermally conductive, a battery separator wherein the conductive layer is embedded within one or more thermoplastic layers, a battery separator wherein the conductive layer is embedded within a polyethylene-based layer, a battery separator wherein the polyethylene-based layer is sandwiched between polypropylene layers, a battery separator wherein the conductive layer includes a stainless steel material, a battery separator wherein the stainless steel material is stainless steel particles, stainless steel fibers, and/or a stainless steel foil, or a battery separator wherein the stainless steel foil is porous; a lithium secondary battery comprises a separator having a conductive layer, a battery wherein the conductive layer is electrically and/or thermally conductive, a battery wherein the conductive layer is embedded within one or more thermoplastic layers, a battery wherein the conductive layer is embedded within a polyethylene-based layer, a battery wherein the polyethylene-based layer is sandwiched between polypropylene layers, a battery separator wherein the conductive layer includes a stainless steel material, a battery separator of wherein the stainless steel material is stainless steel particles, stainless steel fibers, and/or a stainless steel foil, or a battery separator wherein the stainless steel foil is porous; novel or improved battery separators, batteries including such separators, and/or methods of production and/or use thereof, a novel or improved battery separator for a lithium secondary battery, or a novel or improved battery separator having at least one conductive layer; a microporous membrane or substrate having a layer of a metal and/or metal oxide, inorganic material, and/or organic material on at least one side of a polymeric porous membrane or substrate, wherein said layer is applied using a deposition method or technique such as vapor deposition, wherein said layer is applied using a vacuum deposition method, wherein said membrane or substrate is a component of an electrochemical device, wherein said membrane or substrate is a component of an electrochemical device that is a capacitor, wherein said membrane or substrate is a component of an electrochemical device that is a super capacitor or a double layer capacitor, wherein said membrane or substrate is a battery separator, wherein said membrane or substrate is a lithium battery separator, wherein said membrane or substrate is a primary or secondary battery separator, wherein said membrane or substrate is a lithium primary or secondary battery separator, wherein said membrane or substrate is a lithium secondary battery separator that is stable against oxidation in a lithium ion battery with a cell voltage up to or equal to 7.0 volts, wherein cell voltage may be a measure of the potential difference between two electrodes (positive electrode and negative electrode) in an electrochemical cell, wherein said membrane or substrate is a lithium secondary battery separator that is stable against oxidation in a lithium ion battery with a cell voltage up to or equal to 5.2 volts or more, wherein cell voltage may be a measure of the potential difference between two electrodes (positive electrode and negative electrode) in an electrochemical cell, or wherein said layer of a metal and/or metal oxide, inorganic material, and/or organic material is applied using a deposition method selected from the group including physical vapor deposition, atomic layer deposition, chemical vapor deposition, sputtering, and laser plasma; a microporous membrane or substrate which has a deposition of an inert metal element where non-limiting examples of such inert metal element include gold, platinum, the like, and mixtures thereof, a microporous membrane or substrate which has a deposition of a reactive metal element where non-limiting examples of such reactive metal element include aluminum, nickel, copper, the like, and mixtures thereof; a microporous membrane or substrate which has a deposition of a metal oxide where non-limiting examples of such metal oxide include aluminum oxide ($Al_2O_3$), boehmite AlO(OH), silicon oxide, titanium oxide and oxides of transition metals and the like or mixtures thereof, a microporous membrane or substrate having a layer of a metal and/or metal oxide on at least one side of a polymeric porous membrane, wherein said layer is applied using a deposition method such as vapor deposition wherein the polymeric porous membrane comprises a polyolefin (where the polyolefin is selected from the group including polypropylene, polyethylene, polymethylpentene, polybutylene, and/or blends, mixtures thereof and their copolymers and combinations thereof) and/or where the membrane or substrate comprises polyvinylidene fluoride (PVdF), polyethylene terephthalate (PET), woven fibers, and/or nonwoven fibers, a microporous membrane or substrate having a layer of a metal and/or metal oxide on at least one side of a polymeric porous membrane, wherein said layer is applied using a deposition method and wherein the membrane or substrate is a monolayer or a multilayer membrane or substrate produced using dry process, a wet process, a particle stretch process, a biaxially oriented polypropylene (BOPP) process, a beta nucleated biaxially oriented polypropylene (BN-BOPP) process, a nonwoven membrane process, or a combination thereof, a microporous membrane or substrate having a layer of metal and/or metal oxide on at least one side of a polymeric porous membrane, wherein said membrane is a lithium primary or secondary battery separator, wherein said deposition layer is applied to the side of the separator facing the cathode, the positive electrode, a microporous membrane or substrate having a layer of metal and/or metal oxide on both sides of a polymeric porous membrane, wherein said membrane is a lithium primary or secondary battery separator, wherein said deposition layer is applied to the side of the separator facing the cathode, the positive electrode, and wherein said deposition layer is applied to the side of the separator facing the anode, the negative electrode, a microporous membrane or substrate having a layer of metal and/or metal oxide on at least one side of a polymeric porous membrane, wherein said membrane is a lithium primary or secondary battery separator, wherein said deposition layer is applied to the side of the separator facing the anode, the negative electrode, a microporous membrane or substrate having a layer of metal and/or metal oxide on at least one side of a polymeric porous membrane, wherein said membrane is a lithium primary or secondary battery separator, wherein said deposition layer is applied to the side of the separator facing the cathode, the positive electrode, and a ceramic coating is applied to the side of the separator facing the anode, the negative electrode, a microporous membrane or substrate having a deposition layer of metal and/or metal oxide applied on both sides of a polymeric porous membrane, wherein said membrane is a lithium primary or secondary battery separator, wherein said deposition layer is applied to the side of the separator facing the cathode, the positive electrode, and said deposition layer is applied to the side of the separator facing the anode, the negative electrode, and a ceramic coating is applied on top of the metal and/or metal oxide deposition layer on the side of the separator facing the anode, the negative electrode, a microporous membrane or substrate having a deposition layer of metal and/or metal oxide applied on at least one side of a polymeric porous membrane, wherein said membrane is a lithium primary or secondary battery separator, wherein said deposition layer is applied to the side of the separator facing the anode, the negative electrode, and a ceramic coating is applied on top of the metal and/or metal oxide deposition layer on the side of the separator facing the anode, the negative electrode, a microporous membrane or substrate having a deposition layer of metal and/or metal oxide applied on at least one side of a polymeric porous membrane, wherein said membrane is a lithium primary or secondary battery separator, wherein said deposition layer is applied to the side of the separator facing the cathode, the positive electrode, and a ceramic coating is applied on top of the metal and/or metal oxide deposition on the side of the separator facing the cathode, the positive electrode, a microporous membrane or substrate having a deposition layer of metal and/or metal oxide applied on both sides of a polymeric porous membrane, wherein said membrane is a lithium primary or secondary battery separator, wherein said deposition layer is applied to the side of the separator facing the cathode, the positive electrode, and wherein said deposition layer is applied to the side of the separator facing the anode, the negative electrode, and a ceramic coating is applied on top of the metal and/or metal oxide deposition layer on the side of the separator facing the cathode, the positive electrode, a microporous membrane or substrate having a deposition layer of metal and/or metal oxide applied on at least one side of a polymeric porous membrane, wherein said membrane is a lithium primary or secondary battery separator, wherein said deposition layer is applied to the side of the separator facing the anode, the negative electrode, and a ceramic coating is applied on the other side of the polymeric porous membrane or separator facing the cathode, the positive electrode, a microporous membrane or substrate having a deposition layer of metal and/or metal oxide applied on at least one side of a polymeric porous membrane, wherein said membrane is a lithium primary or secondary battery separator, wherein said deposition layer is applied to the side of the separator facing the cathode, the positive electrode, and a ceramic coating is applied on top of the metal and/or metal oxide deposition on the side of the polymeric porous membrane or separator facing the cathode, the positive electrode, and a ceramic coating is applied to the other side of the polymeric porous membrane or separator facing the anode, the negative electrode, a microporous membrane or substrate having a deposition layer of metal and/or metal oxide applied on both sides of a polymeric porous membrane, wherein said membrane is a lithium primary or secondary battery separator, wherein said deposition layer is applied to the side of the separator facing the cathode, the positive electrode, and said deposition layer is applied to the side of the separator facing the anode, the negative electrode, and a ceramic coating is applied on top of both metal and/or metal oxide deposition layers on the polymeric porous membrane, a microporous membrane or substrate having a deposition layer of metal and/or metal oxide applied on at least one side of a polymeric porous membrane, wherein said membrane is a lithium primary or secondary battery separator, wherein said deposition layer is applied to one side of the separator facing the anode, the negative electrode, and a ceramic coating is applied on top of the metal and/or metal oxide deposition layer on the side of the separator or polymeric porous membrane facing the anode, the negative electrode, and a ceramic coating is applied to the other side of the polymeric porous membrane or separator facing the cathode, the positive electrode, a microporous membrane or substrate which has a deposition layer of a reactive metal element where non-limiting examples of such reactive metal element include aluminum, nickel, copper, the like, and mixtures thereof and wherein such reactive metal element is converted partially or completely into inert material, a microporous membrane or substrate which has a deposition layer of a reactive metal element where non-limiting examples of such reactive metal element include aluminum, nickel, copper, the like, and mixtures thereof and wherein such reactive metal element is converted partially or completely into inert material in a lithium battery electrolyte comprising solvent, lithium salt, and, optionally, one or more additives, or a microporous membrane or substrate which has a deposition layer of a reactive metal element where non-limiting examples of such reactive metal element include aluminum, nickel, copper, the like, and mixtures thereof and wherein such reactive metal element, such as aluminum, is converted partially or completely into inert material in a lithium battery electrolyte comprising solvent, lithium salt, and optionally, one or more additives, wherein the lithium salt includes lithium hexafluorophosphate ($LiPF_6$); a primary or secondary battery comprising a microporous membrane or substrate according to any one of the preceding listed membranes or substrates; a method of depositing one or more layers of metal and/or metal oxide onto a membrane or substrate comprising: using a deposition method selected from the group consisting of vacuum deposition, physical vapor deposition, atomic layer deposition chemical vapor deposition, and combinations thereof, and depositing at least one layer of metal and/or metal oxide onto a membrane or substrate, a method of depositing one or more layers of a metal and/or metal oxide at a total thickness less than three microns onto a microporous membrane, a method of depositing one or more layers of a metal or metal oxide at a thickness less than two μm onto a microporous membrane, a method of depositing one or more layers of a metal or metal oxide at a thickness less than one μm onto a microporous membrane, a method of depositing one or more layers of a metal or metal oxide at a thickness less than 0.1 μm onto a microporous membrane, or a method of depositing one or more layers of a metal or metal oxide at a thickness less than 0.05 μm onto a microporous membrane; a microporous membrane or substrate having a layer of metal and/or metal oxide on a polymeric porous membrane, wherein said membrane is a lithium secondary battery separator that is stable against oxidation in a lithium ion battery with a positive electrode potential of up to 7.2 volts or more versus a Li/Li+ reference electrode; a microporous membrane or substrate having a layer of metal and/or metal oxide on a polymeric porous membrane, wherein said membrane is a lithium secondary battery separator that is stable against oxidation in a lithium ion battery with a positive electrode potential of up to 5.4 volts or more versus a Li/Li+ reference electrode; a conductive microporous membrane or substrate wherein a layer of conductive inorganic material is applied on at least one side of a polymeric porous membrane, wherein a layer of conductive inorganic material is applied on at least one side of a polymeric porous membrane wherein said layer is applied using a vacuum and/or a vapor deposition process, or wherein a layer of conductive inorganic material is applied on at least one side of a polymeric porous membrane wherein the polymeric porous membrane comprises a polyolefin, and wherein the polyolefin may include a polypropylene, polyethylene, polymethylpentene, polybutylene, and/or blends, mixtures thereof and their copolymers and combinations thereof, and/or wherein the membrane or substrate includes polyvinylidene fluoride (PVdF), polyethylene terephthalate (PET), woven fibers, nonwoven fibers, or mixtures thereof; novel or improved or modified membranes or substrates, porous membranes or substrates, separator membranes, separators, composites, electrochemical devices, batteries, and/or cells, and/or methods of making such membranes or substrates, separators, cells, and/or batteries, and/or methods of using such membranes or substrates, separators, cells, and/or batteries; novel or improved or modified microporous membranes, battery separator membranes, separators, energy storage devices, batteries including such separators, methods of making such membranes, separators, and/or batteries, and/or methods of using such membranes, separators and/or batteries; a separator for a battery which has an oxidation protective and binder-free treatment or deposition layer which is stable up to at least 5.2 volts, or up to 7 volts in a battery; the deposition layer is preferably an ultra-thin deposition of metal or metal oxide applied to a polymeric microporous membrane via a binder-free and solvent-free deposition method such as PVD, laser PVD, pulsed laser PVD, or the like; an electrochemical device that uses a conductive microporous membrane or substrate which has a conductive deposition layer on one side or two sides of a polymeric porous membrane; a separator for a battery which has a conductive deposition layer which is stable up to at least 5.2 volts, for example, up to 7 volts, in a battery; an electrochemical device that uses a nonconductive microporous membrane or substrate which has a nonconductive deposition layer on one side or two sides of a polymeric porous membrane; and/or a separator for a battery which has a nonconductive deposition layer (at least in electrolyte) which is stable up to at least 5.2 volts, for example, up to 7 volts, in a battery; a reinforced separator for an energy storage device, such as a secondary lithium ion battery, comprising:

a top microporous membrane having a first surface and a second surface, wherein said microporous membrane is at least one of a single layer, multiple layer, single ply, and/or multiple ply structure; and, a bottom microporous membrane having a first surface and a second surface, wherein said microporous membrane is at least one of a single layer, multiple layer, single ply, and/or multiple ply structure; and, a ceramic layer is between the two surfaces of said microporous membranes, said ceramic layer comprising a layer of ceramic particles and a polymer binder, wherein said ceramic reinforced separator provides at least one of improved safety, cycle life, or high temperature performance, an oxidation or reduction reaction interface, surface or boundary, an oxidized or reduced interfacial layer between the separator and battery electrodes during use, prevents or stops further oxidation or reduction reactions from occurring during use, improves safety, cycle life, or high temperature performance of a lithium ion battery, and high dimensional stability at elevated temperatures, wherein said top microporous membrane is a dry process polypropylene, polyethylene, polyvinylidene fluoride (PVDF), and polytetrafluoroethylene (PTFE) microporous membrane, wherein said bottom microporous membrane is a dry process polypropylene, polyethylene, polyvinylidene fluoride (PVDF), and polytetrafluoroethylene (PTFE) microporous membrane, wherein said top microporous membrane is a wet process polypropylene, polyethylene, polyvinylidene fluoride (PVDF), and polytetrafluoroethylene (PTFE) microporous membrane, wherein said bottom microporous membrane is a wet process polypropylene, polyethylene, polyvinylidene fluoride (PVDF), and polytetrafluoroethylene (PTFE) microporous membrane, wherein said top microporous membrane has a thickness of about 5 μm to 30 μm (or um), wherein said bottom microporous membrane has a thickness of about 5 μm to 30 μm, wherein said polymeric binder of said ceramic layer comprises at least one polymeric binder of polyvinylidene fluoride (PVDF), styrene-butadiene rubber (SBR), polytetrafluoroethylene (PTFE), polyvinyl alcohol (PVOH), polyvinyl acetate (PVAc), polyacrylic acid salt, polyacrylonitrile, polyacrylamide or poly (sodium acrylate-acrylamide-acrylonitrile) copolymer, and copolymers, mixtures, blends, or combinations thereof, wherein said ceramic particles of said ceramic layer comprise at least one of inorganic particles, ionically conductive materials (LISICON which is a lithium super ionic conductive material, with the chemical formula $Li_{2+2x}Zn_{1-x}GeO_4$), alumina, oxides of silicon ($SiO_2$), alumina ($Al_2O_3$), zirconium, titanium ($TiO_2$), mixtures thereof, or nitrides of silicon, alumina, zirconium, calcium, or mixtures thereof, and/or mixtures, blends and/or combinations thereof, wherein said ceramic particles comprise particles having an average particle size ranging from 0.01 μm to 5 μm in diameter, more preferably 0.05 μm to 2 μm in diameter, and most preferably 0.01 μm to 1 μm in diameter, wherein said ceramic particles comprise $Al_2O_3$ having an average particle size ranging from 0.01 μm to 5 μm in diameter, more preferably 0.05 μm to 4 μm in diameter, and most preferably 0.05 μm to 2 μm in diameter, wherein said ceramic layer between said microporous membranes has a thickness of about 0.5 μm to 10 μm, wherein said ceramic layer has a thickness of about 0.5 μm to 10 μm, and wherein said reinforced separator has a TMA MD dimensional change of −2% or more at ≤110 deg C., preferably at ≤130 deg C., more preferably at ≤140 deg C., even more preferably at ≤160 deg C., and most preferably at ≤175 deg C., wherein said reinforced separator has a TMA TD shrinkage of about 0.5% or less ≤130 deg C., preferably at ≤140 deg C., more preferably at ≤150 deg C., and most preferably at ≤160 deg C., wherein said reinforced separator has a TMA MD shrinkage of 15% or less at 135 deg C. for one hour, and preferably an MD shrinkage of 28% or less at 150 deg C. for one hour, wherein said ceramic layer is a porous layer; in a secondary lithium ion battery, the improvement comprising the reinforced separator described above; in an electronic device, the improvement comprising the secondary lithium ion battery described above; in an electric vehicle drive system, the improvement comprising the secondary lithium ion battery described above; in an energy storage device, the improvement comprising the secondary lithium ion battery described above; a reinforced separator for a battery, comprising:

a top microporous membrane having a first surface and a second surface, wherein said microporous membrane is at least one of a single layer, multiple layer, single ply, and/or multiple ply structure; and, a bottom microporous membrane having a first surface and a second surface, wherein said microporous membrane is at least one of a single layer, multiple layer, single ply, and/or multiple ply structure; and, a ceramic layer is between the two surfaces of said microporous membranes, said ceramic layer comprising a layer of ceramic particles and a polymer binder; a battery comprising:

A negative electrode;

A positive electrode; and

A reinforced separator disposed between the negative electrode and positive electrode, wherein the reinforced separator comprises:

a. a top microporous membrane having a first surface and a second surface, wherein said microporous membrane is at least one of a single layer, multiple layer, single ply, and/or multiple ply structure; and, b. a bottom microporous membrane having a first surface and a second surface, wherein said microporous membrane is at least one of a single layer, multiple layer, single ply, and/or multiple ply structure; and, c. a ceramic layer is between the two surfaces of said microporous membranes, said ceramic layer comprising a layer of ceramic particles and a polymer binder, wherein said reinforced separator evolves >0.5% volatile components at ≥250 deg C., preferably >1.0% volatile components at ≥250 deg C., more preferably >1.5% volatile components at ≥250 deg C., and most preferably >2.0% or more volatile components at ≥250 deg C., wherein said ceramic layer is porous and said polymeric binder is solvent-based, wherein said ceramic layer is porous and said polymeric binder is aqueous, and/or wherein said reinforced separator has a shutdown behavior at a temperature range of 130-160 deg. C.; a ceramic layer reinforced separator for a secondary lithium ion battery, comprising:

a top microporous membrane having a first surface and a second surface, wherein said microporous membrane is at least one of a single layer, multiple layer, single ply, and/or multiple ply structure; and, a bottom microporous membrane having a first surface and a second surface, wherein said microporous membrane is at least one of a single layer, multiple layer, single ply, and/or multiple ply structure; and, a ceramic layer is between the two surfaces of said microporous membranes, said ceramic layer comprising a layer of ceramic particles and a polymer binder, wherein the polymeric binder is at least one of a solvent based or aqueous based polymeric binder; novel or improved porous membranes or substrates, separator membranes, separators, composites, electrochemical devices, batteries, methods of making such membranes or substrates, separators, composites, electrochemical devices, and/or batteries, and/or methods of using such membranes or substrates, separators composites, electrochemical devices, and/or batteries; novel or improved microporous membranes, battery separator membranes, separators, energy storage devices, batteries including such separators, methods of making such membranes, separators, and/or batteries, and/or methods of using such membranes, separators and/or batteries; a separator for a battery which has an oxidation protective and binder-free deposition layer and/or a separator for a lithium battery which has an oxidation protective and binder-free deposition layer which is stable up to at least 5.2, or up to at least 5.5 volts in a battery; the deposition layer is preferably an ultra-thin deposition and may be: metal or metal oxide, one or more organic materials, one or more inorganic materials, or a conductive metal or ceramic layer applied to or embedded within a polymeric microporous membrane or separator via a binder-free and solvent-free deposition method; by employing an ultra-thin deposition layer, the energy density of a battery may be increased; the deposition method may preferably deposit a uniform layer that is less than 0.5 μm in thickness, which combination of uniformity and thickness may not be accomplished by other coating techniques; the battery separator membrane or separator is a multilayer or composite microporous membrane battery separator which may have excellent oxidation resistance and may be stable in a high voltage battery system up to 5.2 volts or more, or 5.5 volts; a membrane or separator for a battery which has a conductive deposition layer which is stable up to at least 5.2 volts, or 5.5 volts or higher, in a lithium battery; a separator for a battery which has an oxidation protective and binder-free treatment or deposition layer which is stable up to at least 5.2 volts, at least 5.5 volts, or up to 7 volts in a cell, battery, pack, or system, the deposition layer being preferably a thin, very thin or ultra-thin deposition of metal or metal oxide applied to a polymeric microporous membrane via a binder-free and solvent-free deposition method such as PVD, laser PVD, pulsed laser PVD, or the like, an electrochemical device that uses a conductive microporous membrane or substrate which has a conductive deposition layer on one side or two sides of a polymeric porous membrane, a separator for a battery which has a conductive, semi-conductive or non-conductive deposition layer which is stable up to at least 5.2 volts or higher, for example, up to 5.5 volts, in a battery, an electrochemical device that uses a nonconductive microporous membrane or substrate which has a nonconductive deposition layer on one side or two sides of a polymeric porous membrane, a separator for a battery which has a nonconductive deposition layer (at least in electrolyte) which is stable up to at least 5.2 volts, or higher, in a battery; a reinforced separator for an energy storage device, such as a secondary lithium ion battery, having a top microporous membrane having a first surface and a second surface, wherein said microporous membrane is at least one of a single layer, multiple layer, single ply, and/or multiple ply structure, and, a bottom microporous membrane having a first surface and a second surface, wherein said microporous membrane is at least one of a single layer, multiple layer, single ply, and/or multiple ply structure, and, a ceramic layer is between the two surfaces of said microporous membranes, said ceramic layer comprising a layer of ceramic particles and a polymer binder, wherein said ceramic reinforced separator provides at least one of improved safety, cycle life, or high temperature performance, an oxidation or reduction reaction interface, surface or boundary, an oxidized or reduced interfacial layer between the separator and battery electrodes during use, prevents or stops further oxidation or reduction reactions from occurring during use, improves safety, cycle life, or high temperature performance of a lithium ion battery, and high dimensional stability at elevated temperatures, or combinations thereof; novel or improved porous membranes or substrates, separator membranes, separators, composites, electrochemical devices, batteries, methods of making such membranes or substrates, separators, composites, electrochemical devices, and/or batteries, and/or methods of using such membranes or substrates, separators composites, electrochemical devices, and/or batteries; novel or improved microporous membranes, battery separator membranes, separators, energy storage devices, batteries including such separators, methods of making such membranes, separators, and/or batteries, and/or methods of using such membranes, separators and/or batteries; a separator for a battery which has an oxidation protective and binder-free deposition layer and/or a separator for a lithium battery which has an oxidation protective and binder-free deposition layer which is stable up to at least 5.2, or up to 5.5 volts in a battery; the deposition layer is preferably an ultra-thin deposition and may be: metal or metal oxide, one or more organic materials, one or more inorganic materials, or a conductive metal or ceramic layer applied to or embedded within a polymeric microporous membrane or separator via a binder-free and solvent-free deposition method; by employing an ultra-thin deposition layer, the energy density of a battery may be increased; the deposition method may preferably deposit a uniform layer that is less than 0.5 μm in thickness, which combination of uniformity and thickness may not be accomplished by other coating techniques; a multilayer or composite microporous membrane battery separator or separator membrane or substrate which may have excellent oxidation resistance and may be stable in a high voltage battery system up to 5.2 volts or more, or 5.5 volts; a membrane or separator for a battery which has a conductive deposition layer which is stable up to at least 5.2 volts, or 5.5 volts or higher, in a lithium battery; a membrane with metal deposition dissipates surface statics and as a result, separator is less sticky, and easier for accurate alignment in stacking or Z-folding cell making processes; a membrane with metal deposition is X-ray detectable and it allows a battery maker to conduct X-ray inspection for separator alignment; a membrane with metal or metal oxide deposition and that retains the base membrane's "Ion Transfer Resistivity"; a membrane with metal or metal oxide deposition and that retains the base membrane's low charge transfer resistance and fast charging capabilities; a membrane with metal or metal oxide deposition having low charge transfer resistance and fast charging capabilities; a membrane with metal or metal oxide deposition adapted for use in medical applications such as thin skin patches, thin transdermal drug delivery devices or patches, or bandages; a membrane with one or more surface modifications by vapor deposition such as a thin metal or metal oxide deposition on at least one surface for medical, water treatment, water purification, or desalination uses or applications; and/or the like as shown or described herein.

In accordance with at least selected embodiments, aspects or objects, the present application or invention is directed to or provides novel or improved porous membranes or substrates, separator membranes, separators, composites, electrochemical devices, batteries, methods of making such membranes or substrates, separators, and/or batteries, and/or methods of using such membranes or substrates, separators and/or batteries. In accordance with at least certain embodiments, the present application is directed to novel or improved microporous membranes, battery separator membranes, separators, energy storage devices, batteries including such separators, methods of making such membranes, separators, and/or batteries, and/or methods of using such membranes, separators and/or batteries. In accordance with at least certain selected embodiments, the present invention is directed to a separator for a battery which has an oxidation protective and binder-free deposition layer which is stable up to 5.2 volts or more, for example, up to 7 volts, in a battery. The deposition layer is preferably an ultra-thin deposition on a polymeric microporous membrane applied to the polymeric microporous membrane via a binder-free and solvent-free deposition method. By employing an ultra-thin deposition layer, the energy density of a battery may be increased. Furthermore, the deposition method may preferably deposit a uniform deposition layer that is less than 1 micron, preferably less than 0.5 μm in thickness, which combination of uniformity and thickness may not be accomplished by known coating techniques. In accordance with at least particular embodiments, the battery separator membrane described herein is directed to a multi-layer or composite microporous membrane battery separator which may have excellent oxidation resistance and may be stable in a high voltage battery system up to 5.2 volts or more, for example, up to 7 volts. In accordance with at least other certain selected embodiments, the present invention is directed to a separator for a battery which has a conductive deposition layer which is stable up to at least 5.2 volts, for example, up to 7 volts, in a battery.

In accordance with at least selected embodiments, novel or improved porous membranes or substrates, separator membranes, separators, composites, electrochemical devices, batteries, methods of making such membranes or substrates, separators, and/or batteries, and/or methods of using such membranes or substrates, separators and/or batteries are disclosed. In accordance with at least certain embodiments, novel or improved microporous membranes, battery separator membranes, separators, energy storage devices, batteries including such separators, methods of making such membranes, separators, and/or batteries, and/or methods of using such membranes, separators and/or batteries are disclosed. In accordance with at least certain selected embodiments, a separator for a battery which has an oxidation protective and binder-free deposition layer which is stable up to 5.2 volts or more, for example, up to 7 volts, in a battery is disclosed. The deposition layer is preferably a thin, very thin or ultra-thin deposition on a polymeric microporous membrane applied via a binder-free and solvent-free deposition method. By employing such an ultra-thin deposition layer, the energy density of a battery may be increased. In accordance with at least particular embodiments, the battery separator membrane described herein is directed to a multi-layer or composite microporous membrane battery separator which may have excellent oxidation resistance and may be stable in a high voltage battery system up to 5.2 volts or more. In accordance with at least other certain selected embodiments, the present invention is directed to a separator for a battery which has a conductive deposition layer which is stable up to at least 5.2 volts or higher in a battery.

The present invention may be embodied in other forms without departing from the spirit and the essential attributes thereof, and, accordingly, reference should be made to the appended claims, rather than to the foregoing specification, as indicating the scope of the invention. For example, a patterned or modified membrane surface may improve the adhesion of the deposition layer and greater adhesion may improve conductivity. In at least certain contemplated embodiments, deposition layers may be calendered or embossed with smooth or patterned rolls. In at least certain particular such embodiments, a patterned, embossed, or raised surface may aid in increasing the adhesion of a deposition coating. A patterned, embossed, or raised surface may be configured to increase conductivity of current or flow of electrolyte. A patterned, embossed, or raised surface may be configured to block or prohibit the growth of dendrites. A patterned, embossed, or raised surfaces may aid in the lamination process and may alleviate the need for high pressure lamination systems. Additionally, the invention illustratively disclosed herein suitably may be practiced in the absence of any element which is not specifically disclosed herein.

We claim:

1. A battery separator comprising:
 a porous membrane having a first side and a second side, the porous membrane is a polyolefinic membrane; and
 a physically vapor deposited electrically conductive metal layer on at least one of the first side or the second side of said porous membrane,
 whereby the physically vapor deposited electrically conductive metal layer has a thickness less than 10,000 Å and
 whereby the battery separator, when present in a battery, is stable against oxidation to a voltage between 4.9 and 5.5 volts.

2. The battery separator of claim 1 wherein the physically vapor deposited electrically conductive metal layer has a thickness less than 1,000 Å.

3. The battery separator of claim 1 wherein the porous membrane is microporous.

4. The battery separator of claim 1 further comprising a ceramic layer on top of said physically vapor deposited electrically conductive metal layer.

5. A lithium battery comprising the battery separator of claim 1.

6. The battery separator of claim 1 wherein the physically vapor deposited electrically conductive metal layer has a thickness less than 500 Å.

7. The battery separator of claim 1 wherein the physically vapor deposited electrically conductive metal layer is a physically vapor deposited aluminum layer.

* * * * *